United States Patent
Delcamp et al.

(10) Patent No.: US 11,613,653 B2
(45) Date of Patent: Mar. 28, 2023

(54) DYES, DYE-SENSITIZED SOLAR CELLS, AND METHODS OF MAKING AND USING THE SAME

(71) Applicant: University of Mississippi, University, MS (US)

(72) Inventors: Jared Heath Delcamp, Oxford, MS (US); Roberta Ramalho Rodrigues, Oxford, MS (US); Adithya Peddapuram, Oxford, MS (US); Hammad Arshad Cheema, Lahore (PK)

(73) Assignee: UNIVERSITY OF MISSISSIPPI, University, MS (US)

( * ) Notice: Subject to any disclaimer, the term of this patent is extended or adjusted under 35 U.S.C. 154(b) by 225 days.

(21) Appl. No.: 16/634,050

(22) PCT Filed: Jul. 26, 2018

(86) PCT No.: PCT/US2018/043862
§ 371 (c)(1),
(2) Date: Jan. 24, 2020

(87) PCT Pub. No.: WO2019/023436
PCT Pub. Date: Jan. 31, 2019

(65) Prior Publication Data
US 2020/0231817 A1   Jul. 23, 2020

Related U.S. Application Data

(60) Provisional application No. 62/547,981, filed on Aug. 21, 2017, provisional application No. 62/537,208, filed on Jul. 26, 2017.

(51) Int. Cl.
*C09B 11/04*    (2006.01)
*C09B 57/00*    (2006.01)
(Continued)

(52) U.S. Cl.
CPC .............. *C09B 11/04* (2013.01); *C09B 57/004* (2013.01); *C09B 69/008* (2013.01);
(Continued)

(58) Field of Classification Search
CPC .. H01G 9/2059; H01G 9/2018; C07F 15/065; C09B 23/0058; H01L 51/0064
See application file for complete search history.

(56) References Cited

U.S. PATENT DOCUMENTS 10,562,913 B2 *  2/2020  Delcamp .............. C07D 471/04
11,084,839 B2 *  8/2021  Hollis ....................... C25B 1/00
(Continued)

FOREIGN PATENT DOCUMENTS

WO        20120102544 A2    8/2012

OTHER PUBLICATIONS

Zhu, W. et al.: "Organic D-A-pi-A Solar Cell Sensitizers with Improved Stability and Spectral Response", Adv. Funct. Mater., vol. 21, No. 4 Dec. 10, 2010 (Dec. 10, 2010), pp. 756-763, XP001560462.
(Continued)

*Primary Examiner* — Syed I Gheyas
(74) *Attorney, Agent, or Firm* — Thomas | Horstemeyer, LLP

(57) ABSTRACT

Provided herein are dyes, dye-sensitized solar cells, and sequential series multijunction dye-sensitized solar cell devices. The dyes include an electron deficient acceptor moiety, a medium electron density ?-bridge moiety, and an electron rich donor moiety comprising a biaryl, a substituted
(Continued)

biaryl, or an R1, R2, R3 substituted phenyl where each of R1, R2, and R3 independently comprises H, aryl, multiaryl, alkyl substituted aryl, alkoxy substituted aryl, alkyl substituted multiaryl, alkoxy substituted multiaryl, OR4, N(R5)2, or a combination thereof; each R4 independently comprises H, alkyl, aryl, alkyl substituted aryl, alkoxy substituted aryl, or a combination thereof; and each R5 independently comprises aryl, multiaryl, alkyl substituted aryl, alkoxy substituted aryl, alkyl substituted multiaryl, alkoxy substituted multiaryl, or a combination thereof. The solar cells include a glass substrate, a dye-sensitized active layer, and a redox shuttle. The devices include at least two dye-sensitized solar cells connected in series.

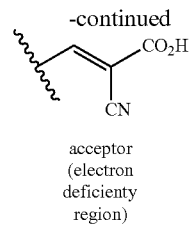

acceptor
(electron
deficienty
region)

7 Claims, 30 Drawing Sheets

(51) Int. Cl.
C09B 69/00 (2006.01)
H01G 9/20 (2006.01)
H01L 51/00 (2006.01)

(52) U.S. Cl.
CPC ......... *H01G 9/2018* (2013.01); *H01G 9/2063* (2013.01); *H01G 9/2072* (2013.01); *H01L 51/0067* (2013.01); *H01L 51/0069* (2013.01); *H01L 51/0074* (2013.01)

(56) References Cited

U.S. PATENT DOCUMENTS

2014/0239288 A1* 8/2014 Delcamp ............ H01L 51/0064 257/40
2016/0343515 A1 11/2016 Mehmood et al.
2019/0016741 A1* 1/2019 Hollis .................. C07F 15/006

OTHER PUBLICATIONS

Yum, J.-H. et al.: "A cobalt complex redox shuttle for dye-sensitized solar cells with high open-circuit potentials", nature communications, vol. 3, No. 631 Jan. 17, 2012 (Jan. 17, 2012), pp. 1-8, XP055569643.
Chou, H.-H. et al.: "First-principle Determination of Electronic Coupling and Prediction of Charge Recombination Rates in Dye-sensitized Solar Cells", J. Phys. Chem. C,vol. 121, No. 2 Dec. 14, 2016 (Dec. 14, 2016), pp. 983-992, XP055569648.
Gavin Tsai, H.-H. et al.: "First-Principle Characterization of the Adsorption Configurations of Cyanoacrylic Dyes on TiO2 Film for Dye-Sensitized Solar Cells", J. Phys. Chem. A,vol. 120, No. 44 Oct. 20, 2016 (Oct. 20, 2016), pp. 8813-8822, XP055569650.
Gao Peng et al: fused acenes as electrochemical properties 11,11 Organic dyes containing building blocks: Optical, and photovoltaic 2,6.7 Chinese Chemical Letters, vol. 29, No. 2, Sep. 28, 2017 (Sep. 28, 2017), 289-292, XP055849559, Amsterdam, NL ISSN: 1001-8417, DOI: 10.1016/j.cclet.2017.09.056 * p. 290; figure 2.
International Search Report and Written Opinion for PCT/US2018/043862 dated Nov. 16, 2018.
Extended European Search Report for Application No. 18837771.7-1110 dated Oct. 21, 2021.

* cited by examiner

FIG. 1D donor
(electron
rich
region)

π-bridge
(medium
electron
density)

FIG. 1E  FIG. 1F

CYTOP
(M-type)

DYES, DYE-SENSITIZED SOLAR CELLS, AND METHODS OF MAKING AND USING THE SAME

RELATED APPLICATIONS

This application is a national stage application, filed under 35 U.S.C. § 371, of International Patent Application No. PCT/US2018/043862, filed Jul. 26, 2018, which claims the benefit of U.S. Provisional Application Ser. No. 62/537,208, filed Jul. 26, 2017, and 62/547,981, filed Aug. 21, 2017, the entire disclosures of which are incorporated herein by this reference.

GOVERNMENT INTEREST

This invention was made with government support under grant number 1539035 awarded by the National Science Foundation (NSF). The government has certain rights in the invention.

TECHNICAL FIELD

The present invention relates to dyes, dye-sensitized solar cells, and methods of making and using the same. In particular, the presently-disclosed subject matter relates to sensitizer dyes, sequential series multijunction dye-sensitized solar cells (SSM-DSC), and methods of making and using the same.

BACKGROUND

Global energy demand is expected to increase from 18TW in 2013 to 24-26 TW in 2040, along with corresponding increase in $CO_2$ emissions, due to inevitable increase in population and industrialization. So far most of the energy (~80%) has been derived from fossil fuels, which is not sustainable and detrimental to the environment. Therefore, sustainable fossil fuel-free pathways to electricity and fuel production, such as conversion of water to $H_2$, nitrogen to ammonia, and/or $CO_2$ to carbons fuels with only 02 as a byproduct, are highly desirable.

While solar energy may be the most abundant energy source, efficient solar energy capture, conversion, and storage (potentially in chemical bonds) must be realized in order to provide a large scale, cost effective, carbon neutral energy source. Despite intensive research efforts over the last few decades, such photovoltaic powered solar fuel systems are currently lacking. For example, one highly studied type of solar cell includes perovskite solar cells (PSCs), which have been reported with record efficiencies for powering water splitting and $CO_2$ reduction catalysts. However, the stability of PSCs currently limits long term generation of fuels from these systems, while their water soluble lead-based nature raises various environmental and health concerns.

One possible alternative to PSC powered solar fuel systems includes dye-sensitized solar cells (DSCs). DSCs are promising in terms of cost, stability, commercial viability, and environmental impact when compared with many solar cell technologies. Additionally, DSCs are an exceptionally attractive solar cell technology for efficiently converting high potential energy photons. Existing research efforts for DSCs have attempted to increase efficiency of single-junction devices primarily through balancing both photocurrent ($J_{sc}$) and $V_{oc}$.

With respect to achieving high $V_{oc}$, $Co(bpy-pz)_2^{3+/2+}$ was first reported in 2011 by Gratzel et al. as a legitimate alternative to $I^-/I^-$ and $Co(bpy)_3^{3+/2+}$ for DSCs with Y123 sensitizer. The highest $V_{oc}$ provided by these DSCs was 1.0 V, with a PCE of up to 10%. The $V_{oc}$ was further improved to 1.1 V with custom made $TiO_2$ paste and atomic layer deposition. Additionally, Hagfeldt and Boschloo's group reported D35 giving $V_{oc}$ of 1.02 V and overall PCE of 3.6% with $Co(bpy-pz)_2^{3+/2+}$, as well as $V_{oc}$ of 0.85 V and overall PCE of 6.5% with $Co(bpy)_3^{3+/2+}$ under the reported conditions. However, single cell devices convert all absorbed photons regardless of potential energy to the same voltage, resulting in significant energetic waste from high-energy solar spectrum photons. As such, the highest $V_{oc}$ values for a single DSC cell, as reported by Hanaya et al., are currently 1.45 V and 1.21 V with a tailored organic dye and $Br_3^-/Br^-$ redox shuttle.

One strategy for increasing solar cell power conversion efficiencies includes using series tandem DSCs (ST-DSCs) in conjunction with inorganics (e.g., GaAs or silicon) and/or organic photovoltaic (OPV) cells. This strategy relies on light absorbing materials of different wavelength ranges, or photons of different potential energies, in separate subcells to divide up the solar spectrum between these subcells (FIG. 1A). In contrast to parallel tandem DSCs, where the $J_{sc}$ of the individual devices is added, ST-DSCs provide addition of the $V_{oc}$ from individual devices to provide a higher overall $V_{oc}$. There are two main approaches that can be adopted to achieve high $V_{oc}$ in ST-DSCs, one includes mechanically stacked devices with n*2 terminals (n is the number of sub-cells) and the other includes mono-lithic two terminal cells. Using these approaches, ST-DSC $V_{oc}$ values in the range of 1.4-1.85 V have been reported with organic dyes in conjunction with inorganics and porphyrin sensitizers. DSCs in conjunction with other type solar cells exhibited high voltages of 1.36 V with DSC/Silicon, 1.85 V with DSC/GaAs, and 1.2 V with DSC/OPV.

This is particularly attractive for powering electrochemical cells, where $V_{oc}$ values of 1.83 and 3.0 V were demonstrated to function for water oxidation and $CO_2$ reduction, respectively. In fact, 1.83 V organic/porphyrin dye tandem DSCs have been successfully employed for water oxidation along with 0.248 mV bias resulting in 7.4% applied bias photon-to-current efficiency (ABPE) and solar to hydrogen (STH) efficiency of 5.75%. Although this represents an increase in photovoltage over a single DSC cell, such device architectures have not demonstrated a photovoltage in excess of 1.85 V from a single illuminated area to date. In addition, existing ST-DSC devices have been limited to two subcell (double junction) systems, because efficient light harvesting was expected to diminish beyond this point.

Accordingly, there is a need for devices and methods that provide increased overall efficiency while generating high photovoltages from a single illuminated area.

SUMMARY

This summary describes several embodiments of the presently-disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently-disclosed subject matter, whether listed in this summary or not. To avoid excessive repetition, this summary does not list or suggest all possible combinations of features.

The presently-disclosed subject matter provides, in some embodiments, a dye including an electron deficient acceptor moiety, a medium electron density π-bridge moiety, and an electron rich donor moiety comprising a biaryl, a substituted biaryl, or a moiety having the following structure:

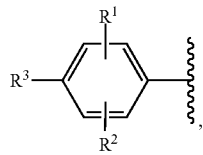

where each of $R^1$, $R^2$, and $R^3$ independently comprises H, aryl, multiaryl, alkyl substituted aryl, alkoxy substituted aryl, alkyl substituted multiaryl, alkoxy substituted multiaryl, $OR^4$, $N(R^5)_2$, or a combination thereof; each $R^4$ independently comprises H, alkyl, aryl, alkyl substituted aryl, alkoxy substituted aryl, or a combination thereof; and each $R^5$ independently comprises aryl, multiaryl, alkyl substituted aryl, alkoxy substituted aryl, alkyl substituted multiaryl, alkoxy substituted multiaryl, or a combination thereof.

In some embodiments, the donor moiety comprises:

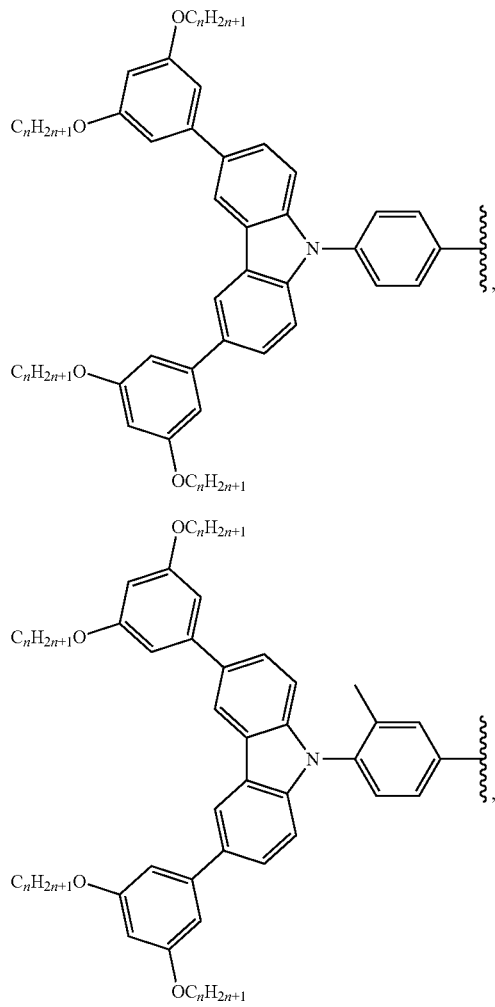

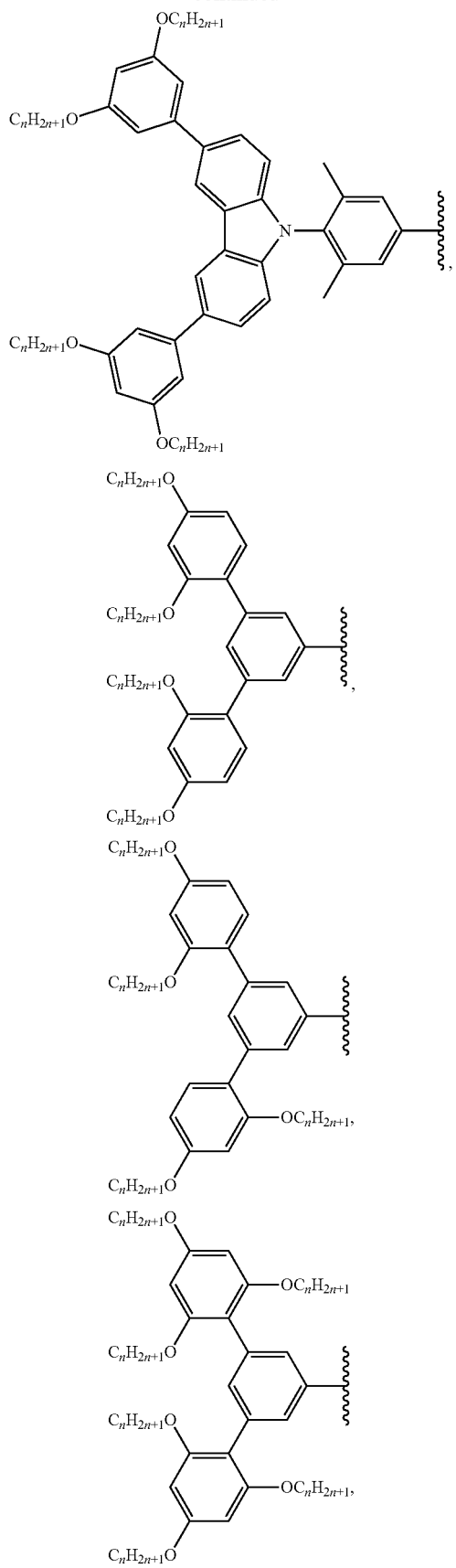

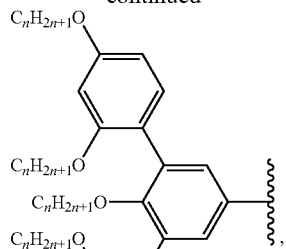

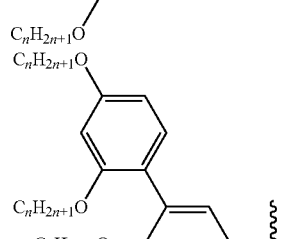

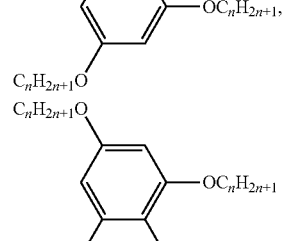

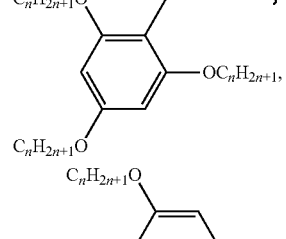

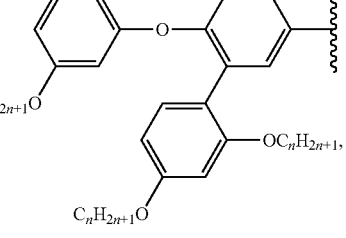

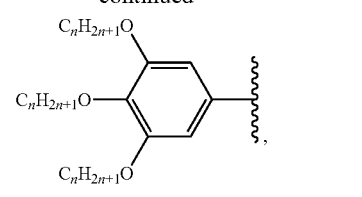

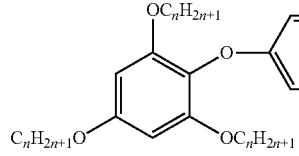

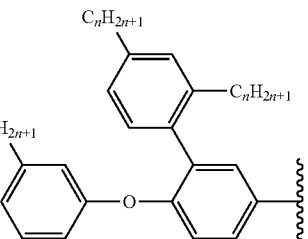

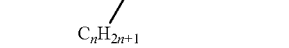

where n is between 1 and 30. In one embodiment, n is 6.

In some embodiments, the substituted biaryl comprises an alkyl or alkoxy substituted biaryl. In one embodiment, the alkyl substituted biaryl comprises the structure:

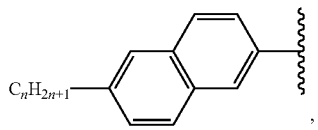

wherein n is between 1 and 30. In one embodiment, the alkoxy substituted biaryl comprises the structure:

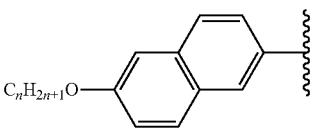

where n is between 1 and 30.

In some embodiments, the π-bridge moiety comprises:

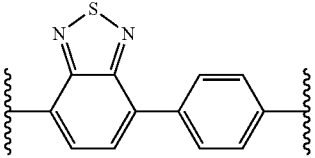

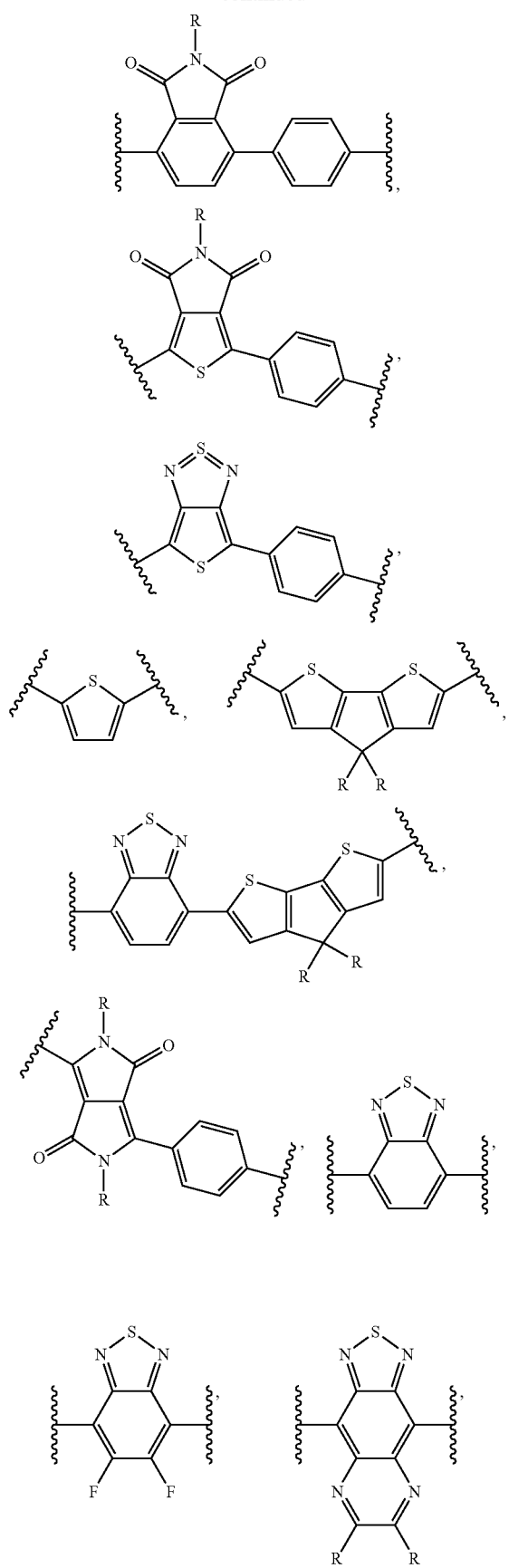
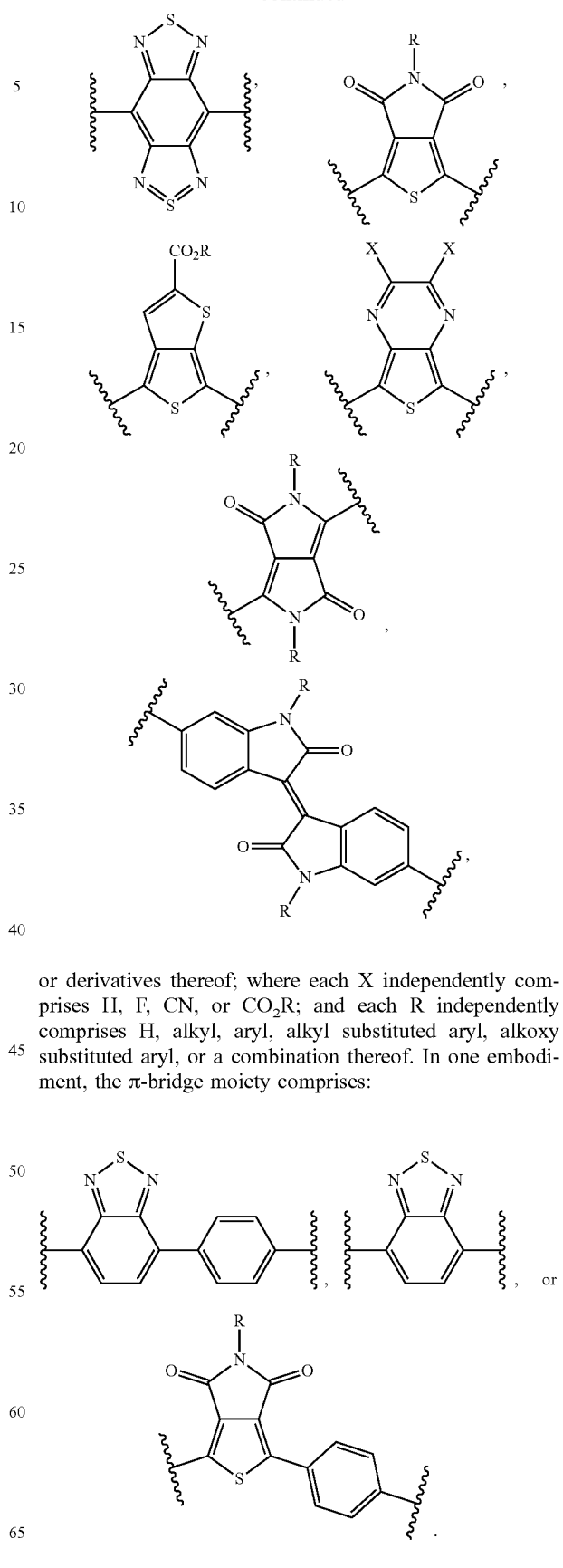
or derivatives thereof; where each X independently comprises H, F, CN, or CO$_2$R; and each R independently comprises H, alkyl, aryl, alkyl substituted aryl, alkoxy substituted aryl, or a combination thereof. In one embodiment, the π-bridge moiety comprises:

In some embodiments, the acceptor moiety comprises:

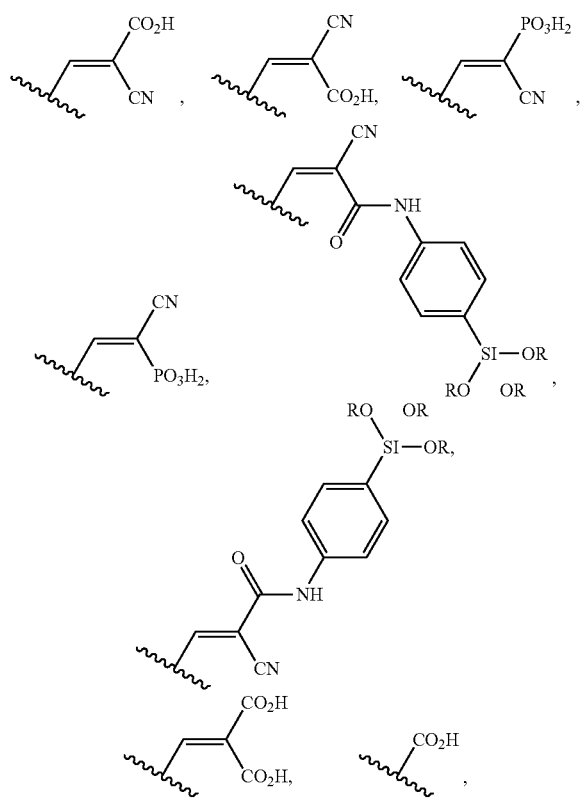

or derivatives thereof, where each R independently comprises H, alkyl, aryl, alkyl substituted aryl, alkoxy substituted aryl, or a combination thereof.

Also provides herein, in some embodiments, is a dye-sensitized solar cell including a glass substrate, a dye-sensitized active layer, and a redox shuttle. In some embodiments, the glass substrate is coated with a transparent conductive film. In one embodiment, the transparent conductive film is fluorine doped titanium oxide. In some embodiments, the dye-sensitized active layer is sensitized with a dye comprising D35, Y123, RR9, or a dye including an electron deficient acceptor moiety, a medium electron density π-bridge moiety, and an electron rich donor moiety comprising a biaryl, a substituted biaryl, or a moiety having the following structure:

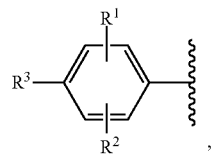

where each of $R^1$, $R^2$, and $R^3$ independently comprises H, aryl, multiaryl, alkyl substituted aryl, alkoxy substituted aryl, alkyl substituted multiaryl, alkoxy substituted multiaryl, $OR^4$, $N(R^5)_2$, or a combination thereof; each $R^4$ independently comprises H, alkyl, aryl, alkyl substituted aryl, alkoxy substituted aryl, or a combination thereof; and each $R^5$ independently comprises aryl, multiaryl, alkyl substituted aryl, alkoxy substituted aryl, alkyl substituted multiaryl, alkoxy substituted multiaryl, or a combination thereof. In some embodiments, the dye-sensitized active layer comprises $TiO_2$. In some embodiments, the redox shuttle is a cobalt redox shuttle.

Further provided herein, in some embodiments, is a sequential series multijunction dye-sensitized solar cell device comprising at least two dye-sensitized solar cells connected in series, each of the dye-sensitized solar cells including a glass substrate, a dye-sensitized active layer, and a redox shuttle. In some embodiments, the sequential series multijunction dye-sensitized solar cell device includes three solar cells. In some embodiments, sequential series multijunction dye-sensitized solar cell device includes an antireflective coating applied over a non-conductive side of at least one of a photoanode and a cathode of one or more of the dye-sensitized solar cells. In some embodiments, sequential series multijunction dye-sensitized solar cell device includes an immersion oil positioned between at least two of the solar cells.

In some embodiments, the glass substrate of at least one of the dye-sensitized solar cells is coated with a transparent conductive film. In one embodiment, the transparent conductive film is fluorine doped titanium oxide. In some embodiments, the dye-sensitized active layer of at least one of the dye-sensitized solar cells is sensitized with a dye comprising D35, Y123, RR9, or a dye including an electron deficient acceptor moiety, a medium electron density π-bridge moiety, and an electron rich donor moiety comprising a biaryl, a substituted biaryl, or a moiety having the following structure:

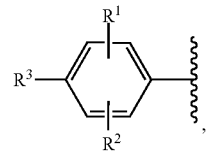

where each of $R^1$, $R^2$, and $R^3$ independently comprises H, aryl, multiaryl, alkyl substituted aryl, alkoxy substituted aryl, alkyl substituted multiaryl, alkoxy substituted multiaryl, $OR^4$, $N(R^5)_2$, or a combination thereof; each $R^4$ independently comprises H, alkyl, aryl, alkyl substituted aryl, alkoxy substituted aryl, or a combination thereof; and each $R^5$ independently comprises aryl, multiaryl, alkyl substituted aryl, alkoxy substituted aryl, alkyl substituted multiaryl, alkoxy substituted multiaryl, or a combination thereof. In some embodiments, the dye-sensitized active layer of at least one of the dye-sensitized solar cells comprises $TiO_2$. In some embodiments, the redox shuttle of at least one of the dye-sensitized solar cells is a cobalt redox shuttle.

BRIEF DESCRIPTION OF THE DRAWINGS

The presently-disclosed subject matter will be better understood, and features, aspects and advantages other than those set forth above will become apparent when consideration is given to the following detailed description thereof. Such detailed description makes reference to the following drawings, wherein:

FIGS. 1A-K show graphs and images illustrating SSM-DSC systems. (A) Shows a graph illustrating how solar spectrum photons were divided in prior work. (B) Shows a graph illustrating how solar spectrum photons are divided in this work. (C) Shows a schematic view illustrating a 5 subcell SSM-DSC solar cell system producing 4.7 V from a single illuminated area with 1 sun. Voltage output values for 1-4 subcell SSM-DSC systems are indicated as well. (D) Shows the general structure for metal-free organic sensitizers. (E) Shows the structure of metal-free organic sensitizer D35. (F) Shows the structure of metal-free organic sensitizer Y123. (G) Shows the structure of the cobalt redox shuttle $Co(bpy-pz)_2^{3+/2+}$. (H) Shows the structure of the cobalt redox shuttle $Co(bpy)_3^{3+/2+}$. (I) Shows the structure of the surface capping agents pivalic acid, heptanoic acid, myristic acid, stearic acid, melisic acid, decylphosphonic acid, octadecylphosphonic acid, ethyltrimethoxy silane, isooctyltrimethoxy silane, octyltrimethoxy silane, dodecyltrimethoxy silane, octadecyltrimethoxy silane, perfluorooctyltrimethylsilane (PFTS; 3,3,4,4,5,5,6,6,7,7,8,8,8-tridecafluorooctyl-trimethoxysilane), 3,3,4,4,5,5,6,6,7,7,8,8,9,9,10,10,11,11,12,12,12-heneicosafluorododecyl-trimethoxysilane, 3,3,4,4,5,5,6,6,7,7,8,8,9,9,10,10,10-heptadecafluorodecyl-trimethoxysilane, 3,3,4,4,5,5,6,6,6-nonafluorohexyl-trimethoxysilane, 3,3,4,4,5,5,5-heptafluoropentyl-trimethoxysilane, 3,3,4,4,4-pentafluorobutyl-trimethoxysilane, and 3,3,3-trifluoropropyl-trimethoxysilane. (J) Shows the structure of Ru-sensitizer HD-2-mono. (K) Shows a graph illustrating energetic and theoretical maximum possible values of D35, Y123, and HD-2-mono when paired with $I^-/I_3^-$, $Co(bpy)_3^{3+/2+}$, and $Co(bpy-pz)_2^{3+/2+}$. D35 was measured on $TiO_2$. Y123 energetics are reported previously. HD-2-mono was measured in DMF solution. Redox shuttle values are measured in MeCN.

Figure 2A:
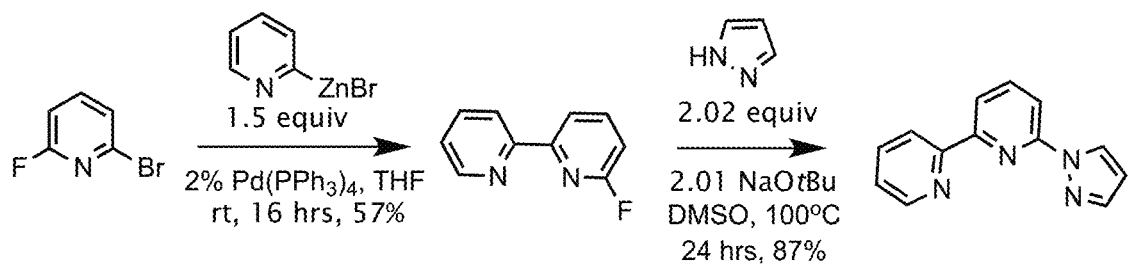
Figure 2B:
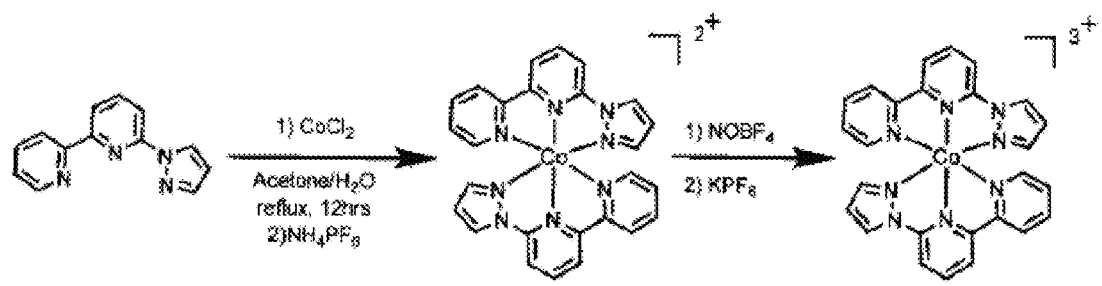

FIGS. 2A-B show schematics illustrating the synthesis of a cobalt redox shuttle. (A) Shows a schematic illustration of a method of synthesizing a bpy-pz ligand according to an embodiment of the disclosure. (B) Shows a schematic illustration of a method of synthesizing $Co(bpy-pz)_2^{3+/2+}$ using the ligand of (A).

Figure 3:
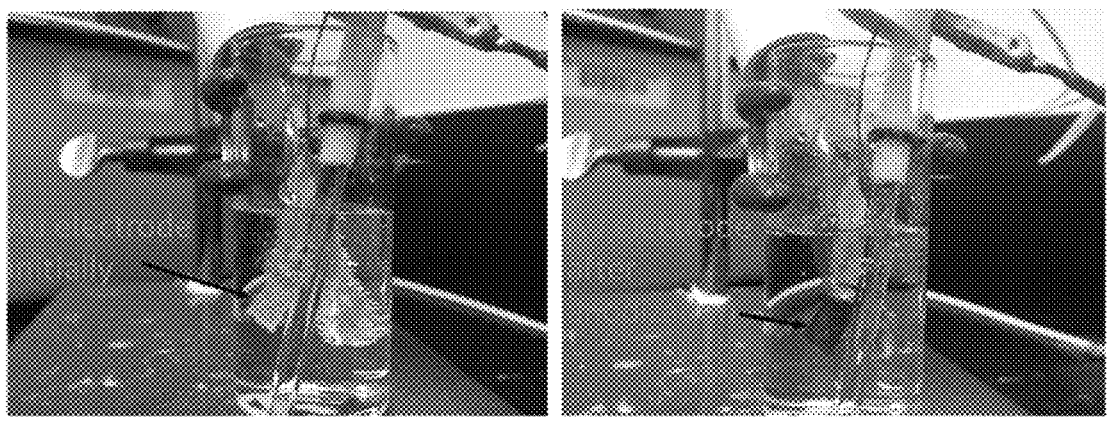

FIG. 3 shows images of an $Au_2O_3$ electrode before (left) and after (right) anodization.

Figure 4:
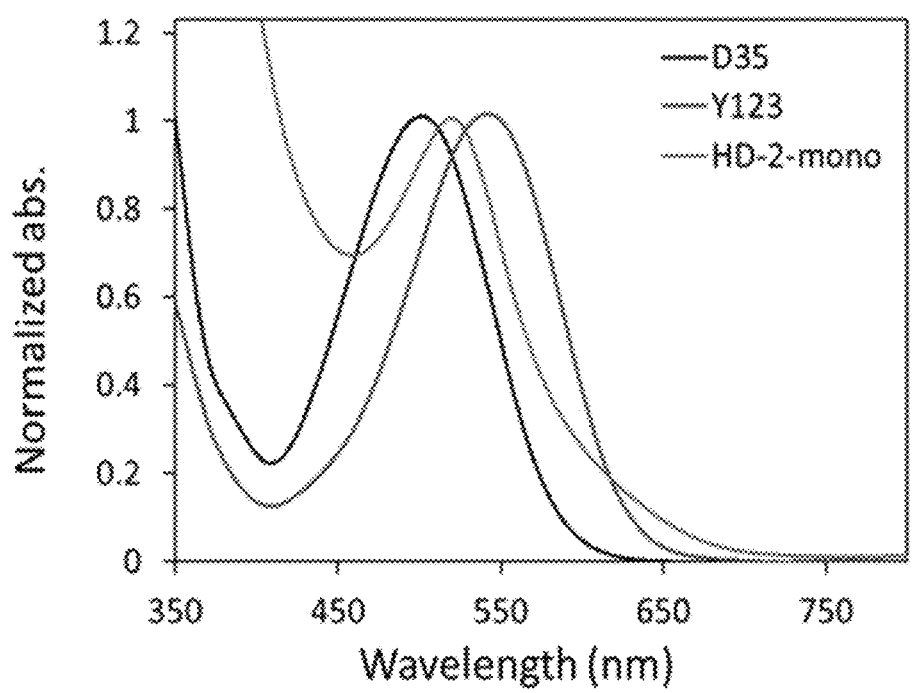

FIG. 4 shows a graph illustrating the UV-Vis absorption profile of D35 and Y123 in DCM with HD-2-mono in DMF.

Figure 5:
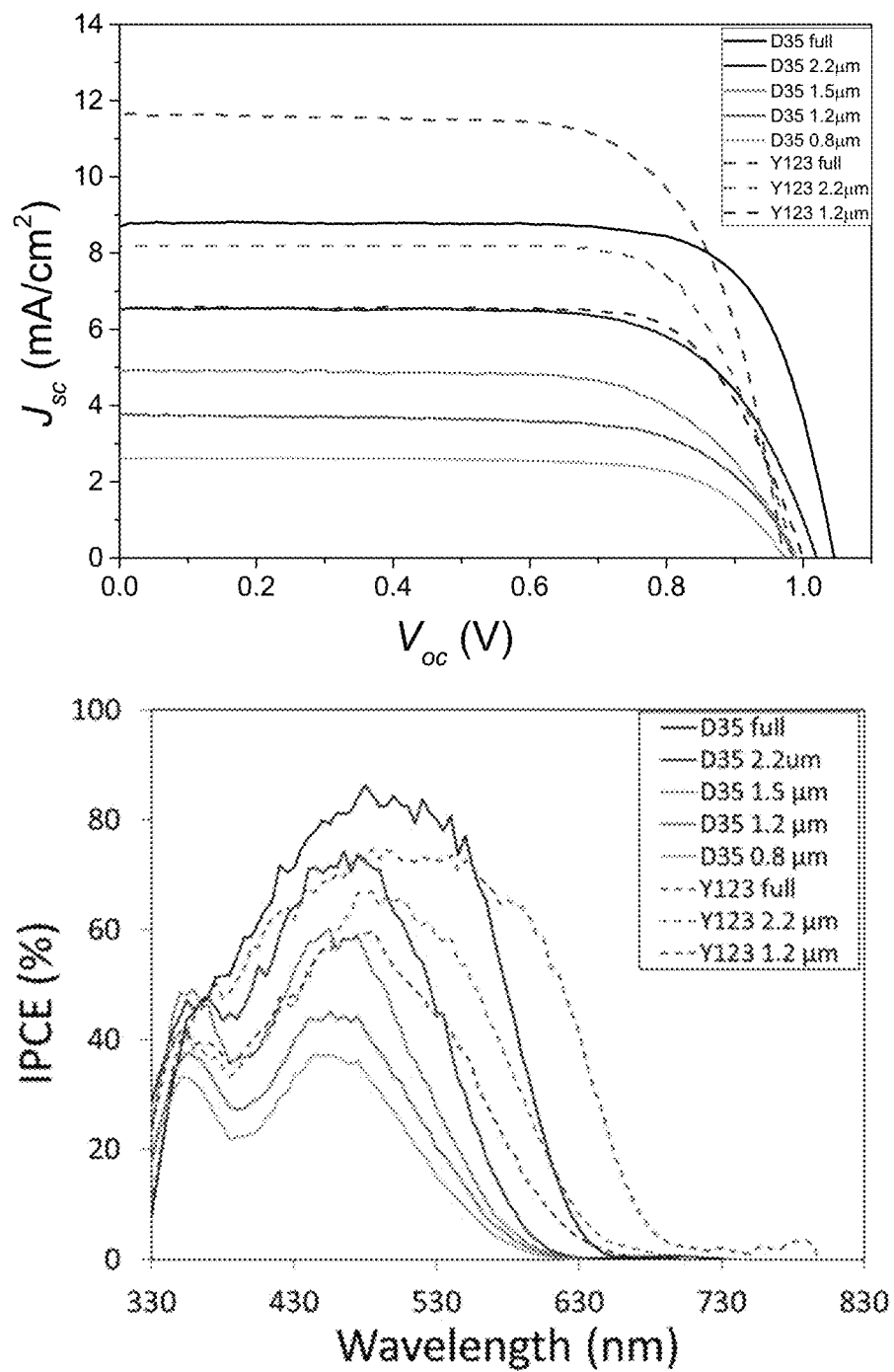

FIG. 5 shows graphs illustrating IV curves (left) and IPCE (right) of optimized $Co(bpy-pz)_2^{3+/2+}$ based devices in Table 1 for D35 (solid lines) and Y123 (dotted lines).

Figure 6:
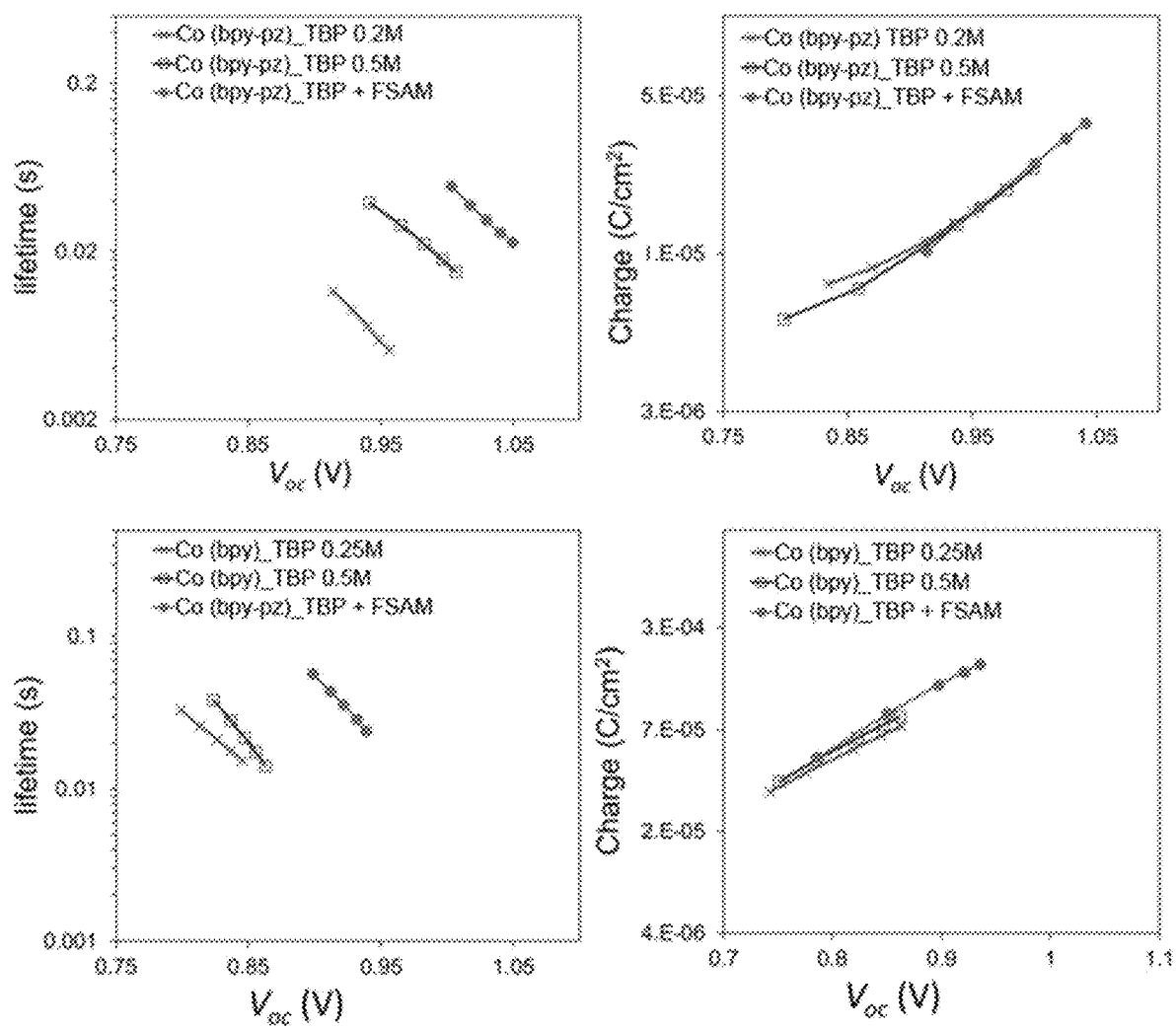

FIG. 6 shows graphs illustrating photovoltage transient measurements plotted as electron lifetime versus open-circuit voltage and charge density versus open-circuit voltage for $Co(bpy-pz)_2^{3+/2+}$ (top) and $Co(bpy)_3^{3+/2+}$ (bottom).

Figure 7A:
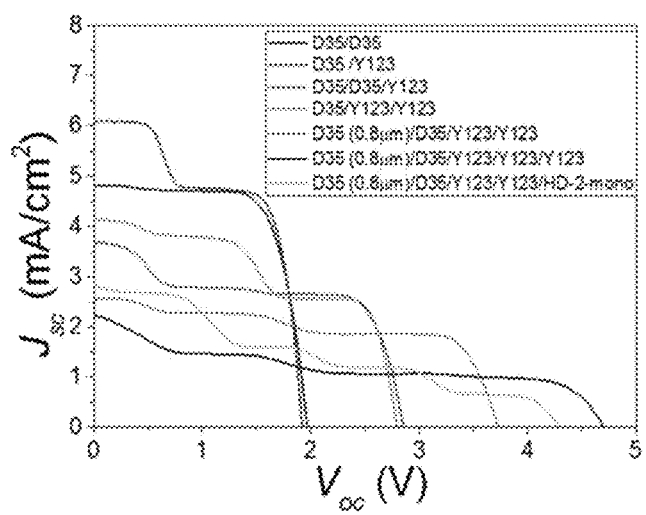
Figure 7B:
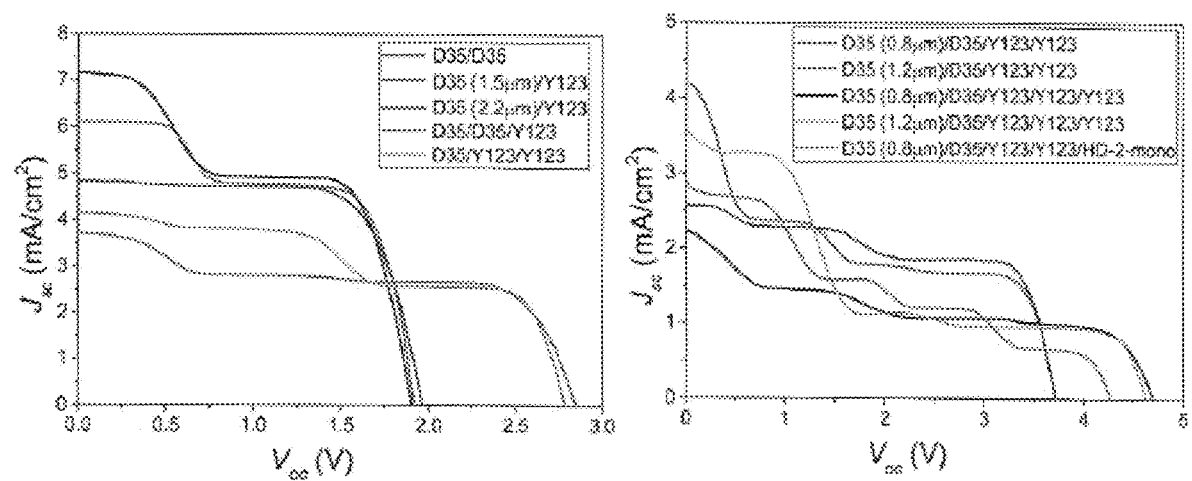
Figure 7C:
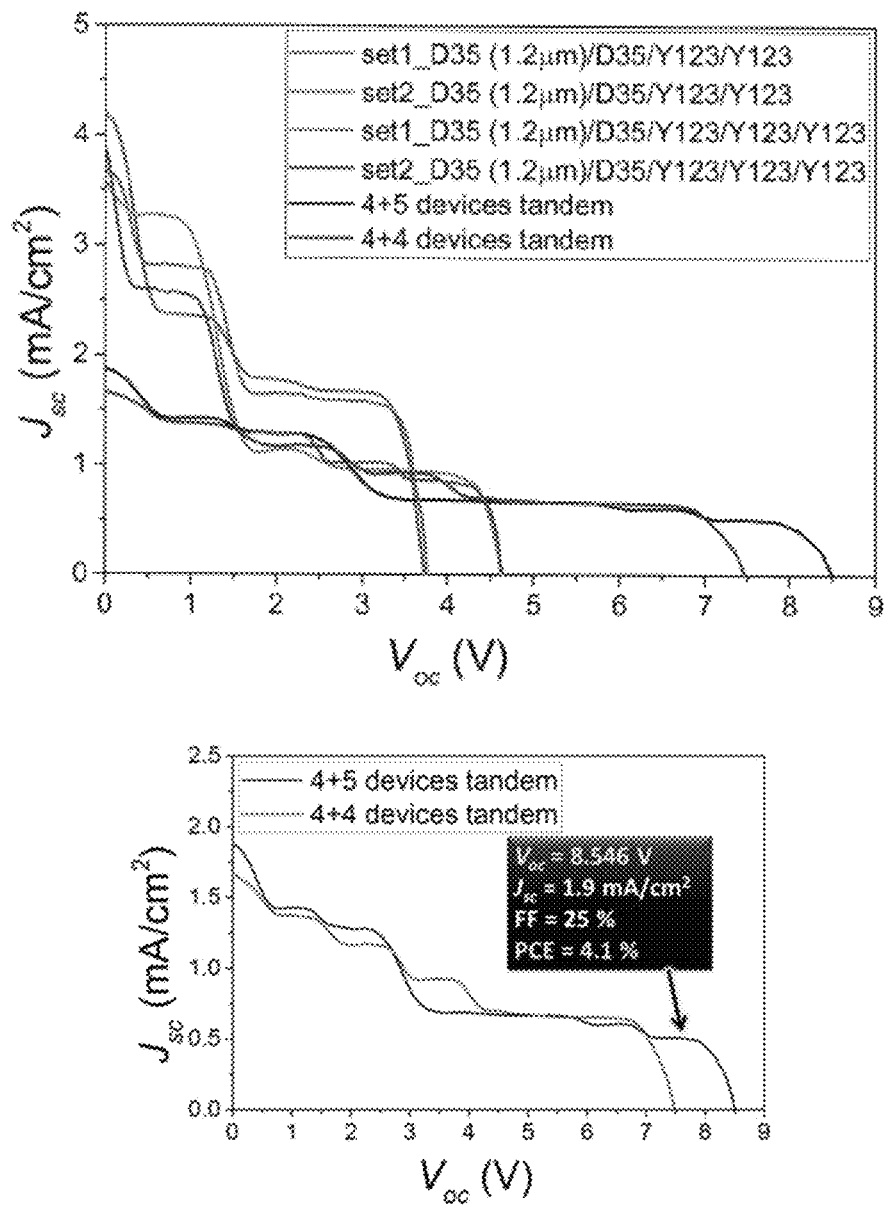

FIGS. 7A-C show graphs illustrating IV results for various SSM-DSC devices. (A) Shows IV curve results for single illuminated area, 2-5 SSM-DSC devices (top). IV curves for 2 SSM-DSC systems (4+4 or 4+5 subcells) irradiated side-by-side (bottom). (B) Shows graphs illustrating IV results for tandem devices left (two and three devices), right (four and five devices) given in Table 3 for $Co(bpy-pz)^{3+/2+}$ electrolyte based devices. (C) Shows IV graphs for four and five devices with two sets (set1 and set2) which were connected in series to add up photovoltage.

Figure 8:
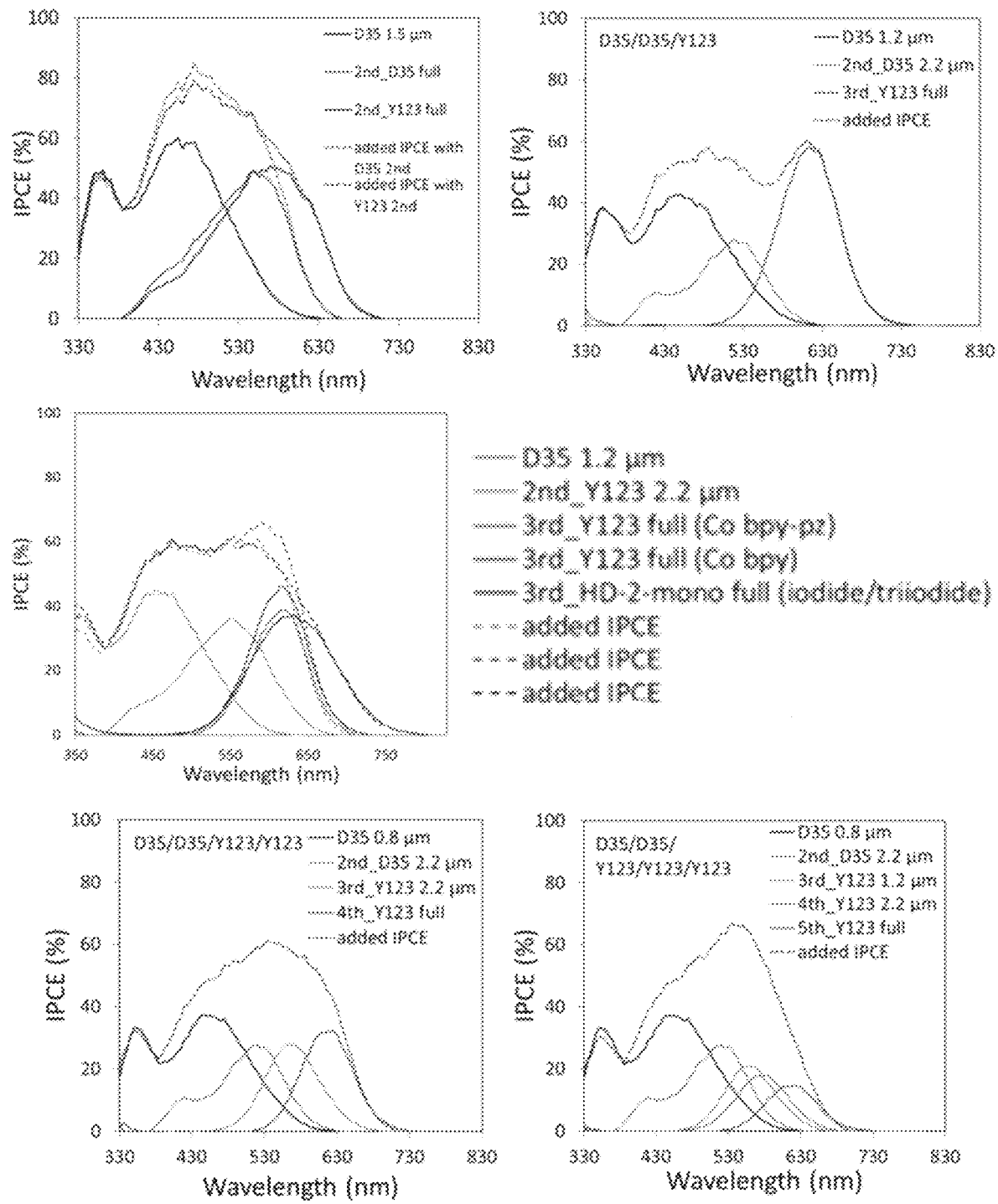

FIG. 8 shows IPCE graphs for individual subcells in the SSM-DSC configuration for $Co(bpy-pz)_2^{3+/2+}$ electrolyte in Tables 5-7. Blue colored dotted line in each graph represent the curve as the result of manual addition of all the IPCE's from devices in the stack.

Figure 9A:
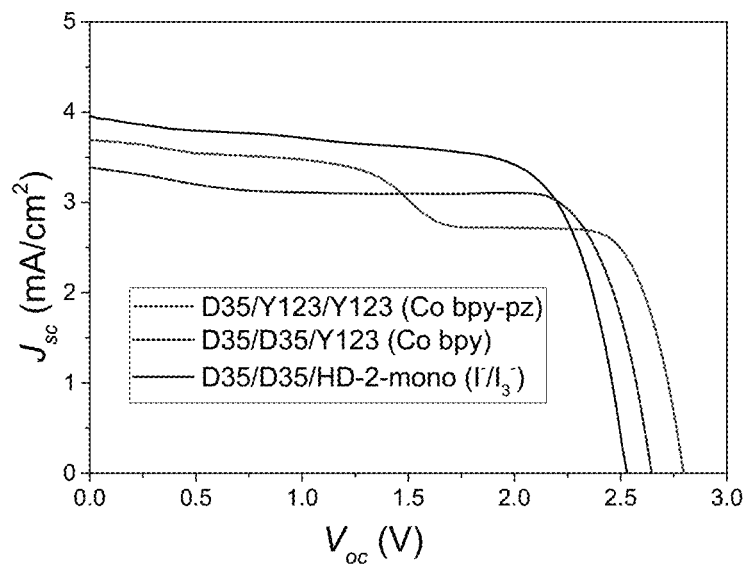
Figure 9B:
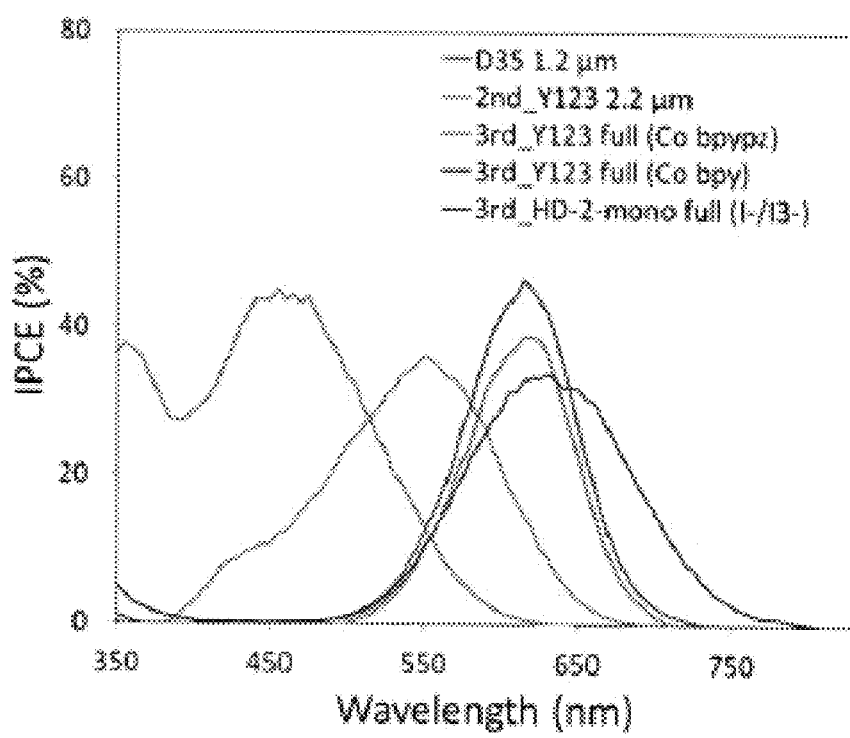

FIGS. 9A-B show graphs illustrating (A) IV and (B) IPCE curves corresponding to devices reported in Table 6 comparing varying only the third device.

Figure 10:
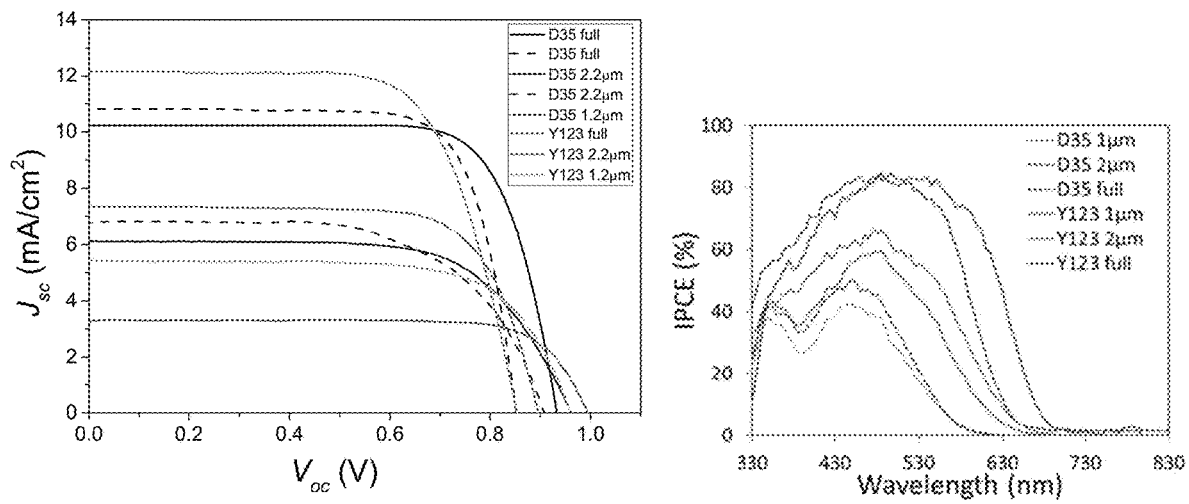

FIG. 10 shows graphs illustrating IV (left) and IPCE (right) of $Co(bpy)_3^{3+/2+}$ electrolyte based devices in Table 8.

Figure 11:
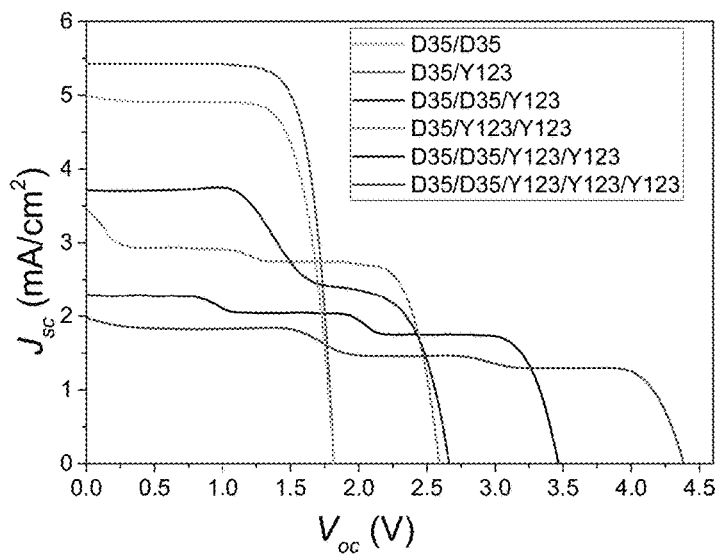

FIG. 11 shows a graph illustrating IV results for SSM-DSC devices given in Table 9 for $Co(bpy)_3^{3+/2+}$ electrolyte based devices.

Figure 12:
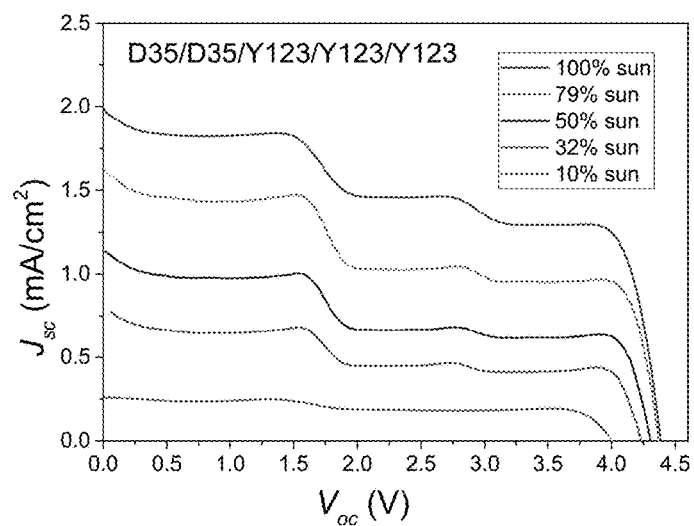

FIG. 12 shows a graph illustrating IV results for a 5 subcell SSM-DSC device (the final entry in Table 10) with the $Co(bpy)_3^{3+/2+}$ redox shuttle measured under different % sun values.

Figure 13:
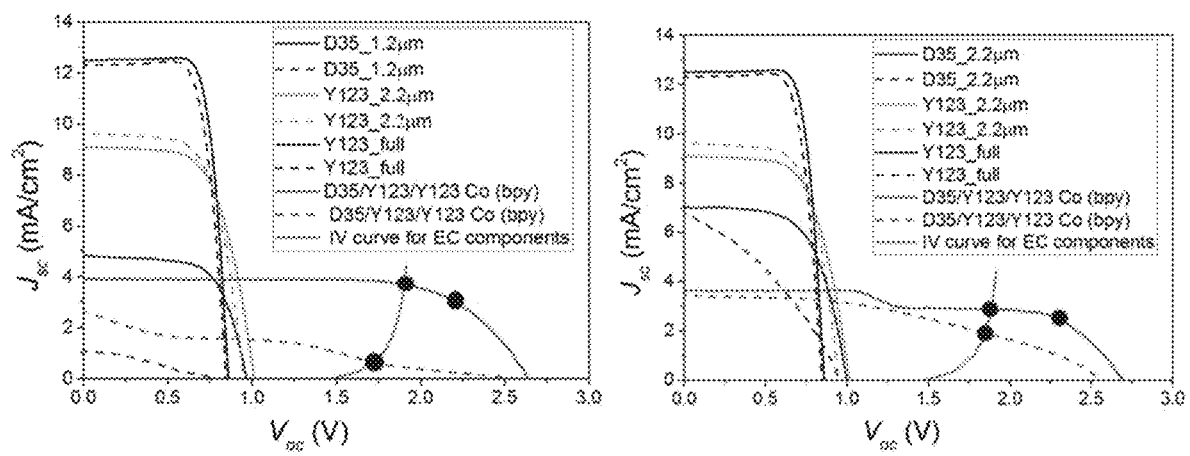

FIG. 13 shows graphs illustrating IV results for a three subcell SSM-DSC device and each subcell in the SSM-DSC configuration before electrolysis (solid) and after electrolysis (dotted). Left: A 1.2 µm D35 front device was used for enhanced current matching through each subcell with a slightly lower overall voltage. Right: A 2.2 µm D35 front device was used for a higher overall voltage with a slight lower current due to mismatching of the subcell current flow. The IV curve for the $Au_2O_3/IrO_2$ EC system is shown as well with the marked intersection of the IV curve. The left hand case has the EC curve intersection of the SSM-DSC curve closer to the maximum power point of the SSM-DSC (marked as a blue dot with no intersecting line) leading to a higher overall solar-to-fuel efficiency. The right hand case shows a device with enhanced stability of the front cell.

Figure 14:
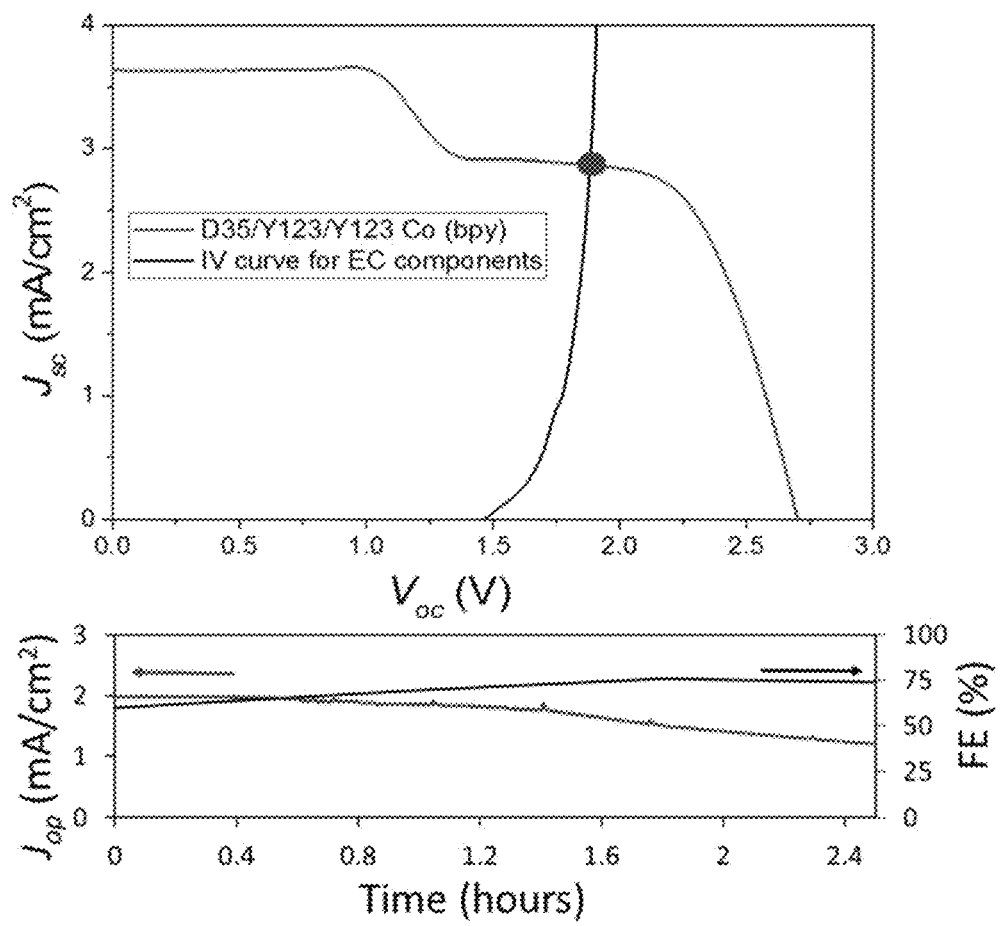

FIG. 14 shows graphs illustrating PV-EC IV results for a 3 subcell SSM-DSC, blue dot highlights the operating point for a PV-EC device (top). $J_{op}$ and FE as a function of time for the PV-EC system (bottom).

Figure 15:
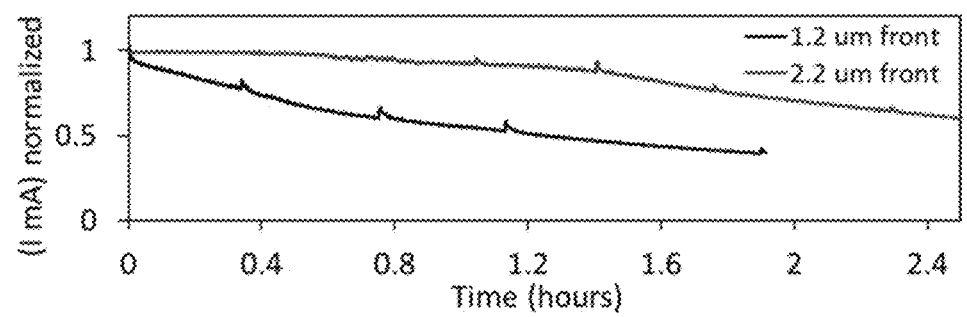

FIG. 15 shows a graph illustrating current flow comparison through a PV-EC cell with different front cells.

Figure 16:
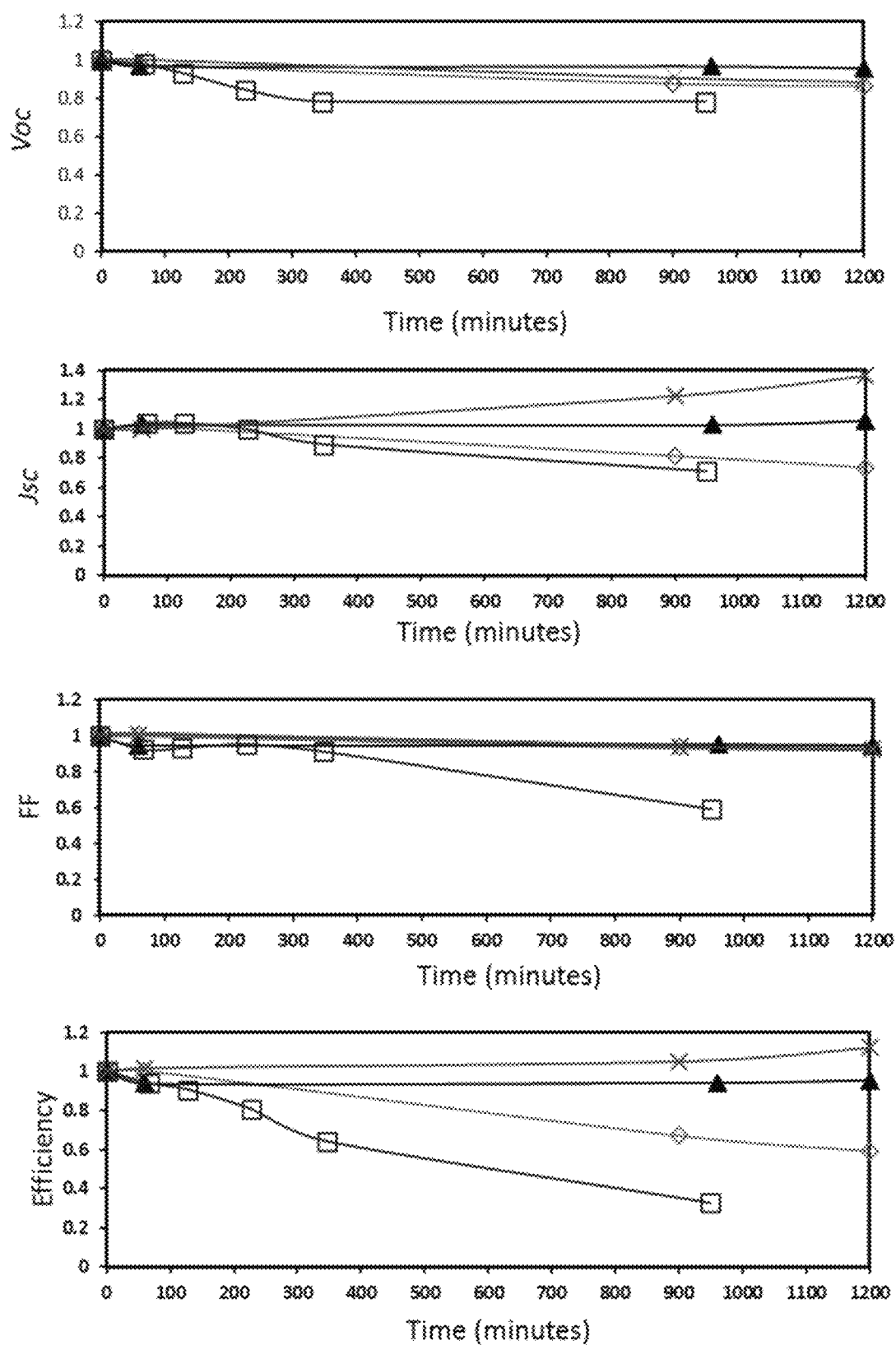

FIG. 16 shows graphs illustrating demonstration of a 1.2 µm stable front device by the application of a 385 nm UV cutoff filter and gel electrolyte. Black (triangle): gel electrolyte with the filter; Red (cross): liquid electrolyte with filter; Blue (square): liquid electrolyte no filter; Green (diamond): gel electrolyte no filter.

Figure 17:
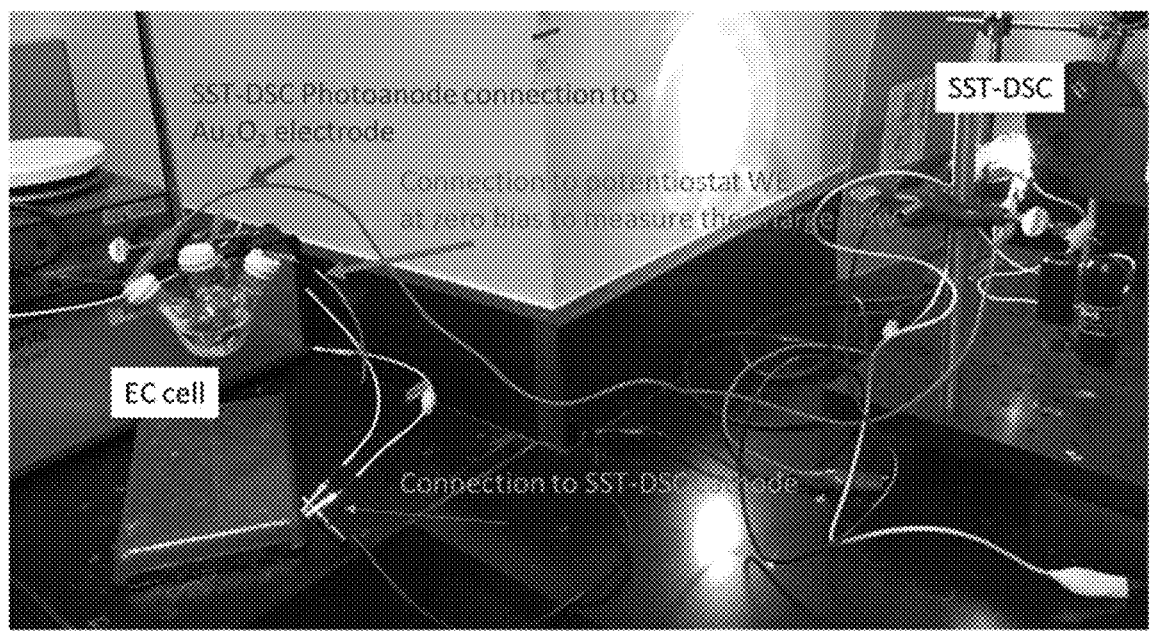

FIG. 17 shows an image illustrating PV-EC setup.

Figure 18:
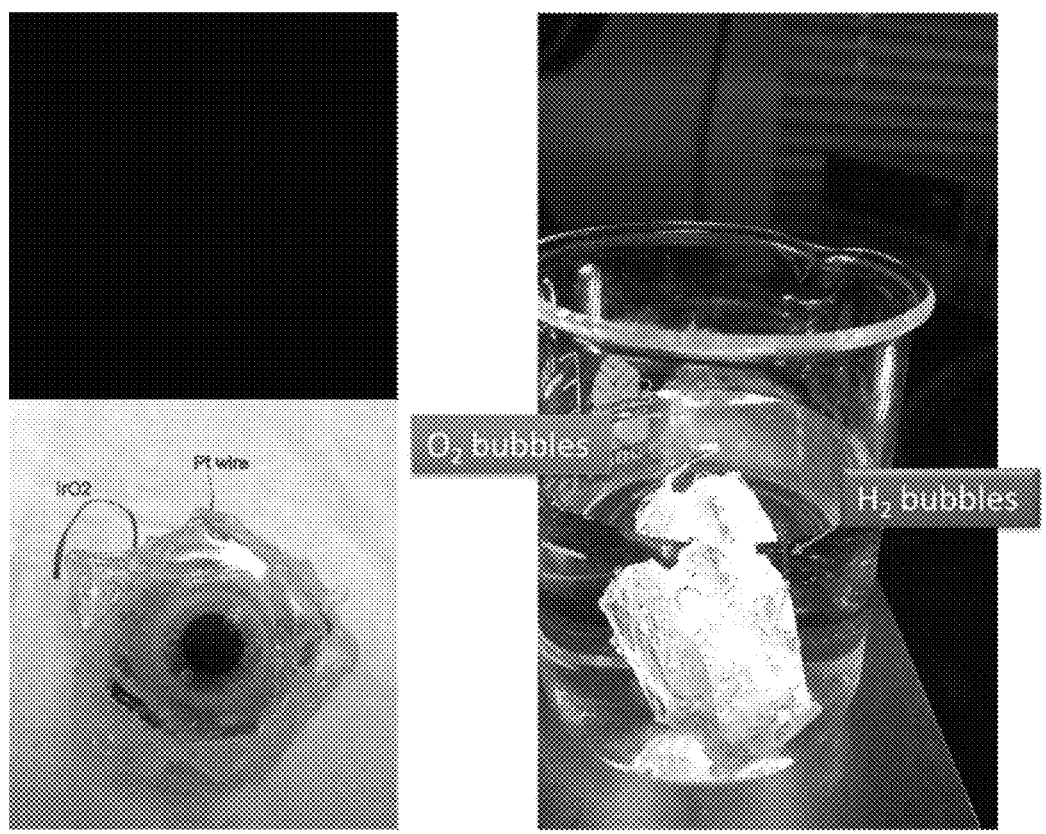

FIG. 18 shows an image illustrating SSM-DSC which was dropped in $H_2O$ itself.

Figure 19:
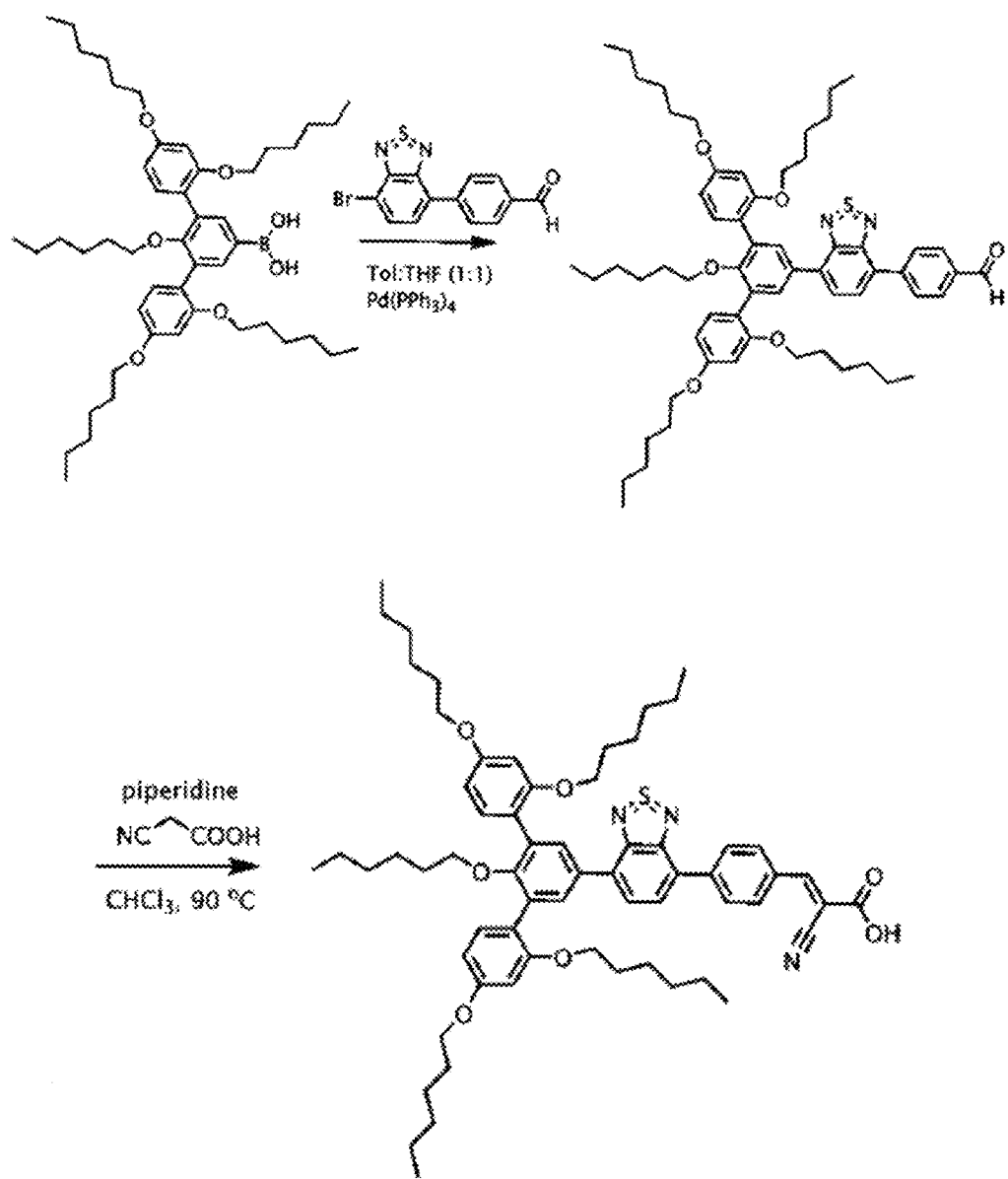

FIG. 19 shows a schematic of a method of synthesizing (E)-2-cyano-3-(4-(7-(2,2',2",4,4"-pentakis(hexyloxy)-[1,1':3',1"-terphenyl]-5'-yl)benzo[c][1,2,5]thiadiazol-4-yl)phenyl)acrylic acid coded as RR9.

Figure 20:
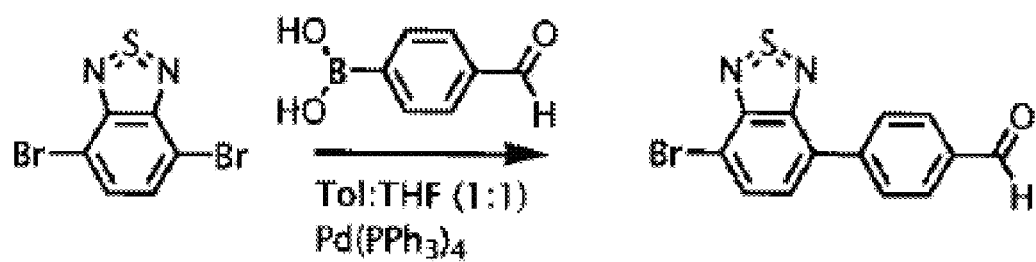

FIG. 20 shows a schematic of a method of synthesizing 4-(7-bromobenzo[c][1,2,5]thiadiazol-4-yl)benzaldehyde.

Figure 21:
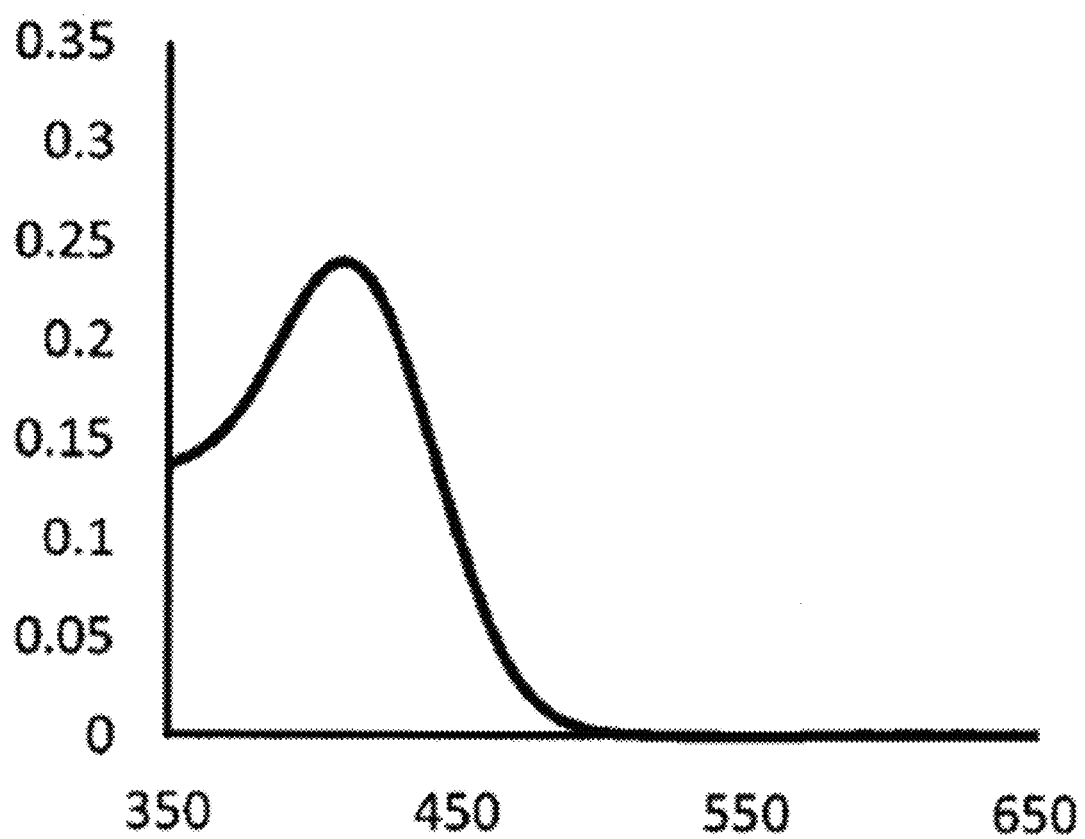

FIG. 21 shows a graph illustrating the absorption curve of RR9 in dichloromethane.

Figure 22A:
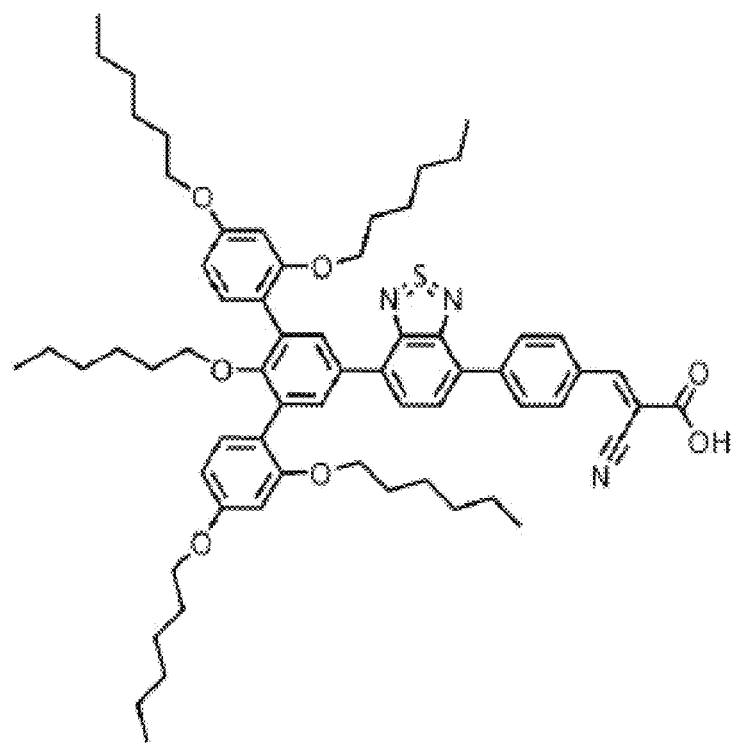
Figure 22B:
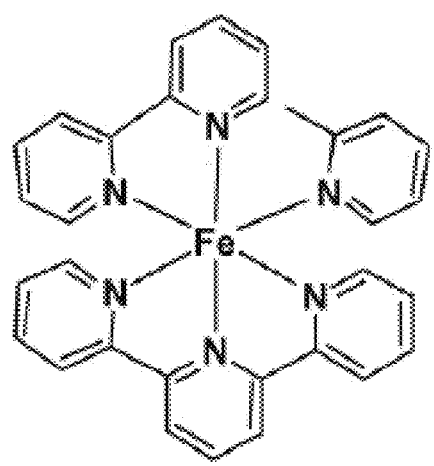

FIGS. 22A-B show chemical structures of (A) RR9 and (B) $Fe(bpy)_3^{+2/+3}$ redox mediators.

Figure 23:
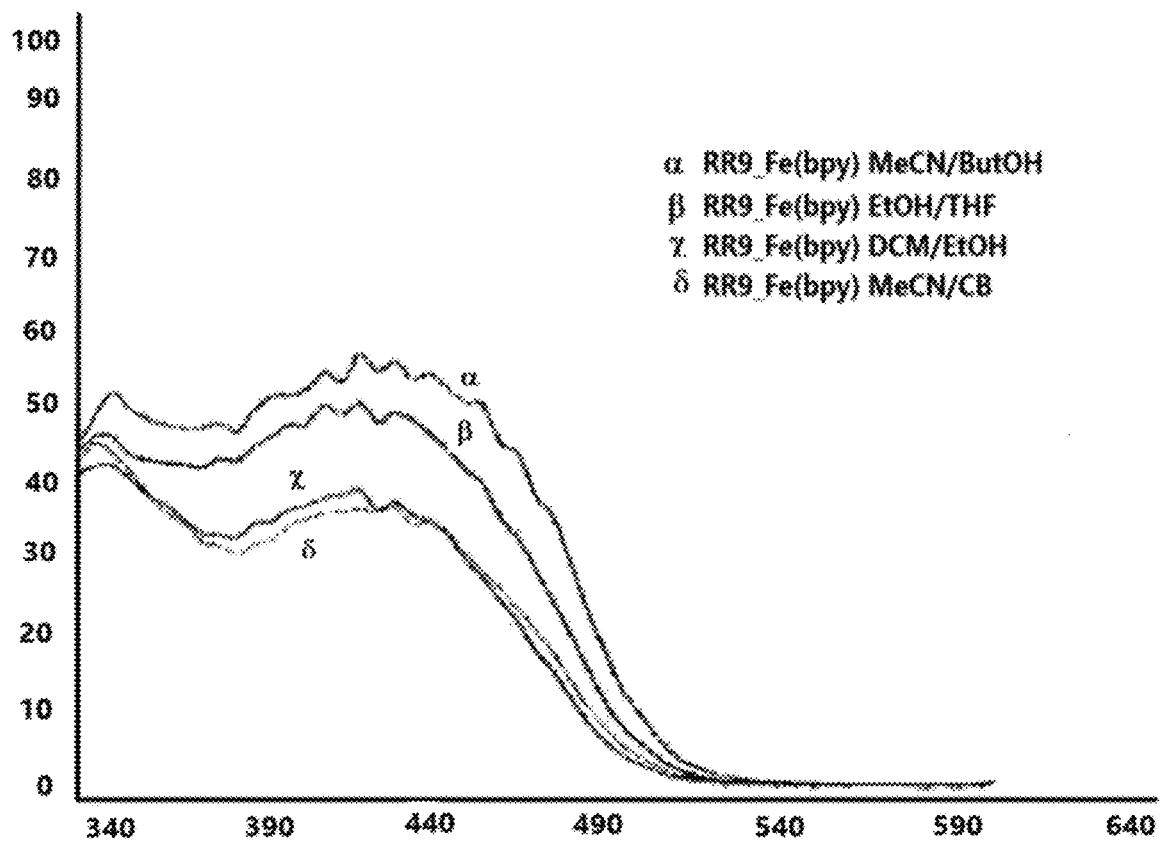

FIG. 23 shows a graph illustrating the IPCE spectrum of RR9 with $Fe(bpy)_3^{3+/2+}$.

Figure 24:
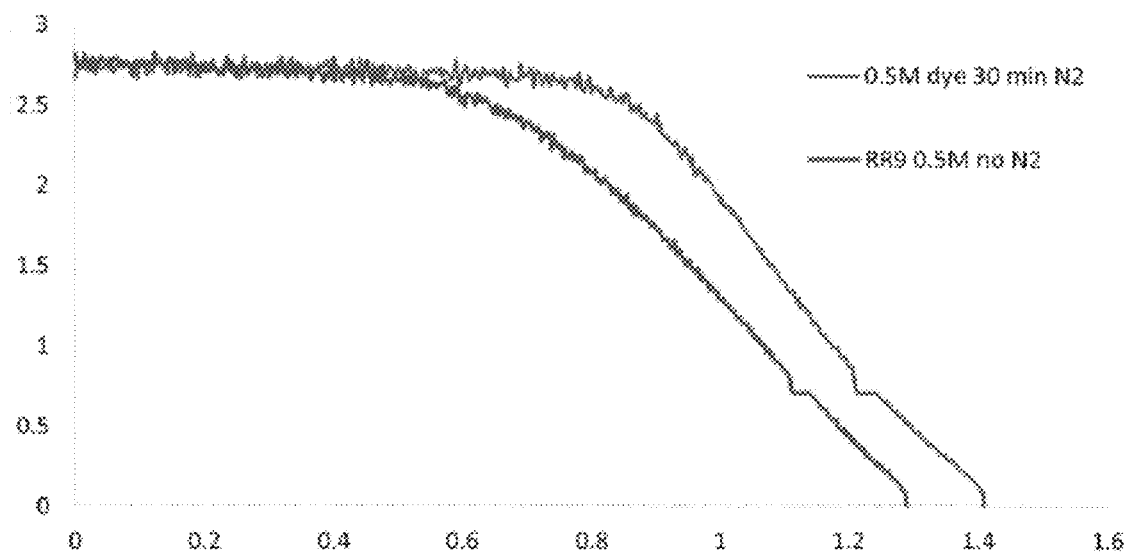

FIG. 24 shows a graph illustrating IV curves of electrodes 5.3 microns $TiO_{2+5}$ microns of scattering layer dipped for 30 min (0.5 M solution) while $N_2$ was flowing (blue curve) and the best device with the same thickness electrodes with no $N_2$ flow (red curve).

Figure 25:
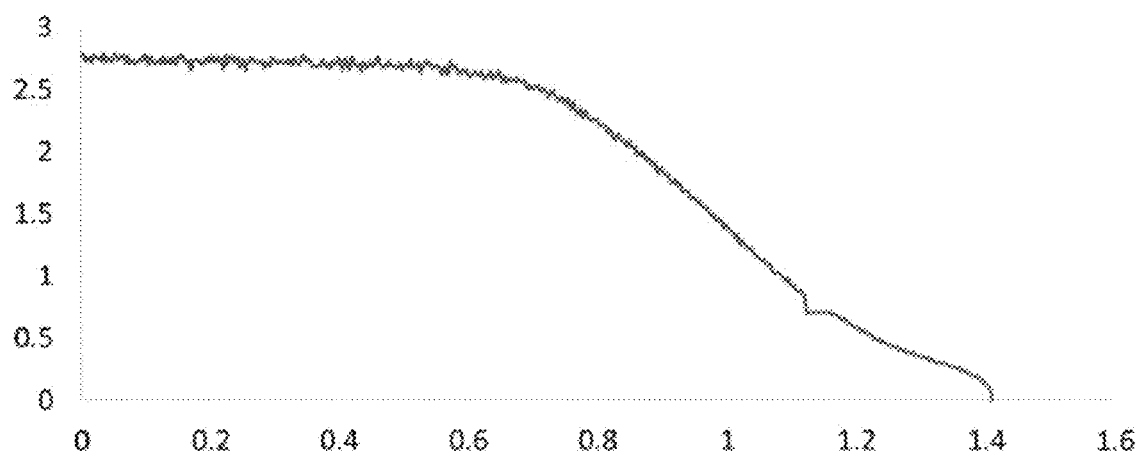

FIG. 25 shows a graph illustrating IV curves of electrode 2.7 microns $TiO_{2+5}$ microns of scattering layer dipped for 4 hrs in a RR9 solution (0.5 M solution).

Figure 26A:
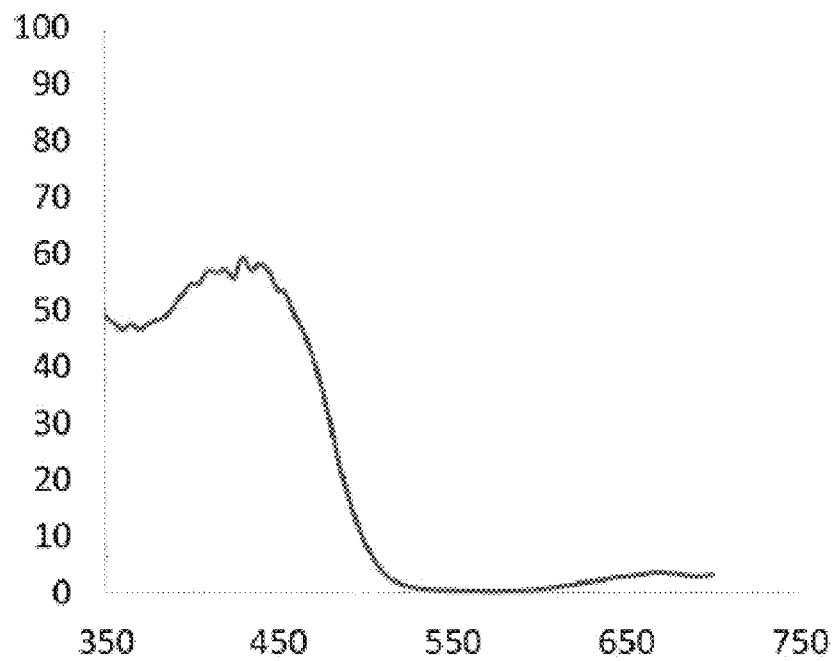
Figure 26B:
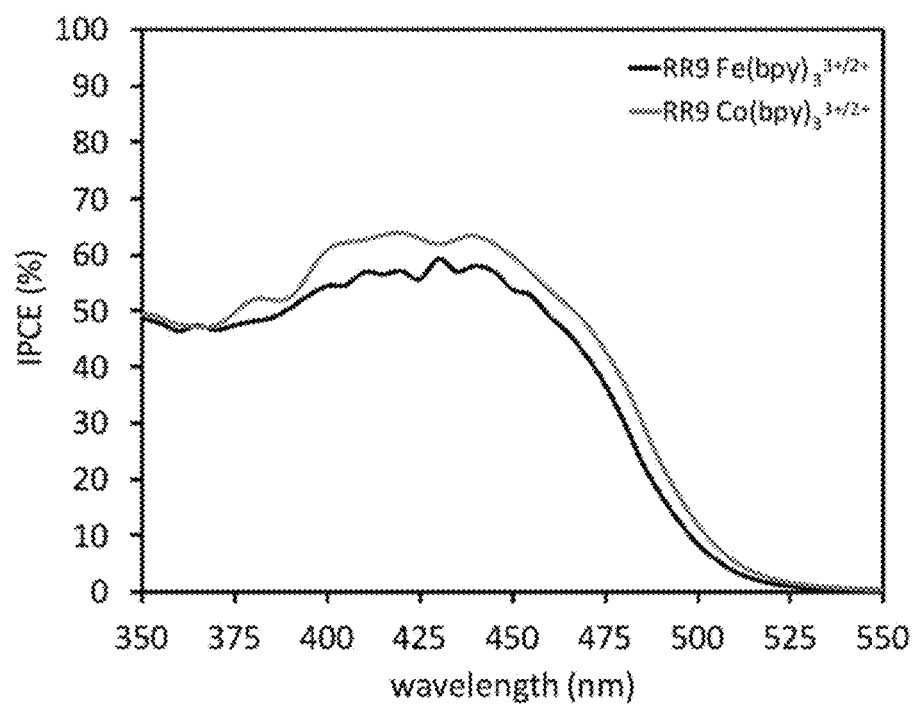

FIGS. 26A-B show graphs illustrating IPCE curves for RR9. (A) Shows a graph illustrating IPCE curve of electrodes 2.7 microns $TiO_{2+5}$ microns of scattering layer dipped for 4 hrs in a RR9 solution (0.5 M solution). (B) Shows a graph illustrating IPCE curves for RR9 with $Fe(bpy)_3^{3+/2+}$ and $Co(bpy)_3^{3+/2+}$ shuttles.

Figure 27:
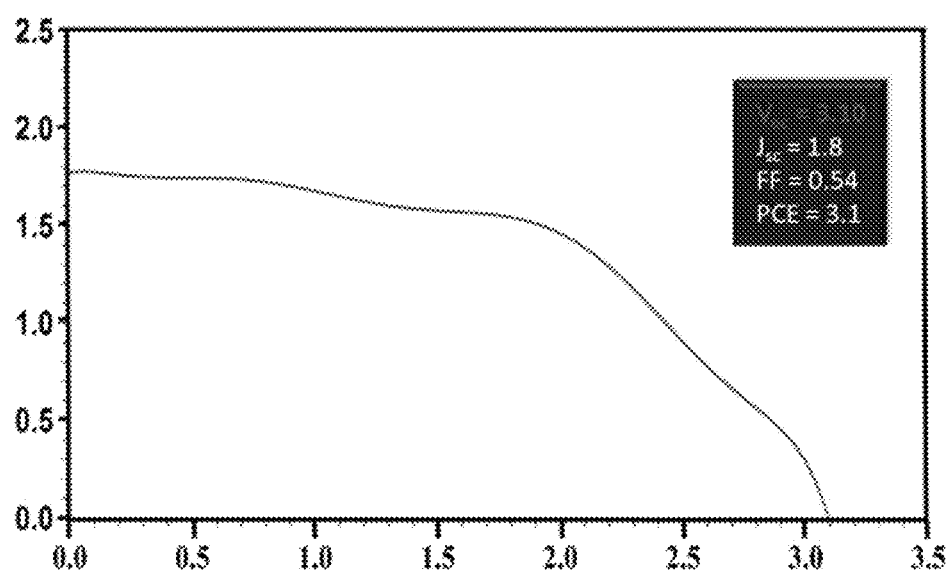

FIG. 27 shows a graph illustrating $V_{oc}$.

Figure 28:
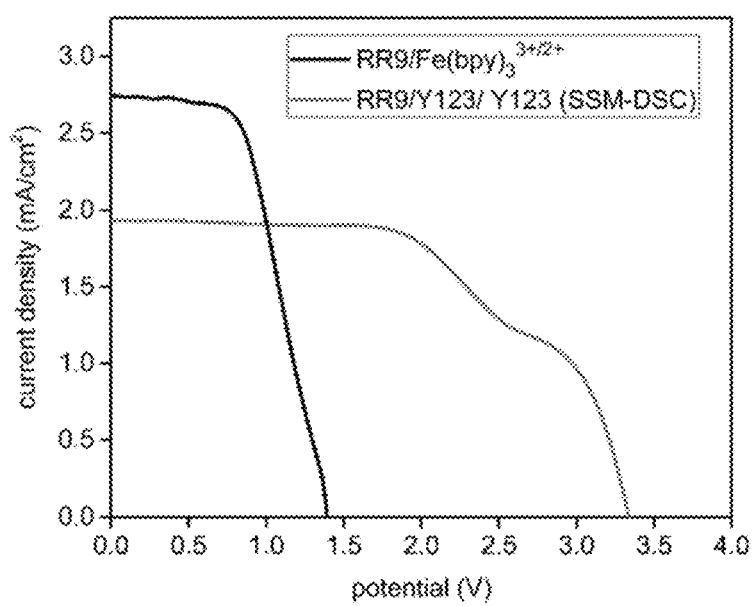

FIG. 28 shows J-V curves for $RR9/Fe(bpy)_3^{3+/2+}$ based DSC and SSM-DSC devices.

Figure 29:
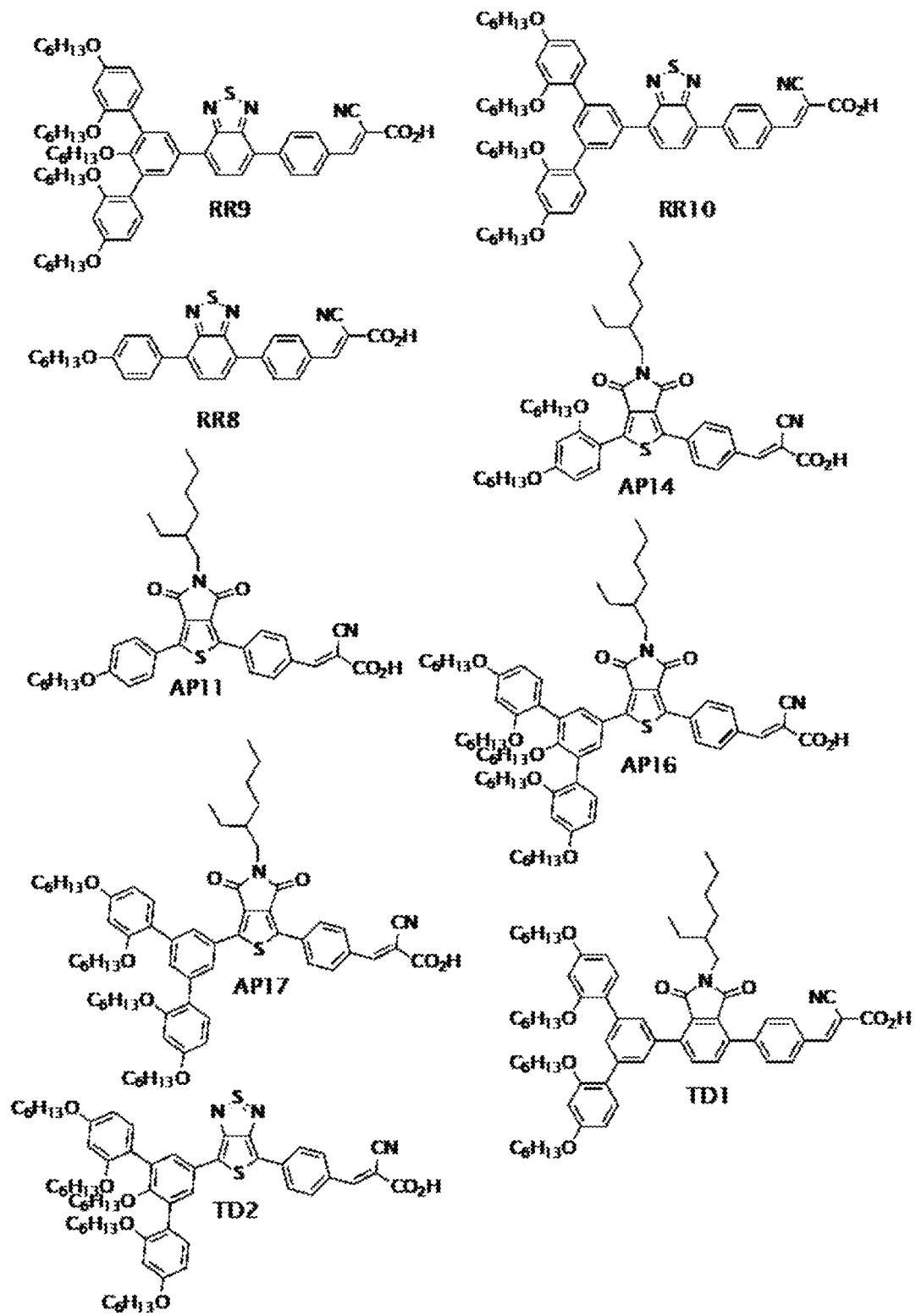

FIG. 29 shows structures for RR8, RR9, RR10, AP11, AP14, AP16, AP17, TD1, and TD2.

Figure 30:
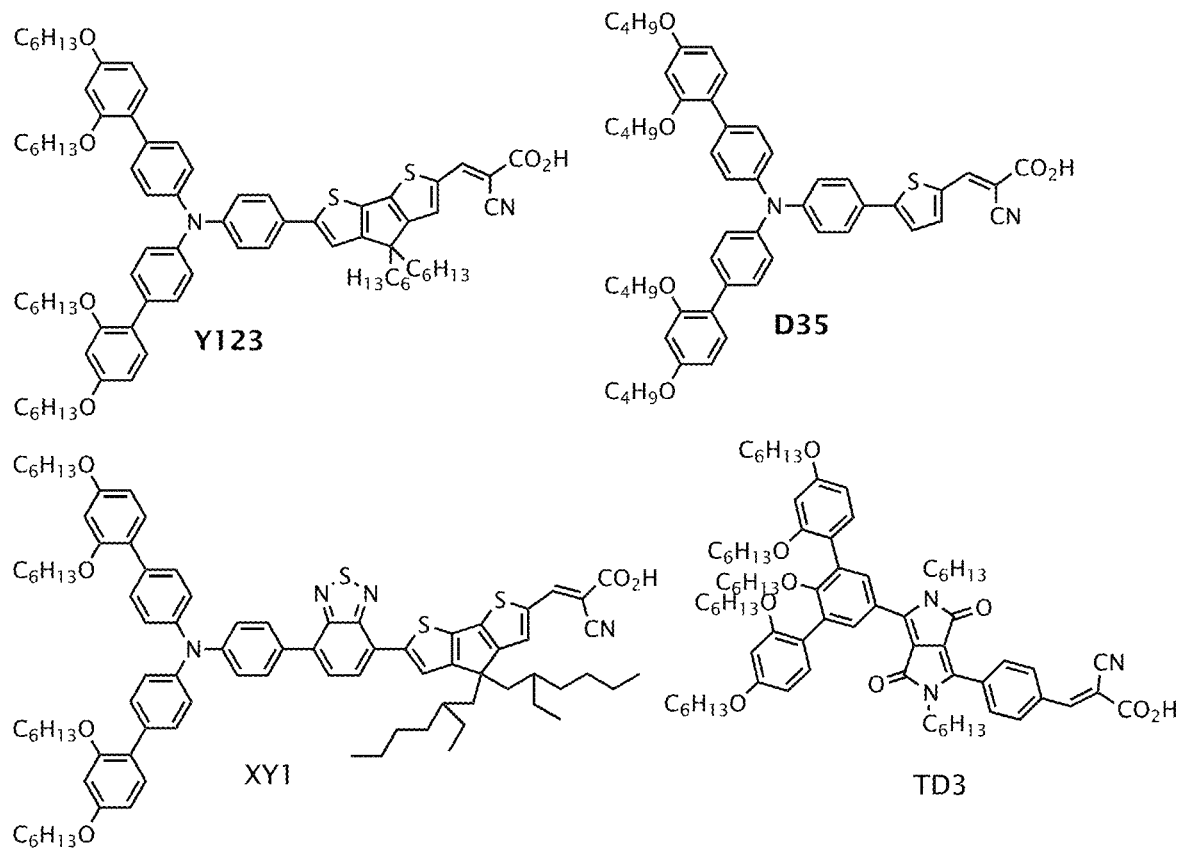

FIG. 30 shows structures for Y123, D35, XY1, and TD3.

Figure 31:
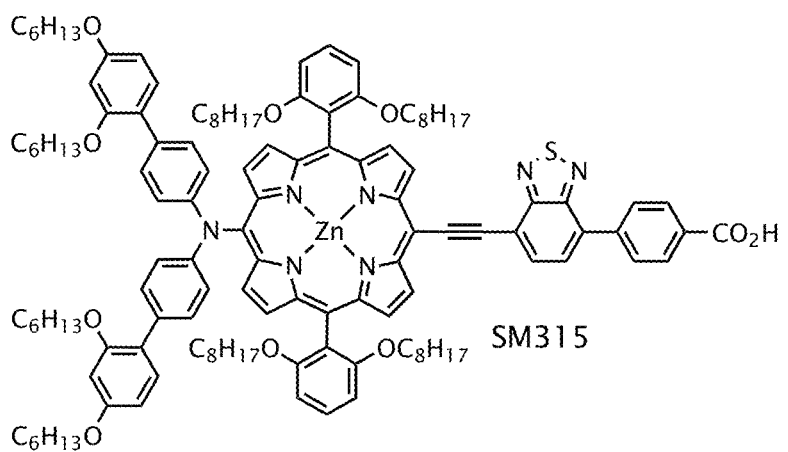

FIG. 31 shows the structure for SM315.

Figure 32A:
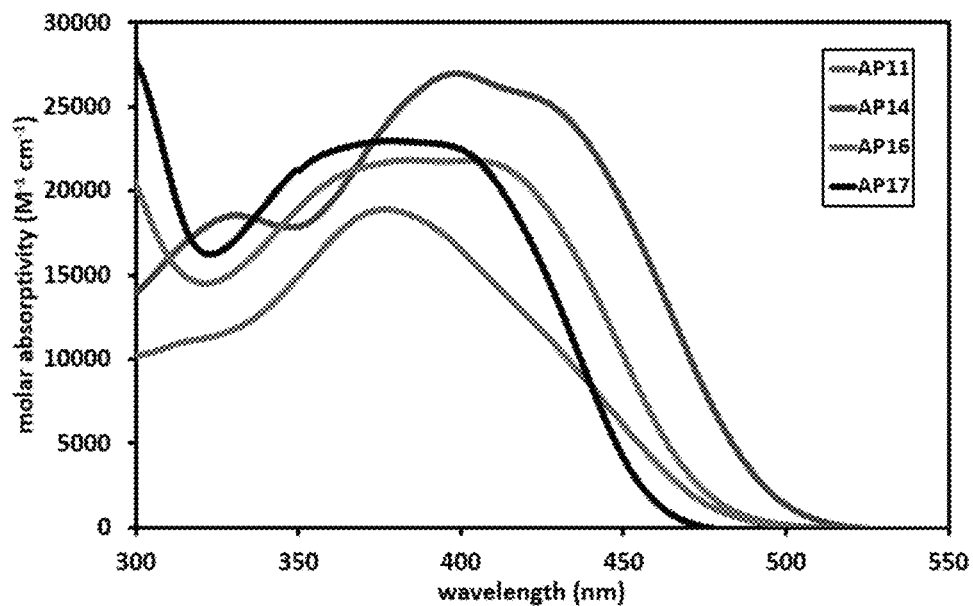
Figure 32B:
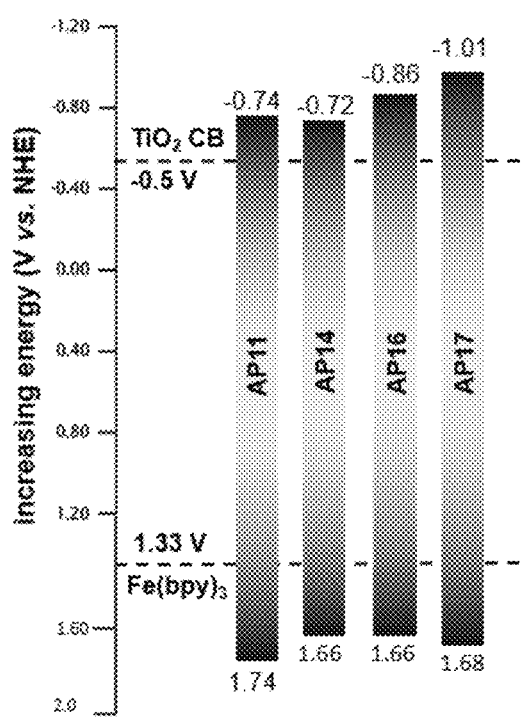

FIGS. 32A-B show graphs illustrating absorption and oxidations potentials for AP11, AP14, AP16, and AP17. (A) molar absorptivity versus wavelength. (B) oxidation potential.

Figure 33:
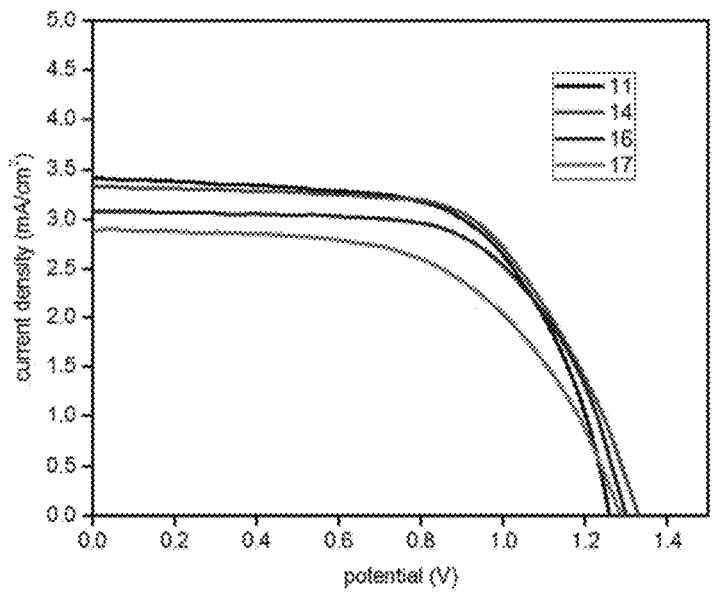

FIG. 33 shows a graph illustrating IV results for AP11, AP14, AP16, and AP17.

Figure 34:
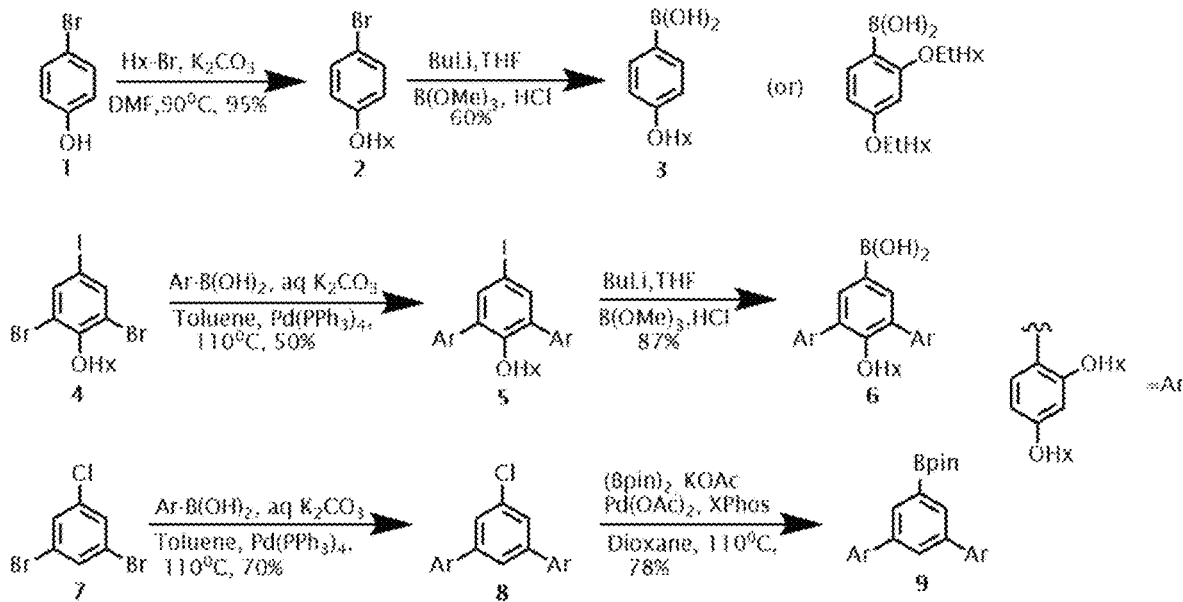

FIG. 34 shows a schematic view of a method for donor synthesis.

Figure 35:
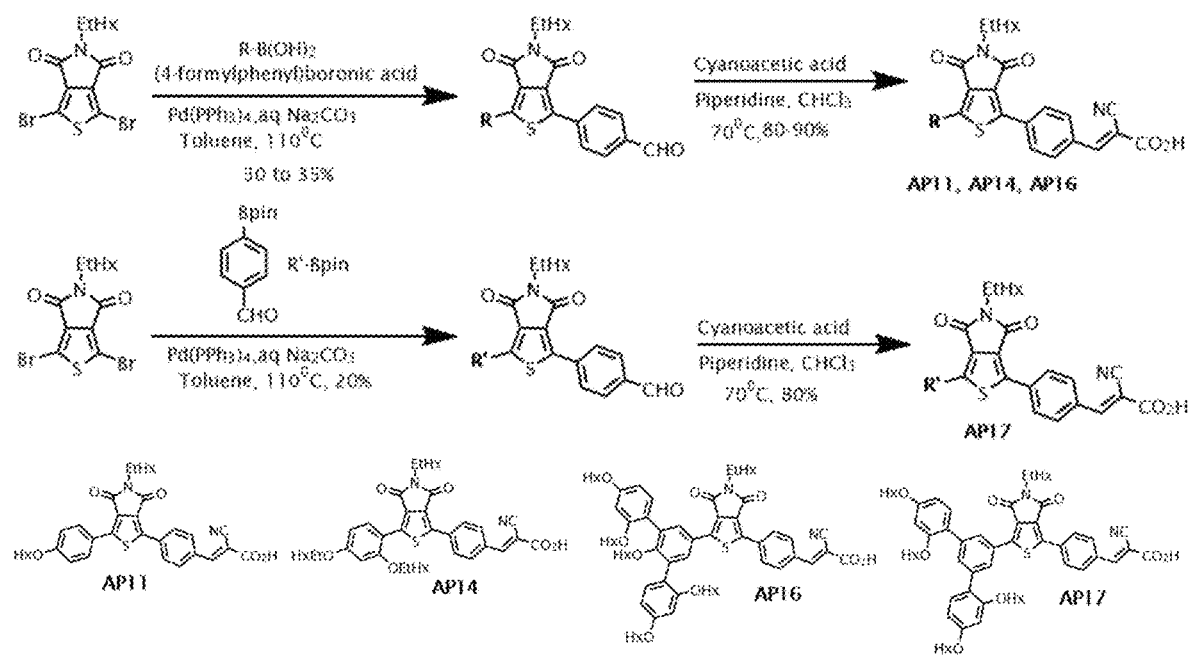

FIG. 35 shows a schematic view of a method for synthesizing AP11, AP14, AP16, and AP17.

Figure 36:
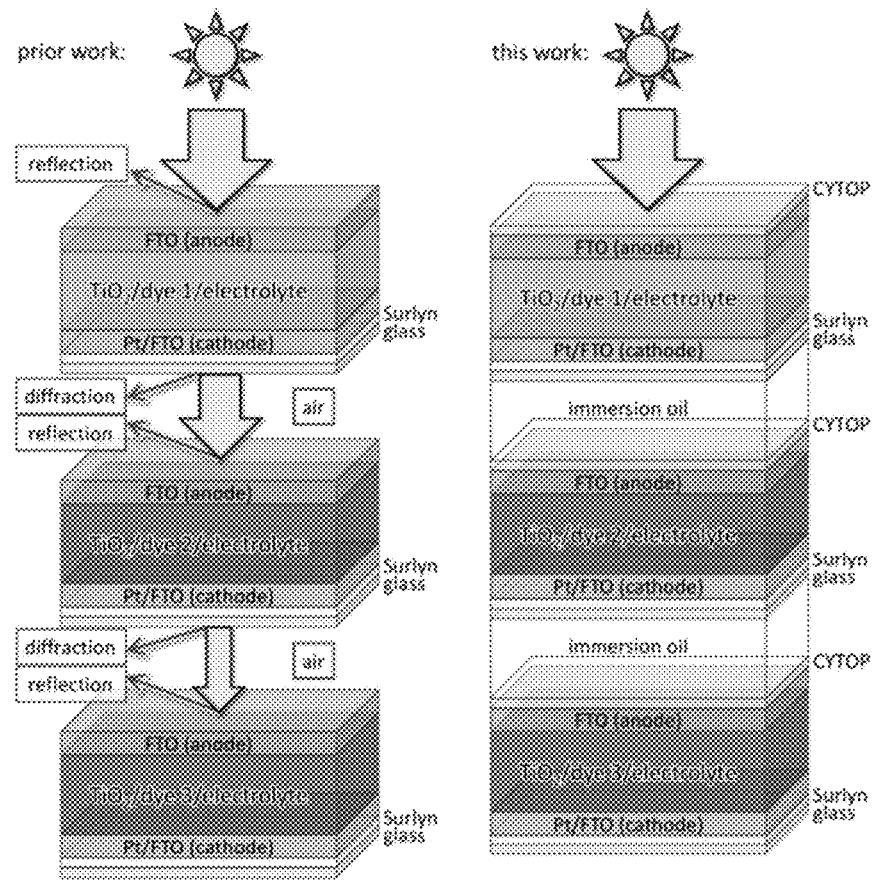

FIG. 36 shows a schematic comparison of SSM-DSC systems with and without CYTOP and immersion oil.

Figure 37:
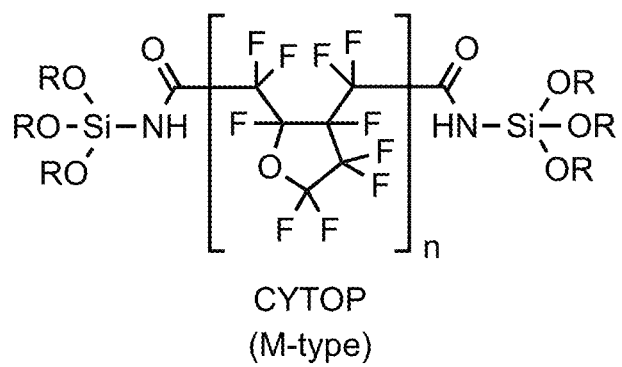

FIG. 37 shows the structure of CYTOP.

Figure 38:
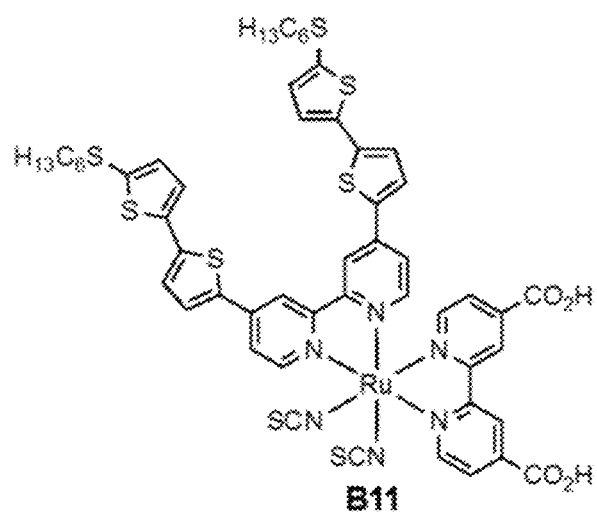

FIG. 38 shows the structure of B11.

Figure 39:
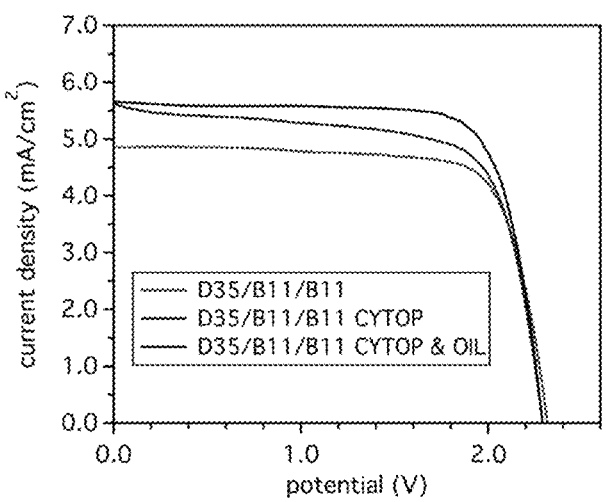

FIG. 39 shows a graph illustrating IV for a D35/B11/B11 system without CYTOP or oil, a D35/B11/B11 system with CYTOP, and a D35/B11/B11 system with CYTOP and oil.

While the disclosure is susceptible to various modifications and alternative forms, specific embodiments thereof have been shown by way of example in the drawings and are herein described below in detail. It should be understood, however, that the description of specific embodiments is not intended to limit the disclosure. All modifications, equivalents, and alternatives falling within the spirit and scope of the disclosure as defined by the appended claims are to be covered.

Definitions

Unless defined otherwise, all technical and scientific terms used herein have the same meaning as commonly understood by one of ordinary skill in the art to which the disclosure belongs. Any methods and materials similar to or equivalent to those described herein can be used in the practice or testing of the present disclosure, including the methods and materials are described below.

Following long-standing patent law convention, the terms "a," "an," and "the" refer to "one or more" when used in this application, including the claims. Thus, for example, reference to "a cell" includes a plurality of cells, and so forth.

The terms "comprising," "including," and "having" are intended to be inclusive and mean that there may be additional elements other than the listed elements.

Unless otherwise indicated, all numbers expressing quantities of ingredients, properties such as reaction conditions, and so forth used in the specification and claims are to be understood as being modified in all instances by the term "about." Accordingly, unless indicated to the contrary, the numerical parameters set forth in this specification and claims are approximations that can vary depending upon the desired properties sought to be obtained by the presently-disclosed subject matter.

As used herein, the term "medium electron density" means any group or moiety having less electron density than the donor region but more than the acceptor region. As will be understood by those skilled in the art, the range of suitable electron densities will depend upon the specific donor and acceptor regions of the compounds disclosed herein.

As used herein, the term "about," when referring to a value or to an amount of mass, weight, time, volume, concentration, percentage, or the like is meant to encompass variations of in some embodiments ±50%, in some embodiments ±40%, in some embodiments ±30%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

All combinations of method or process steps as used herein can be performed in any order, unless otherwise specified or clearly implied to the contrary by the context in which the referenced combination is made.

DETAILED DESCRIPTION

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

The presently-disclosed subject matter relates to dyes, solar cells, and methods for making and using the same. Provided herein, in some embodiments, is a dye for use in solar cells. For example, in one embodiment, the dye includes a sensitizer dye for use in dye-sensitized solar cells (DSCs). In another embodiment, the dye includes a donor-π-bridge-acceptor (D-π-A) structure, where the donor moiety is an electron rich region, the π-bridge moiety includes medium electron density, and the acceptor moiety is an electron deficient region.

In some embodiments, the donor moiety includes, but is not limited to, any moiety according to the following structure:

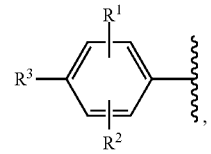

where $R^1$, $R^2$, and $R^3$ individually include, but are not limited to, H, aryl, multiaryl, alkyl substituted aryl, alkoxy substituted aryl, alkyl substituted multiaryl, alkoxy substituted multiaryl, $OR^4$, $N(R^5)_2$, or a combination thereof each $R^4$ individually includes, but is not limited to, H, alkyl, aryl, alkyl substituted aryl, alkoxy substituted aryl, or a combination thereof; and each $R^5$ individually includes, but is not limited to, aryl, multiaryl, alkyl substituted aryl, alkoxy substituted aryl, alkyl substituted multiaryl, alkoxy substituted multiaryl, or a combination thereof. Suitable donor moieties according to the generic structure above include, but are not limited to:
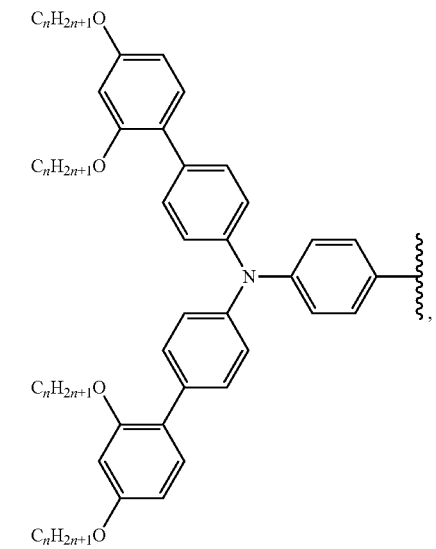
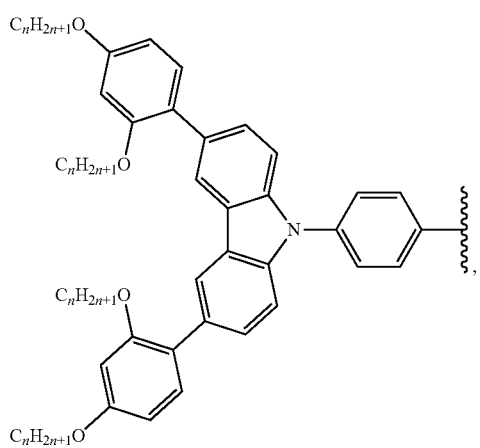
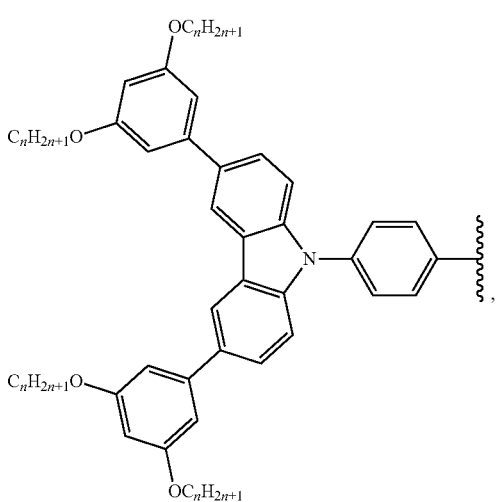
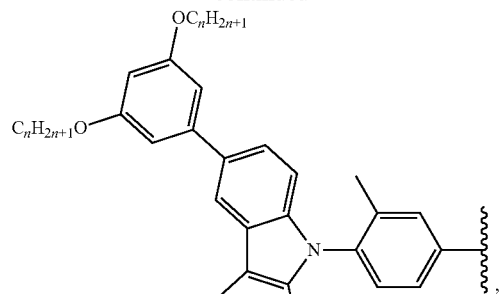
-continued
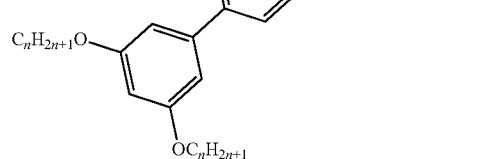
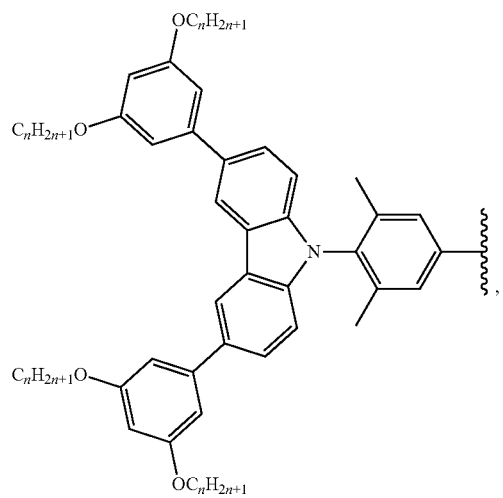
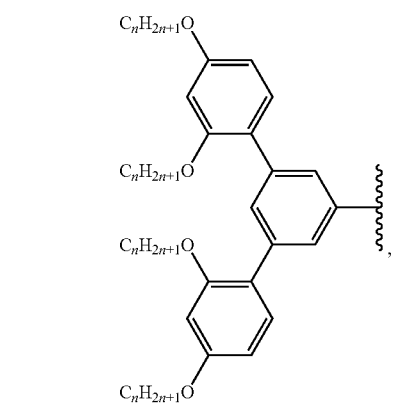

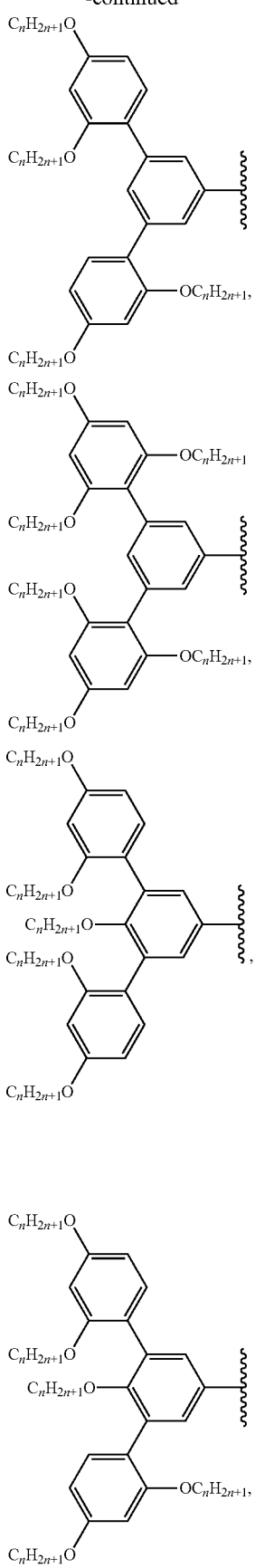
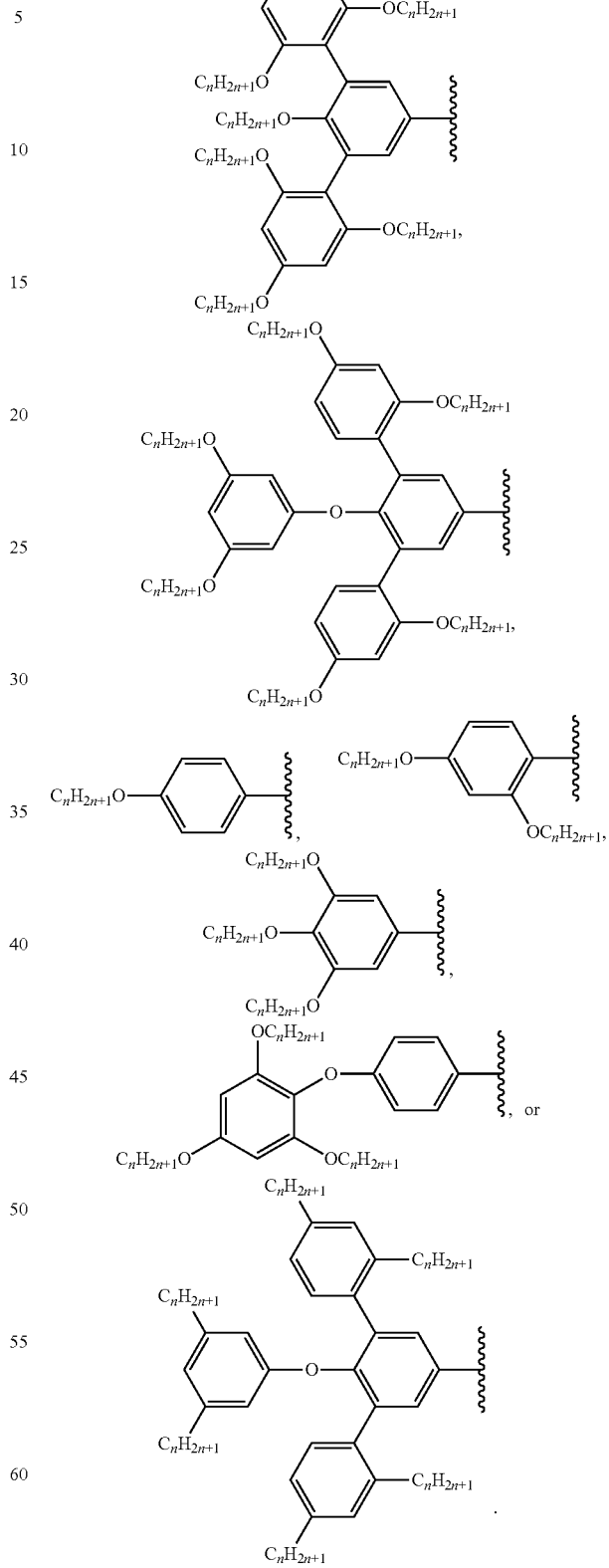
Additionally or alternatively, in some embodiments, the donor moiety includes a biaryl moiety, such as, but not limited to, an unsubstituted biaryl, an alkyl substituted biaryl, or an alkoxy substituted biaryl. In one embodiment, the biaryl donor moiety includes:
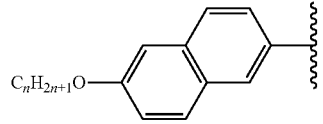
or
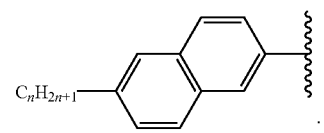
In another embodiment, the donor moiety includes one or more of the following:
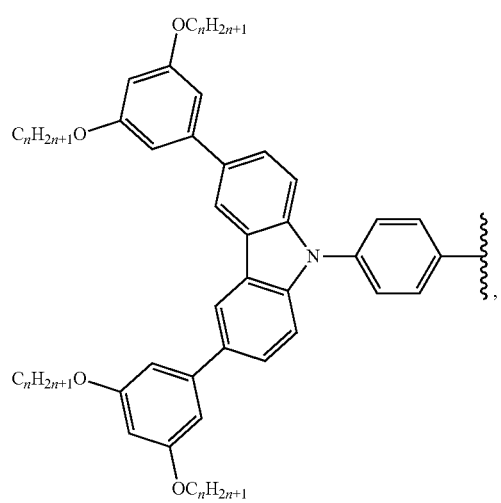
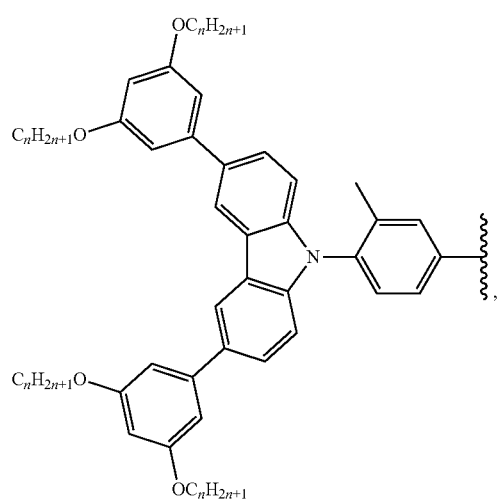
-continued
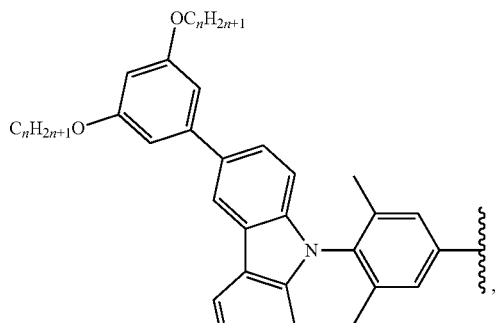
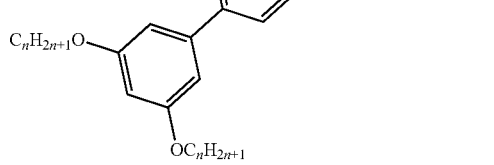
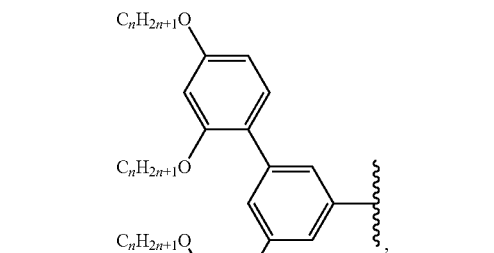
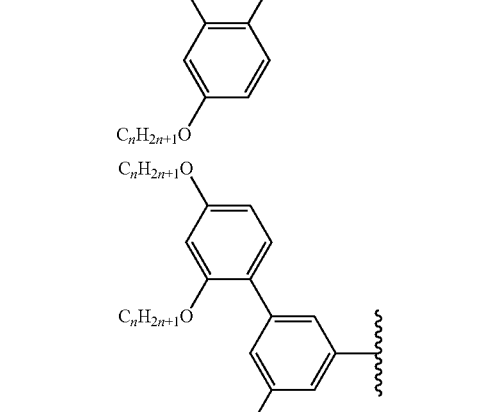
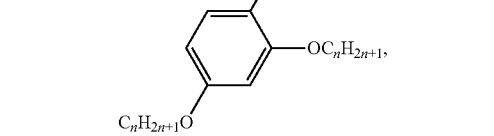
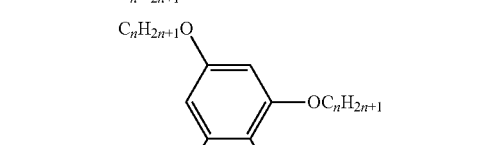
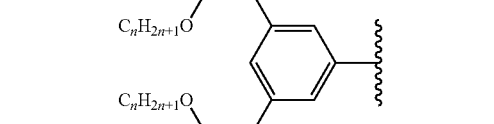
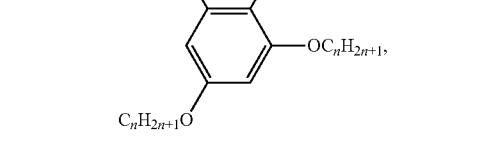

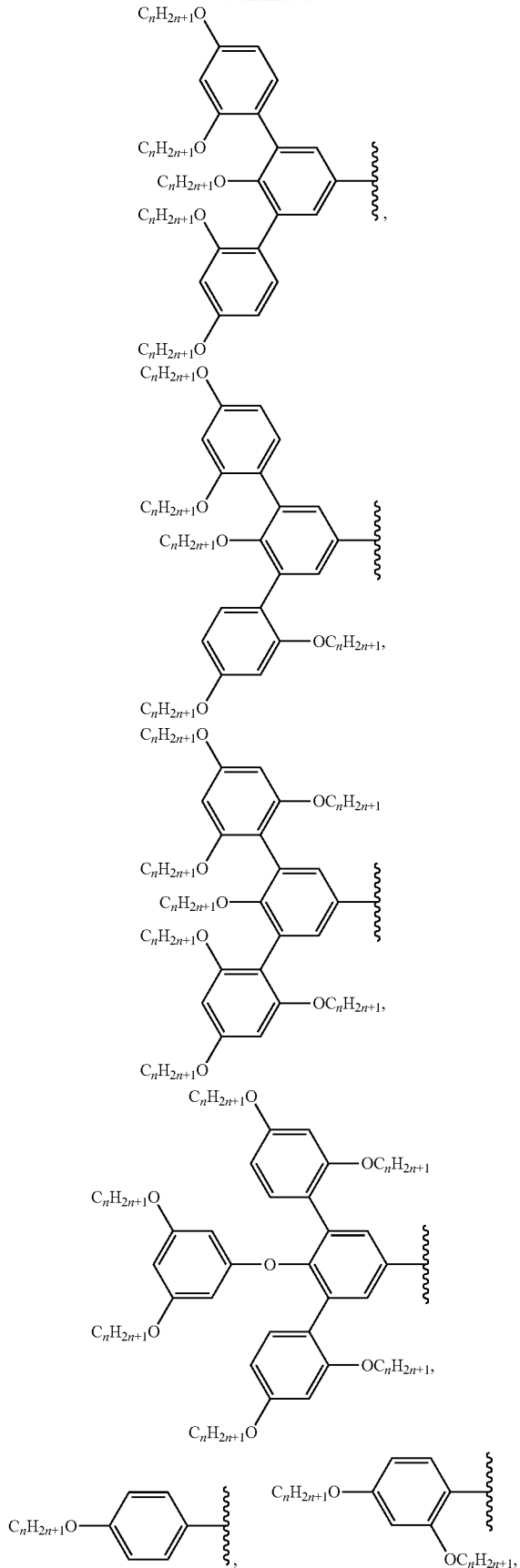

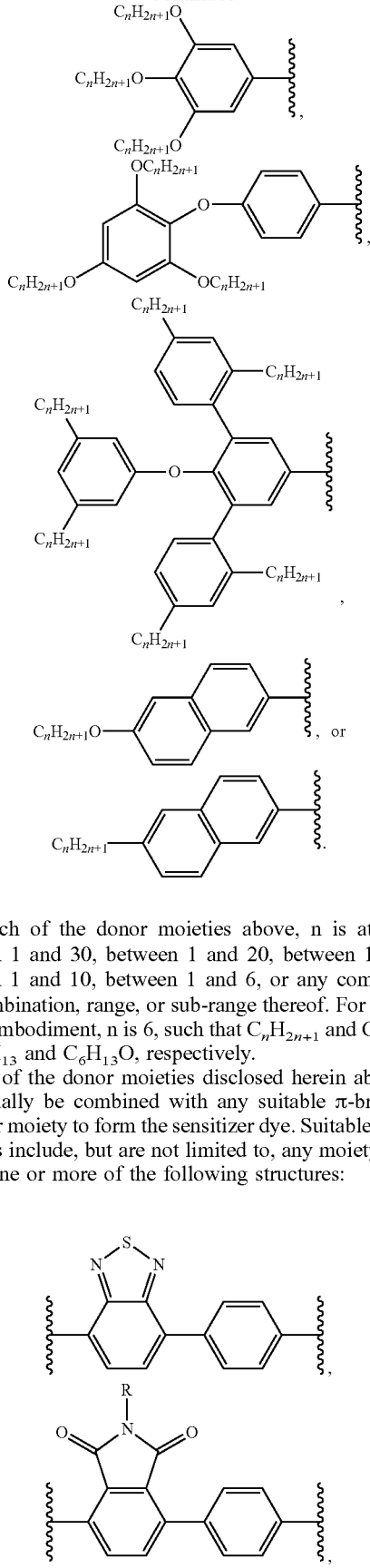

In each of the donor moieties above, n is at least 1, between 1 and 30, between 1 and 20, between 1 and 15, between 1 and 10, between 1 and 6, or any combination, sub-combination, range, or sub-range thereof. For example, in one embodiment, n is 6, such that $C_nH_{2n+1}$ and $C_nH_{2n+1}O$ are $C_6H_{13}$ and $C_6H_{13}O$, respectively.

Each of the donor moieties disclosed herein above may individually be combined with any suitable π-bridge and acceptor moiety to form the sensitizer dye. Suitable π-bridge moieties include, but are not limited to, any moiety according to one or more of the following structures:

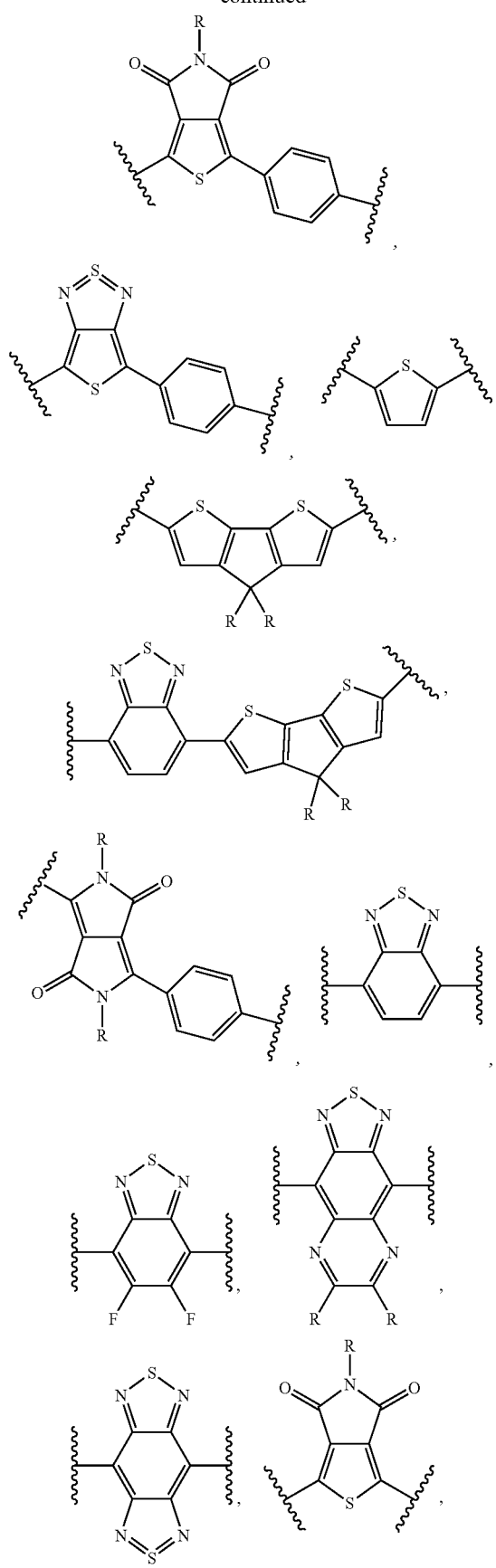

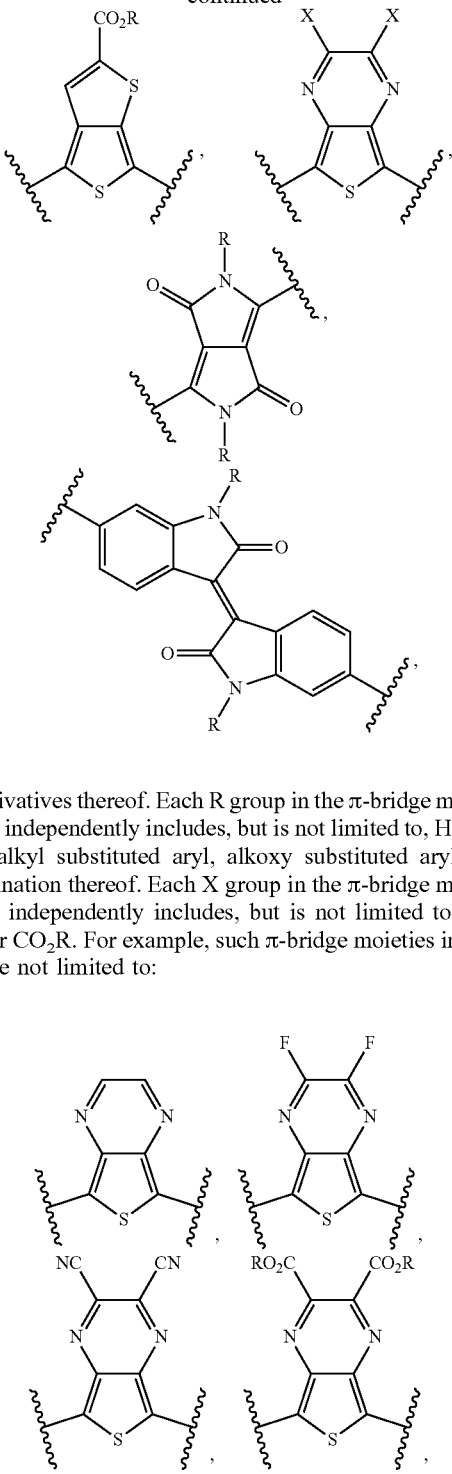

or derivatives thereof. Each R group in the π-bridge moieties above independently includes, but is not limited to, H, alkyl, aryl, alkyl substituted aryl, alkoxy substituted aryl, or a combination thereof. Each X group in the π-bridge moieties above independently includes, but is not limited to, H, F, CN, or $CO_2R$. For example, such π-bridge moieties include, but are not limited to:

or derivative there. Although the examples above focus on symmetric π-bridge moieties, as will be understood by those skilled in the art, the disclosure is not so limited and includes dissymmetric π-bridge moieties as well. Dissymmetric π-bridge moieties may include simple analogues of the above-mentioned symmetric moieties, in terms of synthesis and/or device performance. For example, as each X is chosen independently of the other, one dissymmetric π-bridge moiety may include F at one X and H, CN, or CO₂R at the other X. Similarly, in another example, both X may include CO₂R with different R groups at each X.

In certain embodiments, the π-bridge moieties are selected based upon a desired electron density. While those skilled in the art will readily be able to determine the relative electron density and/or deficiency of the π-bridge moieties through common knowledge and/or routine experimentation, as an example, the following π-bridge moieties are listed in order of increasing electron deficiency:

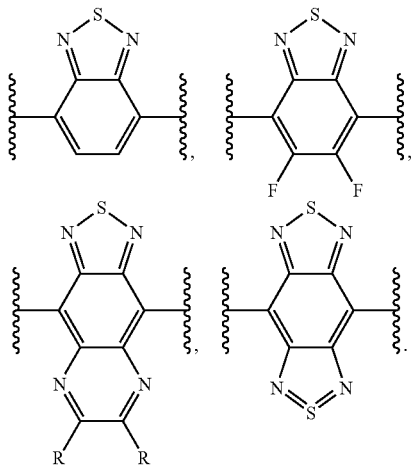

Suitable acceptor moieties include those known to individuals skilled in the art, such as, but not limited to, any moiety according to the following structure:

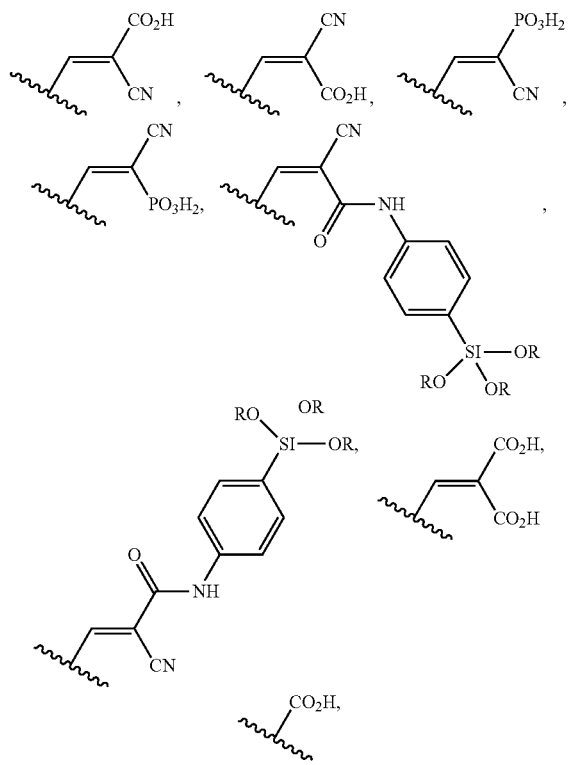

or a derivative thereof. Each R group in the acceptor moieties above independently includes, but is not limited to, H, alkyl, aryl, alkyl substituted aryl, alkoxy substituted aryl, or a combination thereof. For example, in some embodiments, the π-bridge-acceptor moiety with which any of the donor groups disclosed herein may be combined includes, but is not limited to:

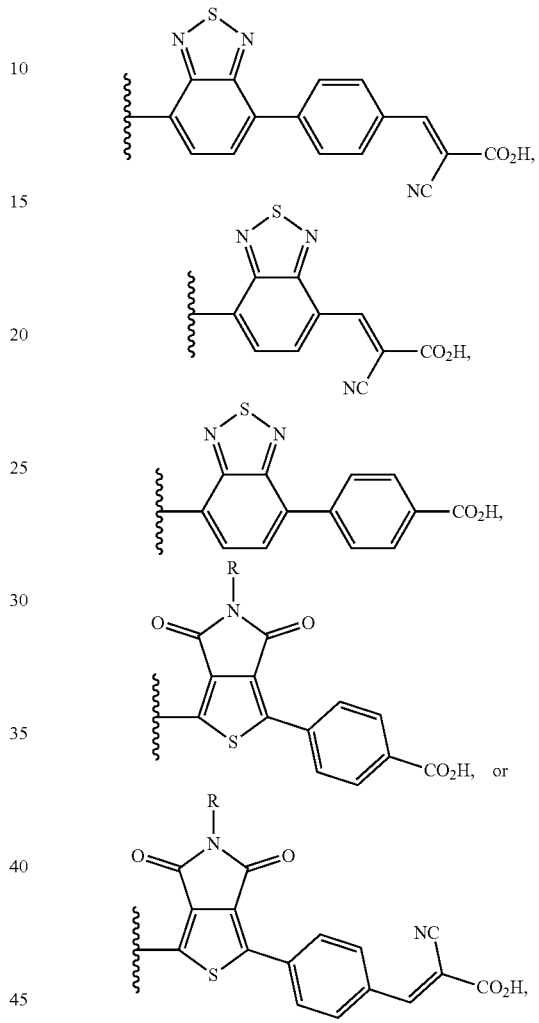

where each R group is as defined above.

When including the donor groups disclosed herein, the resulting sensitizer dyes provide improved photovoltaic properties as compared to existing dyes and/or sensitizers. For example, in some embodiments, the dyes disclosed herein provide increased voltage in DSCs without TiO₂ modification. More specifically, in one embodiment, the dyes provide a voltage of at least 1.0 V, at least 1.1 V, at least 1.2 V, at least 1.3 V, at least 1.4 V, or any combination, sub-combination, range, or sub-range thereof, from a single junction system.

In some embodiments, alkylated donor moieties may be used for course tuning of the dye ground-state oxidation potential. Additionally or alternatively, the use of multiple alkyl chains may decrease counter-productive electron transfer pathways in devices.

Also provided herein, in some embodiments, is a solar cell device including one or more dye-sensitized solar cells (DSCs). In one embodiment, the one or more DSCs are stacked within the solar cell device, forming a sequential series multijunction (SSM)-DSC device. In another embodiment, the SSM-DSC device includes a single illuminated area, where light travels sequentially through each of the DSCs in a stack. In a further embodiment, the voltage output of each DSC in the SSM device is additive, such that the overall photovoltage ($V_{oc}$) of the device is equal to the sum of the individual DSC voltages forming the device.

The SSM-DSC devices disclosed herein include any suitable combination of DSCs. Each DSC independently includes any suitable dye for use in a solar system. In one embodiment, at least one of the DSCs in the system includes one or more of the dyes disclosed herein. In another embodiment, all of the DSCs in the system include one or more of the dyes disclosed herein. Alternatively, at least one of the DSCs in the system may include one or more existing dyes.

In some embodiments, a dye is individually selected for each of the DSCs, such that the dye of any one DSC may be the same or different from the dye of any other DSC in the device. In one embodiment, the dye for each DSC is selected based upon positioning of the DSC within the stack. In another embodiment, DSCs higher in the stack, which light passes through first, may include different dyes from DSCs lower in the stack, which light passes through later in the series (i.e., after passing through at least one other DSC). In certain embodiments, for example, DSCs higher in the stack include an orange dye, such as (E)-3-(5-(4-(bis(2',4'-dibutoxy-[1,1'-biphenyl]-4-yl)amino)phenyl)thiophen-2-yl)-2-cyanoacrylic acid (D35), while DSCs lower in the stack include a red dye, such as 3-{6-{4-[bis(2',4'-dihexyloxybiphenyl-4-yl)amino-]phenyl}-4,4-dihexyl-cyclopenta-[2,1-b:3,4-b']dithiophene-2-yl}-2-cyanoacrylic acid (Y123).

As will be appreciated by those skilled in the art, the disclosure is not limited to the specific dyes or arrangement described above, and may include any other suitable combination and/or arrangement of dyes, such as, but not limited to, dyes having peak absorption spectrums in the range of from 400 to 1200 nm, metal free organic dyes, RR9, or a combination thereof. Furthermore, each of the DSCs in the device may also include any suitable redox shuttle, with the redox shuttle of any one DSC being the same or different from the redox shuttle of any other DSC in the device. Suitable redox shuttles include, but are not limited to, cobalt redox shuttles, such as $[Co(bpy-pz)_2]^{3+12+}$ $[Co(bpy)_3]^{3+/2+}$; $[Co(bpyNO_2)_3]^{3+/2+}$, and/or $[Co(phen)_3]^{3+/2+}$; copper redox shuttles such as $[Cu(dmby)_2]^{2+/1+}$ and/or $[Cu(dmp)_2]^{2+/1+}$; ruthenium redox shuttles such as $[Ru(bpy)_3]^{3+/2+}$; nickel redox shuttles such as $[Ni(bpy(OMe)_2)_3]^{3+/2+}$; manganese redox shuttles such as $[Mn(bpy)_3]^{3+/2+}$; iron redox shuttles, such as $Fe(bpy)_3^{3+/2+}$; common derivatives thereof; or any suitable combination thereof.

Additionally or alternatively, in some embodiments, a composition and/or thickness of any one DSC may be the same or different from the composition and/or thickness of any other DSC in the device. For example, in one embodiment, an active layer of the DSCs higher in the stack, such as a $TiO_2$ active layer, includes a decreased thickness as compared to the active layer of DSCs lower in the stack. Suitable thicknesses for the $TiO_2$ active layer of each DSC in the device include, but are not limited to, between about 0.5 and about 20 µm, between about 0.5 and about 15 µm, between about 0.5 and about 10 µm, between about 0.5 and about 5 µm, between about 0.5 and about 4.5 µm, between about 0.5 and about 4.0 µm, between about 0.5 and about 3.5 µm, between about 0.5 and about 3.0 µm, between about 0.5 and about 2.5 µm, between about 0.5 and about 2.2 µm, or any combination, sub-combination, range, or sub-range thereof. In another embodiment, DSCs lower in the stack include a scattering layer, such as a $TiO_2$ scattering layer, and/or DSCs higher in the stack are devoid of a scattering layer. In a further embodiment, a thickness of the scattering layer is up to about 4.5 µm.

In certain embodiments, one or more of the DSCs include a surface capping layer. The surface capping layer, when present, forms an insulating layer that slows the recombination of electrons in the active layer with the redox shuttles. By slowing the recombination of electrons with the redox shuttles, the surface capping layer increases the $V_{oc}$ of the device. In one embodiment, the surface capping layer includes a fluorinated self-assembled mono layer (FSAM), such as, but not limited to, perfluorooctyltrimethylsilane (PFTS). In another embodiment, inclusion of the surface capping layer is dependent upon the dye selected for that particular DSC. For example, in a further embodiment, DSCs with D35 include a surface capping layer, while DSCs with Y123 are devoid of a surface capping layer. Without wishing to be bound by theory, it is believed that PFTS treatment of DSCs with Y123 resulted in dye desorption from the $TiO_2$ surface, which decreased overall performance of the DSC.

The DSCs disclosed herein may also include antireflective coatings and/or immersion oils on the surfaces outside the DSC devices. The antireflective coating, when included, is positioned and/or applied over the non-conductive side of the photoanode and/or cathode/counter electrode of one or more DSCs in the device. As used herein, the term photoanode refers to the anode portion of each DSC, which is opposite a cathode/counter electrode with respect to a substrate of the DSC, and when in use is positioned on a surface of the substrate that faces toward a light/energy source. In one embodiment, the antireflective coating includes a CYTOP layer formed over the photoanode of at least one DSC in the device. In another embodiment, the antireflective coating includes a block copolymer polystyrene-block-poly(methyl methacrylate) (PS-b-PMMA). In another embodiment, the antireflective coating includes a polymer blend of polystyrene and poly(methyl methacrylate). The immersion oil with a similar refractive index to the substrate of the DSC devices, when included, is positioned between the counter electrode of one DSC and the photoanode of another DSC.

In some embodiments, the use of an antireflective coating and/or an immersion oil changes the interfacial refractive index to minimize light losses. Additionally or alternatively, in some embodiments, the use of an antireflective coating and/or immersion oil provides an increase in overall power conversion efficiency (PCE). For example, in one embodiment, the use of an antireflective coating and an immersion oil in a 3 SSM-DSC system provides an overall PCE of greater than 10% with output of greater than 2 V, which represents a substantial increase as compared to other 3 SSM-DSC systems not including antireflective coatings and/or immersion oils.

By employing the dyes, compositions, thicknesses, redox shuttles, surface capping layers, antireflective coatings, and/or immersion oils disclosed herein, the instant DSCs provide increased photovoltage and/or power conversion efficiency (PCE) as compared to existing DSCs, while maintaining and/or increasing photocurrent and fill factor. For example, in contrast to existing series tandem DSCs, which are limited to a photovoltage of less than 1.9 V from two solar cells, the instant DSCs provided a double junction photovoltage from a single area illuminated device of 1.93 V. Additionally, in contrast to existing series tandem devices, which have been limited to two DSCs due to a lack of light harvesting with additional cells, the DSCs disclosed herein may be selected to divide the usable solar spectrum between cells and permit the inclusion of three or more DSCs in a single stack. For example, the SSM-DSC devices disclosed herein may include 2, 3, 4, 5, 6, 7, 8, 9, 10, or more devices in a single stack. Furthermore, light harvesting of the lower cells in devices with three or more DSCs may be increased through sequential active layer thickness modulation and dye selection.

This increased number of DSCs in a single stack and/or increased light harvesting from lower cells in such stacks further increases the overall photovoltage of the device, providing photovoltages not previously possible with existing devices. For example, in one embodiment, a triple junction (i.e., three solar cell) device provides a photovoltage of at least about 2.8 V with an overall PCE of at least about 7%, which is sufficient to potentially power water oxidation and $CO_2$ reduction without the need of external bias. In another embodiment, a four junction (i.e., four solar cell) device with a D35 sensitized first cell having a $TiO_2$ active layer thickness of about 0.8 µm, followed by a D35 sensitized second cell with a $TiO_2$ active layer thickness of about 2.2 µm, a Y123 sensitized third cell with a $TiO_2$ active layer thickness of about 2.2 µm, and a Y123 sensitized fourth cell with a $TiO_2$ active layer thickness of about 4.5 µm and a $TiO_2$ scattering layer thickness of about 4.5 µm provides a photovoltage of at least about 3.75 V with an overall PCE of at least about 6%. In a further embodiment, a five junction (i.e., five solar cell) device provides a photovoltage of at least about 4.7 V with a PCE of about 4.3%, while maintaining a photocurrent density of about 2.4 mA/cm$^2$.

In some embodiments, two or more SSM-DSC devices may be combined in a side-by-side tandem configuration to further increase the overall photovoltage. In one embodiment, for example, a side-by-side SSM-DSC configuration (i.e., a double illuminated area device) provides a photovoltage of at least about 8.5 V with a PCE of at least about 4%. As will be appreciated by those skilled in the art, the SSM-DSC devices disclosed herein are not limited to the photovoltages and PCE values provided above, as varying the SSM-DSC device configurations will provide different photovoltages. For example, the photovoltages discussed above may be increased by application of efficient red photon harvesting sensitizers (>750 nm), connecting SSM-DSC devices in tandem with inorganic PV's (Silicon, GaAs, etc.), reducing glass related transmission losses (e.g., application of low reflectance glass coatings), incorporation of colorless redox shuttles with theoretical $V_{oc}$ values greater than 1.5 V for a single cell, optimization of materials for differing spectral regions, or combinations thereof. Accordingly, in certain embodiments, the single stacked system provides a photovoltage of up to about 10 V or more, and the two SSM-DSC devices in a side-by-side tandem configuration provides a photovoltage of up to about 20 V or more. Practical conversion efficiencies of at least about 15% are also contemplated by the SSM-DSC devices disclosed herein.

Also provided herein are methods of using the SSM-DSC devices disclosed above. One such method includes powering battery charging with the SSM-DSC devices disclosed herein, such as those batteries typically requiring an external source with 3.7 V to 7.0 V. Another method includes employing the SSM-DSC devices disclosed herein to power solar-to-fuel conversion. For example, in one embodiment, the unassisted (non-potential biased) SSM-DSC devices disclosed herein provide the at least 1.83 V photovoltage required to power the electrolysis of $H_2O$ (i.e., conversion of $H_2O$ to $H_2$ fuel). In contrast to existing devices that do not observe $O_2$ production, both half reactions occur during the electrolysis of water with the SSM-DSC devices disclosed herein. In another embodiment, the unassisted (non-potential biased) SSM-DSC devices disclosed herein provide the at least 3.0 V photovoltage required to power the electrolysis of $CO_2$ (i.e., conversion of $CO_2$ to the gasoline precursor CO). In a further embodiment, in contrast to Perovskite systems, which require the use of a constant flow argon chamber, the instant devices provide $H_2O$ and $CO_2$ reduction when open to air and/or fully submerged in water. Additionally or alternatively, due to increased voltage per area as compared to existing solar cell technology, the SSM-DSC devices disclosed herein may be employed to provide power for a host of applications where surface areas are limited, such as on clothing, automobiles, portable solar cells, etc.

Further provided herein are methods of forming the instant DSCs and SSM-DSC devices. In some embodiments, forming the DSCs includes sealing a photoanode and a counter electrode, then adding an electrolyte to the counter electrode and securing contacts to the DSC. In one embodiment, the photoanode and counter electrode are sealed with a hot melt gasket by heating the system under pressure. For example, in another embodiment, the photoanode and counter electrode are sealed with a 10-60 µm thick hot melt gasket by heating the system at 130° C. under a pressure of 0.2 psi for 1 minute. In a further embodiment, the electrolyte is added through a hole in the counter electrode, which is subsequently sealed once the electrolyte has been added. The contacts are secured to the DSC by any suitable method, such as, but not limited to, soldering.

In some embodiments, the photoanode and/or counter electrode are prepared prior to forming the DSC. In one embodiment, preparing the photoanode includes providing a substrate, pre-treating the substrate, applying an active layer to the substrate, optionally applying a scattering layer to the substrate, and sensitizing the substrate. The substrate includes any suitable material for use in a photoanode, including, but not limited to, glass, plastics, textiles, and/or any other suitable material. In some embodiments, the glass or other substrate is coated with a transparent conducting film (TCF), such as fluorine doped tin oxide (FTO). A suitable sheet resistance for the substrate includes between about 5 and about 25 Ω/sq. sheet, between about 5 and about 20 Ω/sq. sheet, between about 10 and about 15 Ω/sq. sheet, or any suitable combination, sub-combination, range, or sub-range thereof. For example, in one embodiment, FTO coated glass substrates that will ultimately include a scattering layer have a sheet resistance of 10 Ω/sq. sheet, and FTO coated glass substrates that will not include a scattering layer have a sheet resistance of 15 Ω/sq. sheet.

In certain embodiments, pre-treating the substrate includes cleaning the substrate and/or applying an underlayer to the substrate. In one embodiment, cleaning the substrate includes one or more of submerging and sonicating the substrate in an aqueous solution, rinsing the substrate with water, sonicating the substrate in acetone, sonicating the substrate in ethanol, and/or UV/ozone cleaning the substrate. In another embodiment, applying an underlayer to the substrate, such as a $TiO_2$ underlayer, includes submerging the substrate (conductive side up) in a $TiCl_4$ solution in water, followed by heating the submerged substrate. After heating, the substrate is rinsed first with water then with ethanol.

Next, in some embodiments, applying the active layer to the substrate includes screen printing a mesoporous layer of a desired thickness on the substrate. In one embodiment, the mesoporous layer includes a TiO$_2$ layer with a particle size of about 30 nm. In another embodiment, the thickness of the mesoporous layer is at least partially determined by the properties of the screen selected for the screen printing. Additionally or alternatively, the thickness may be adjusted by modifying the consistency of the material prior to applying. Modifying the consistency of the material may include diluting the material prior to applying. For example, the thickness of the applied layer may be reduced by diluting a P30 TiO$_2$ paste with terpineol. Applying the optional scattering layer includes screen printing of a material with an increased particle size as compared to the active layer. Suitable particle sizes for the scattering layer material include, but are not limited to, at least about 100 nm.

After applying the active layer, the substrate is sintered with progressive heating. In one embodiment, sintering the substrate includes progressively heating the substrate from about 125° C. to about 500° C. with various ramp speeds and/or hold lengths between temperatures. Following sintering, the photoanode is soaked in a TiCl$_4$ water solution and heated to about 500° C. Subsequent sensitization of the photoanode includes immersing the active layer film in a dye solution, such as, but not limited to, a D35 or Y123 dye solution.

Preparing the counter electrodes includes forming one or more holes through the insulating side to the conductive side of a substrate material. For example, in one embodiment, preparing the counter electrodes includes drilling two holes through the insulating side to the conductive side of an FTO coated glass substrate. In another embodiment, the FTO coated glass substrate of the counter electrode includes a resistance of 7 Ω/sq. sheet for full subcells and 15 Ω/sq. sheet for all other subcells. In a further embodiment, for platinum electrodes, a thin layer of Pt-paste is slot printed with a punched piece of tape on the conductive side, followed by heading of the electrode at a set temperature for a predetermined amount of time.

These solution processable solar cells provide comparable manufacturing potentials as compared to PSC and OPV solar cells without the decreased voltage of PSC cells or the internal losses and decreased efficiency of OPV cells. Additionally, the DSCs disclosed herein can be formed without strictly controlled atmosphere (e.g., open to air), including conditions that would render OPVs and PSCs inoperable.

As further discussed in the Examples below, the DSCs disclosed herein provide ease of manufacture through solution processes, high performance under low light conditions, and/or variety in terms of devices color and materials on which the solar cells can be built.

The presently-disclosed subject matter is further illustrated by the following specific but non-limiting examples. The following examples may include compilations of data that are representative of data gathered at various times during the course of development and experimentation related to the presently-disclosed subject matter.

EXAMPLES

Example 1

Figure 1A:
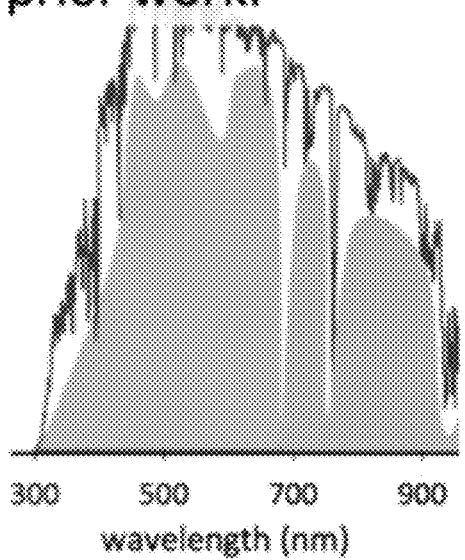
Figure 1B:
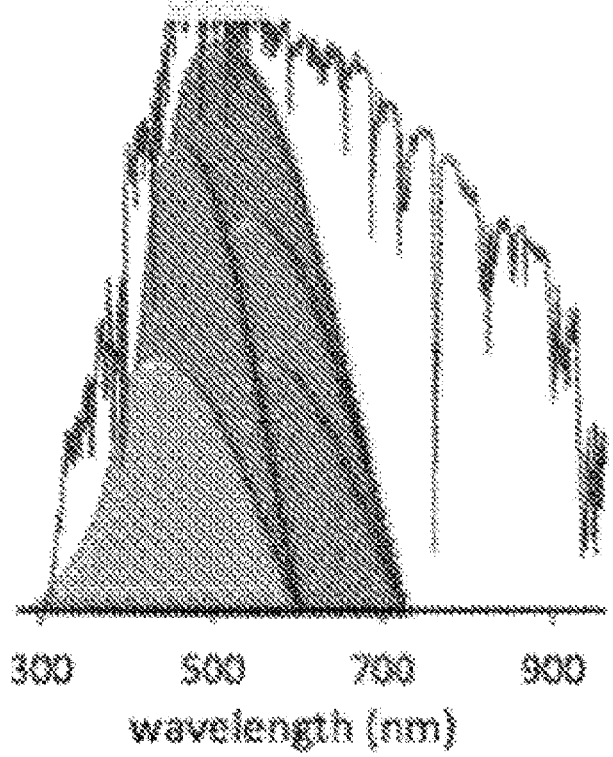
Figure 1C:
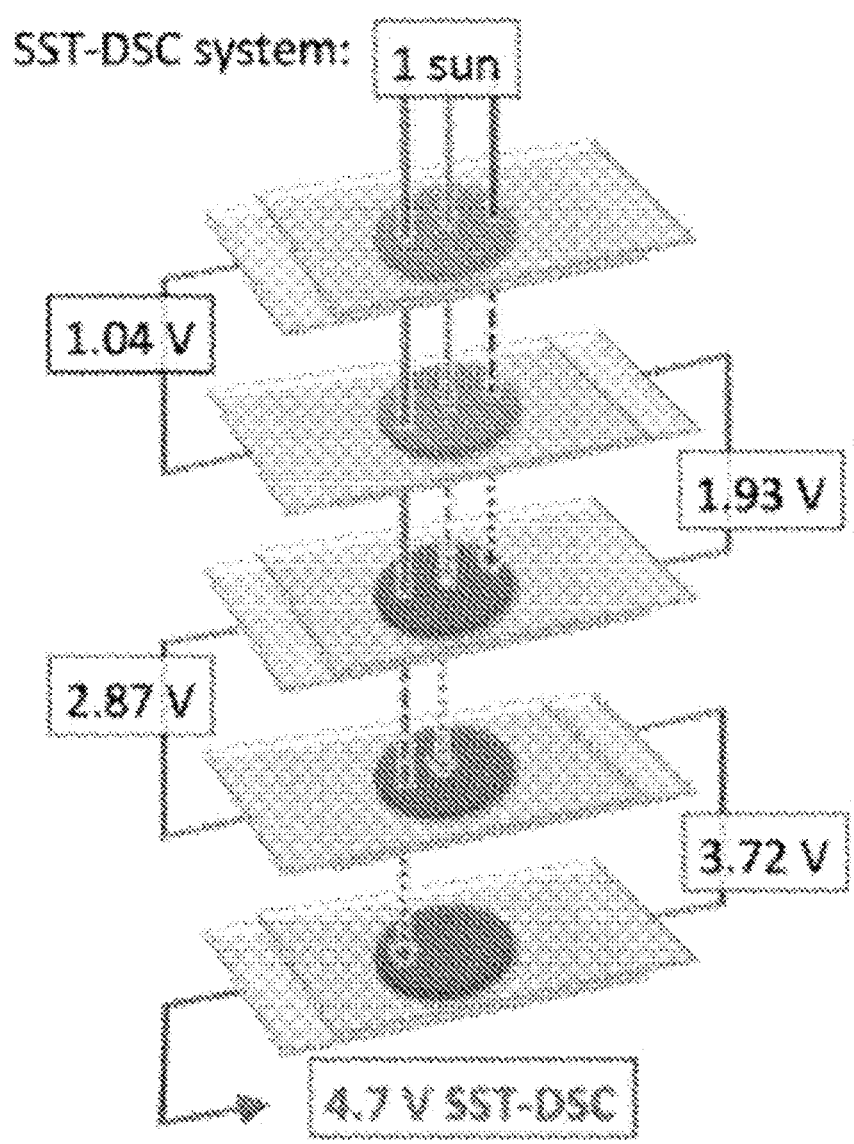
Figure 1D:
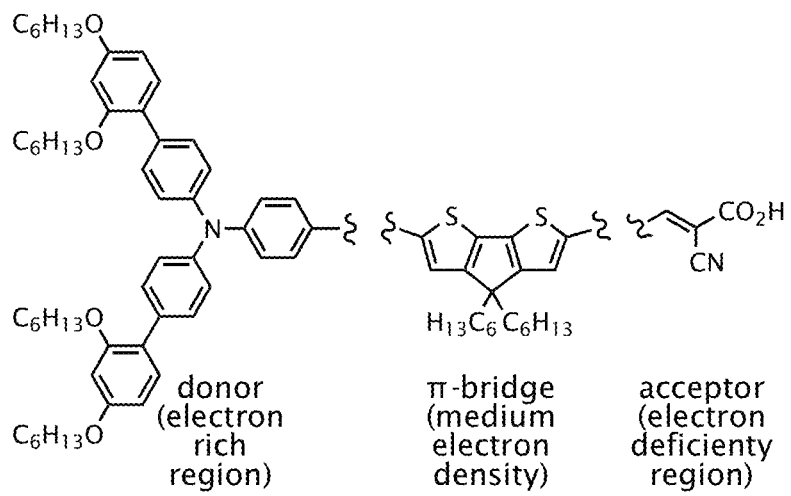
Figure 1G:
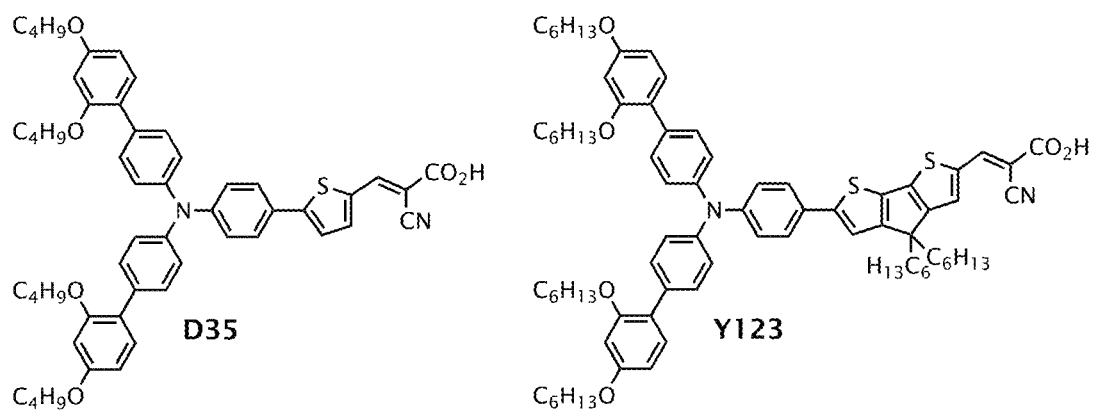
Figure 1G:
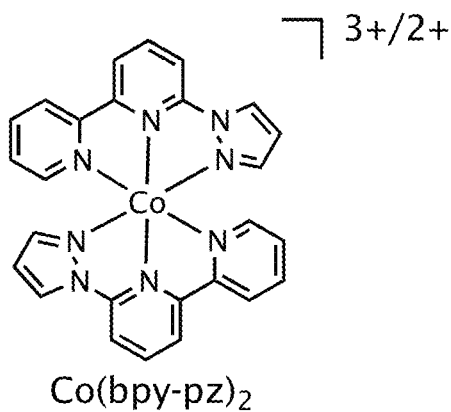
Figure 1H:
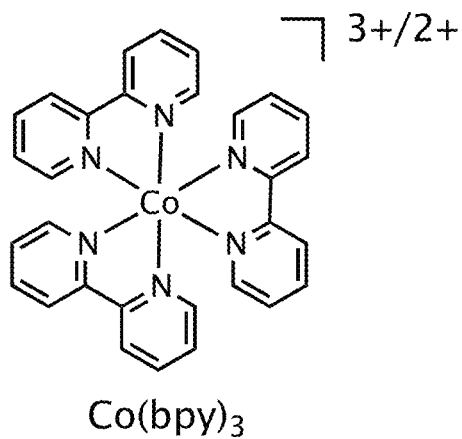

This Example demonstrates a novel strategy in DSC literature, where a single chromophore can be used to increase the voltage of a tandem DSC system through careful photon management based on photoactive electrode preparation methods. Through: (1) judicious control of electrode film thickness, (2) proper dye selection, (3) careful redox shuttle selection, and (4) addition of a film surface protection technique, sequential ST-DSCs or SSM-DSCs (mechanically stacked with a single illuminated area) can reach record high V$_{oc}$ values of 4.7 V from a 5 device system with an overall PCE of 4% (FIGS. 1B-C). Intriguingly, the photovoltage is obtained with only the use of early photons (400-700 nm) and metal-free organic sensitizers D35 and Y123 (FIGS. 1D-F) along with low energy redox shuttles [Co(bpy-pz)$_2$]$^{3+/2+}$ (FIG. 1G) and [Co(bpy)$_3$]$^{3+/2+}$ (FIG. 1H).

Figure 1I:
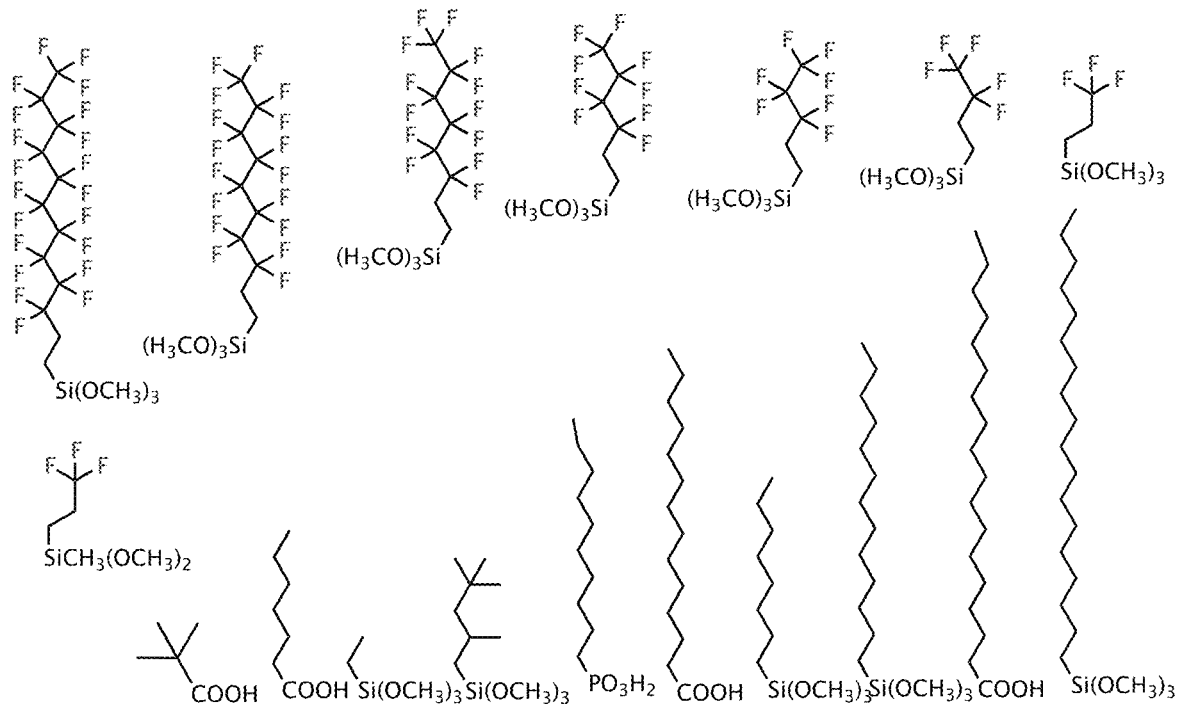

Physically stacked and electrically connected ST-DSCs were finely tuned for each device TiO$_2$ thickness and number of individual devices to achieve high V$_{oc}$ values. Optimization of electrolyte additive (tert-butylpridine, TBP) concentration and surface capping with fluorinated self-assembled mono layer (FSAM), such as perfluorooctyltrimethylsilane (PFTS) (FIG. 1I), for individual devices played a key role in achieving high V$_{oc}$ and PCE mainly for front D35 devices. This was validated by small modulation photovoltage transient measurements showing decreased electron recombinations with the electrolyte.

Methods and Materials

Figure 1J:
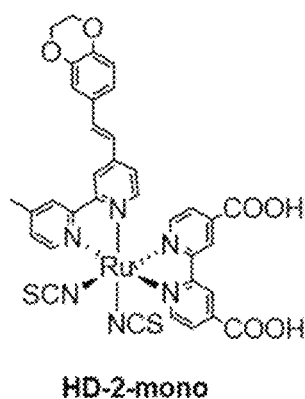
Figure 1K:
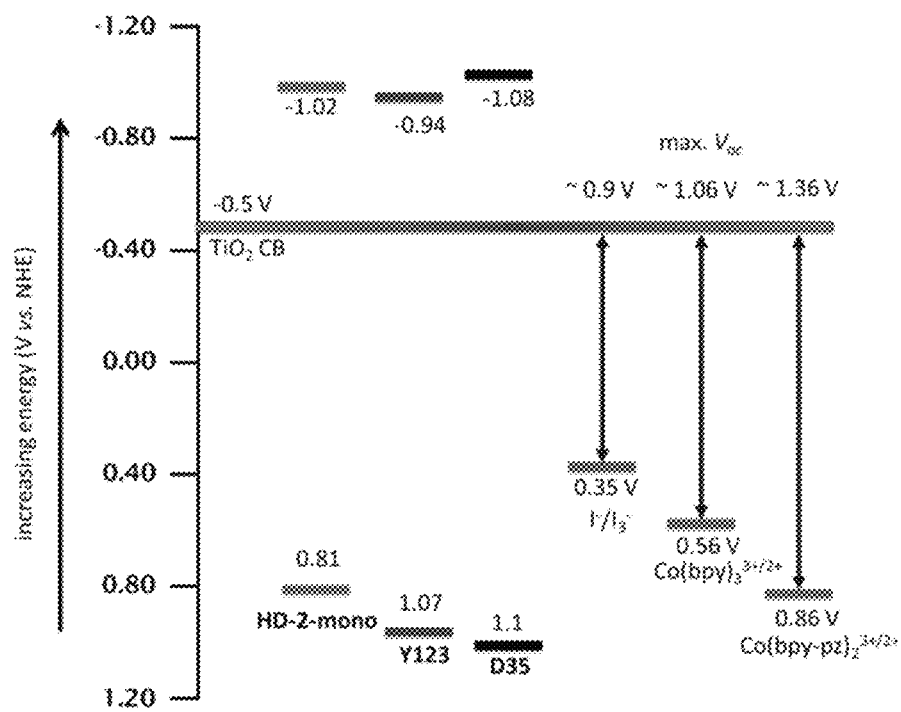

All commercially obtained reagents and extra dry solvents were used as received. D35 and Y123 were purchased from Dyenamo, Sweden. $^1$H NMR spectra were recorded on a Bruker Avance-500 (500 MHz) spectrometer and are reported in ppm using solvent as an internal standard (CDCl$_3$ at 7.26 ppm). Data reported as s=singlet, d=doublet, t=triplet, q=quartet, p=pentet, m=multiplet, br=broad, ap=apparent, dd=doublet of doublets, and coupling constant(s) are in Hz. The optical and electrochemical properties of Y123, D35, and the Ru-sensitizer HD-2-mono (FIG. 1J) are shown in Table 1 and FIG. 1K.

TABLE 1

Optical and electrochemical properties of D35, Y123, and HD-2-mono.

| Dye | λ$_{onset}$ (nm)$^a$ | λ$_{max}$ (nm)$^a$ | ε (M$^{-1}$cm$^{-1}$)$^a$ | E$_{(S+/S)}$ (V vs NHE)$^b$ | E$_{(S+/S*)}$ (V vs NHE)$^c$ | E$_g^{opt}$ (eV)$^d$ |
|---|---|---|---|---|---|---|
| D35 | 570 | 500 | 31000 | 1.10 | −1.08 | 2.18 |
| Y123 | 650 | 540 | 49000 | 1.07 | −0.94 | 2.01 |
| HD-2-mono | 680 | 539 | 13900 | 0.81 | −1.02 | 1.83 |

$^a$D35 was measured in DCM.
$^9$Y123 was also measured in DCM.
$^7$HD-2-mono was measured in DMF.
$^{10}$λ$_{onset}$ was estimated by drawing a tangent line on the low energy side of the lowest energy transition and reporting the value as the intersection of the x-axis.
$^b$D35 and Y123 were measured on TiO$_2$.
$^{11}$HD-2-mono was measured in DMF with glassy carbon working electrode, platinum wire as counter electrode and Ag/AgNO$_3$ as the reference electrode.
Ferrocene was used an internal reference to calibrate the reference electrode. Ferrocene was taken as 0.63 V vs NHE in DMF.
$^c$E$_{(S+/S*)}$ = E$_{(S+/S)}$ − E$_g^{opt}$.
$^d$E$_g^{opt}$ was calculated from the equation E$_g^{opt}$ = 1240 (nm)(eV)/λ$_{onset}$.

Synthesis of Co(bpy-pz)$_2^{+2/+3}$. A modified method of synthesizing a bpy-pz ligand for the Co(bpy-pz)$_2^{+2/+3}$ complexes is illustrated in FIG. 2A and described below. Characterization data matches that of the known compounds.

6-fluoro-2,2'-bipyridine

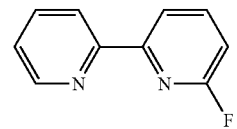 [SMILES: Fc1cccc(-c2ccccn2)n1]

To an oven dried, $N_2$ filled round bottom flask was added 17 ml of a 0.5 M solution of pyridin-2-ylzinc (II) bromide (8.50 mmol) in THF and 2-bromo-6-fluoropyridine (1.0 g, 5.67 mmol). Then $Pd(PPh_3)_4$ (0.131 g, 0.11 mmol) was added as a single portion at room temperature. The reaction mixture was stirred at room temperature overnight. The reaction was monitored by TLC until the starting bromopyridine had been consumed. The crude product was poured into an $EDTA/K_2CO_3$ aqueous solution (~100 mL saturated in both EDTA and $K_2CO_3$) and extracted with $Et_2O$ (~100 mL). The organic layer was separated and dried with $Na_2SO_4$. After concentration, the product was purified by silica gel (125 mL $SiO2$) chromatography with a gradient elution starting with 10% and progressing to 20% ethyl acetate/hexanes to give a white solid (563 mg, 3.23 mmol, 57% yield). $^1$H NMR (300 MHz, $d_6$-DMSO) δ 8.71 (d, J=4.7 Hz, 1H), 8.32 (dd, J=7.4, 2.7 Hz, 1H), 8.26 (d, J=7.9 Hz, 1H), 8.15 (ap q, J=7.7 Hz, 1H), 7.96 (dt, J=7.7, 1.6 Hz, 1H), 7.50 (dd, J=7.2, 4.7 Hz, 1H), 7.21 (dd, J=8.1, 2.8 Hz, 1H). This molecule was previously prepared through an alternate procedure and the characterization data was in agreement.

6-(1H-pyrazol-1-yl)-2,2'-bipyridine

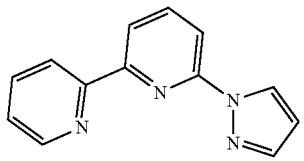 [SMILES: c1ccc(-c2cccc(-n3cccn3)n2)nc1]

To an oven dried, $N_2$ filled round bottom flask was added 1H-pyrazole (479 mg, 7.04 mmol), sodium tert-butoxide (678 mg, 7.06 mmol), and 5 ml of $N_2$-degassed, dry DMSO at room temperature. Note: reaction gives off heat. After stirring for 10 minutes the reaction ceased to give off heated. 6-fluoro-2,2'-bipyridine (1.2 g, 6.89 mmol) was added in one portion. The reaction was heated to 100° C. with stirring and monitored by TLC. After 24 hours, the reaction was cooled to room temperature and the mixture was extracted with $Et_2O$ (~100 mL) and $H_2O$ (~100 mL). The organics were separated and dried with $Na_2SO_4$. The concentrated mixture was then purified by silica gel chromatography first by eluting 100% DCM to remove any excess pyrazole, then 50% MeOH/DCM to give a white solid (1.3 g, 5.99 mmol, 87% yield). $^1$H NMR (300 MHz, $d_6$-DMSO) δ 8.92 (d, J=1.8 Hz, 1H), 8.72 (d, J=3.8 Hz, 1H), 8.58 (dd, J=7.7, 0.8 Hz, 1H) 8.33 (d, J=7.7 Hz, 1H), 8.11 (t, J=7.7 Hz, 1H), 8.05-7.95 (m, 2H), 7.87 (d, J=0.7 Hz, 1H), 7.51 (dd, J=7.7, 4.8 Hz, 1H), 6.64 (ap t, J=1.6 Hz, 1H). This molecule was previously prepared through an alternate procedure and the characterization data was in agreement.

Further complexation and oxidation, along with preparation $Co(bpy-pz)_2^{+2/+3}$ using the bpy-pz ligand is illustrated in FIG. 2B.

Photovoltaic Characterization. Photovoltaic characteristics were measured using a 150 W xenon lamp (Model SF300A, SCIENCETECH Inc. Class AAA) solar simulator equipped with an AM 1.5 G filter for a less than 2% spectral mismatch. Prior to each measurement, the solar simulator output was calibrated with a KG5 filtered mono-crystalline silicon NREL calibrated reference cell from ABET Technologies (Model 15150-KG5). The current density-voltage characteristic of each cell was obtained with Keithley digital source meter (Model 2400). The incident photon-to-current conversion efficiency was measured with an IPCE instrument manufactured by Dyenamo comprised of a 175 W xenon lamp (CERMAX, Model LX175F), monochromator (Spectral Products, Model CM110, Czerny-Turner, dual-grating), filter wheel (Spectral Products, Model AB301T, fitted with filter AB3044 [440 nm high pass] and filter AB3051 [510 nm high pass]), a calibrated UV-enhanced silicon photodiode reference and Dyenamo issued software.

Electron lifetime measurements through small modulation photovoltage transient measurements, were carried out with a Dyenamo Toolbox (DN-AE01) instrument and software. The intensity of the LED light source (Seoul Semiconductors, Natural White, S42182H, 450 nm to 750 nm emission) is varied to modulate the device open-circuit voltage. The base light intensity was modulated by applied voltages of 2.80, 2.85, 2.90, 2.95 and 3.00 V applied to the LED with the 3.0 V bias approaching 1 sun intensity (97%). The direction of illumination was from the photoanode to the counter electrode, and the device was positioned 5 cm from the LED light source. The voltage rise and decay times are fitted with a Levenberg-Marquardt fitting algorithm via LabView, and the electron lifetime was obtained from the averaging of rise and decay times.

Charge extraction at open circuit conditions ($Q_{oc}$) as function of light intensity was carried out with a Dyenamo Toolbox (DN-AE01) instrument and software. Different open-circuit values were achieved by the programmed control of a biased LED (description above) from 2.5 V to 3.2 V. The LED is switched on for 1 second of illumination, then switched off for 10 seconds with a simultaneous switch to short-circuit conditions and monitoring of current. The total charge is found by integrating the current measured over time.

Photoanode preparation: TEC 10 FTO glass (10 Ω/sq. sheet resistance: FTO [fluorine doped tin oxide]) for the final subcell in the SSM-DSC devices with scattering layer and TEC 15 FTO glass (15 Ω/sq. sheet resistance: FTO) for all other subcells was purchased from Hartford Glass. Once cut into 2×2 cm squares the substrate was submerged in a 0.2% Deconex 21 aqueous solution and sonicated for 15 minutes at room temperature. The electrodes were rinsed with water, sonicated in acetone 10 minutes, and sonicated in ethanol for 10 minutes. The electrodes were then placed under UV/ozone for 15 minutes (UV-Ozone Cleaning System, Model ProCleaner by UVFAB Systems). A compact $TiO_2$ underlayer was then applied by pre-treatment of the substrate submerged in a 40 mM $TiCl_4$ solution in water (prepared by careful addition of 99.9% $TiCl_4$ to water at 0-5° C.). The submerged substrates (conductive side up) were heated for 30 minutes at 70° C. After heating, the substrates were rinsed first with water then with ethanol.

A thickness between 1.2 and 4.5 µm mesoporous P30 $TiO_2$ layer (particle size: 30 nm, Dyenamo, DN-GPS-30TS, >99% anatase) was screen printed from a Sefar screen (54/137-64W) resulting in 4.5 µm or Sefar screen (90/230-48W) resulting in 2.2 µm thickness on average for each print. For thickness of 1.2 µm and 0.8 µm, the commercial P30 paste was diluted with terpineol (2:1, paste:terpineol) and (1:1, paste:terpineol), respectively, and printed with Sefar screen (90/230-48W). For thickness of 1.5 µm, P30 paste was diluted with terpineol (2:1, paste:terpineol) and printed with Sefar screen (54/137-64W). Particle sizes were indicated to be typically within ±2 nm of the average and are >99% anatase at the time of paste formulation as indicated by the distributor. A 4.5 µm $TiO_2$ scattering layer (for full device) (particle size: >100 nm, Solaronix R/SP) was screen printed onto electrodes where indicated.

Between each print of $TiO_2$ paste, the substrate was heated for 7 minutes at 125° C. and the thickness was measured with a profilometer (Alpha-Step D-500 KLA Tencor). The substrate was then sintered with progressive heating from 125° C. (5 minute ramp from r.t., 5 minute hold) to 325° C. (15 minute ramp from 125° C., 5 minute hold) to 375° C. (5 minute ramp from 325° C., 5 minute hold) to 450° C. (5 minute ramp from 375° C., 15 minute hold) to 500° C. (5 minute ramp from 450° C., 15 minute hold) using a programmable furnace (Vulcan® 3-Series model 3-550). The cooled, sintered photoanode was soaked 30 minutes at 70° C. in a 40 mM $TiCl_4$ water solution and heated at 40° C. per minute to 500° C. and held at 500° C. for 30 minutes prior to sensitization. The complete working electrode was prepared by immersing the $TiO_2$ film into a D35 dye solution (0.3 mM, 4:1 (EtOH:THF)), with 40× (12 mM) of chenodeoxycholic acid (CDCA), or Y123 dye solution (0.2 mM, 1:1 (ACN:tert-butanol)) with 50× CDCA. The electrodes were immersed in the dye solutions at room temperature for 6 hours.

Counter Electrode Preparation: Two holes were drilled through the insulating side to the conductive side of 2×2 cm squares of TEC 7 FTO glass (7 Ω/sq. sheet resistance) for full subcells, and TEC 15 FTO glass (15 Ω/sq. sheet resistance) for all other subcells, using a Dremel-4000 with a Dremel 7134 Diamond Taper Point Bit submerged in water to reduce glass cracking with Scotch tape on the FTO side to minimize scratching. The tape was removed, and the electrodes were washed with water followed by a 0.1 M HCl in EtOH solution. The electrodes were then sonicated in an acetone bath for 10 minutes and dried at 400° C. for 15 minutes. For platinum electrodes: A thin layer of Pt-paste (Solaronix, Platisol T/SP) was slot printed with a punched Scotch tape piece on the conductive side. The electrodes were then heated at 450° C. for 10 minutes.

PEDOT electrodes: PEDOT electrodes were prepared following the previously reported procedure. Briefly, an aqueous solution of 0.1 M sodium dodecylsulfate (SDS, Biotechnology Grade, VWR) and 0.01 M 3,4-ethylenedioxythiophene (EDOT, 97%, Alfa Aesar) was prepared through sonicating for 90 minutes. Electro-oxidative polymerization was performed in a CHI 6054E potentiostat. In a two electrode cell, a 2×2 cm cleaned, predrilled FTO glass substrate was used as a working electrode and same size cleaned FTO was used as counter and reference electrode. Electro-oxidative polymerization was performed under galvanostatic (chronopotentiometry on the instrument) mode with the following parameters: anodic current valued at 3 mA, high and low potential (E) 3.5-2.5 V, low E hold time 0 seconds, cathodic time of 0.005 seconds, anodic time 70 seconds, with initial polarity anodic, data storage interval as 0.1 seconds and number of segments 2, where current switching priority was based on time. The blue colored films were rinsed thoroughly with deionized water and dried for 2 minutes at 125° C. before use.

Dye-sensitized Solar Cell assembly: The photoanode and counter electrode were sealed with a 25 μm thick hot melt gasket (Surlyn, Solaronix, "Meltonix 1170-25") by heating the system at 130° C. under a pressure of 0.2 psi for 1 minute with a sealing machine (Dyenamo, product DN-HM01). The electrolyte was added through the pre-drilled holes in the counter electrodes with the rubber sealing tip from a Solaronix "Vac'n'Fill Syringe" until the electrolyte began to emerge from the second counter electrode hole. The holes were sealed with a Surlyn sheet and a thin glass cover by heating at 130° C. under pressure (0.1 psi) for 25 seconds both for full and thin devices. Finally, soldered contacts were added with a MBR Ultrasonic soldering machine (model USS-9210) with solder alloy (Cerasolzer wire diameter 1.6 mm, item #CS186-150). A circular black mask (active area 0.15 cm²) punched from black tape was used in the subsequent photovoltaic studies.

Photoanode Surface Treatment. Sensitized $TiO_2$ films were submerged in a 0.1 M solution of 97% 1H,1H,2H,2H-perfluorooctyltrimethoxysilane (PFTS) in hexanes for 90 minutes at 30° C. The electrodes were rinsed with hexanes and assembled as described above.

Preparation of $CO_2$ reduction Electrodes ($Au_2O_3$ and $IrO_2$). Gold oxide ($Au_2O_3$) and Iridium oxide ($IrO_2$) electrodes were prepared according to literature. The ratio of the area of $Au_2O_3$ to $IrO_2$ electrode was (1:4.5). Briefly, for the preparation $Au_2O_3$ electrode, gold foil (99.95% metal basis, 0.1 mm thickness, 25*25 mm, Alfa Aesar, cut into 0.8 cm² (L*W, 0.4 cm*1 cm) was rinsed with diluted aqua regia mixed with deionized water (1:3), which was subsequently oxidized in 0.5 M $H_{2SO4}$ by applying step functions, with a CHI 6054E potentiostat, by applying square pulses between 1.183 and 3.183 V versus Ag/AgCl (KCl sat.) with a large area platinum foil counter electrode at 500 Hz (2 ms period) with 1,800,000 million cycles in a single chamber cell. Note: Extending the number of cycles to 3,600,000 led to lower performance of the $Au_2O_3$ electrode and a powder to be observed to fall off the electrodes during longer cycle times. Images of the electrodes over time has been added for the 1,800,000 cycle case to show the change in electrode color over time which was observed for high performing electrodes (FIG. 3).

The $Au_2O_3$ cathode was further rinsed with water carefully and dipped in 0.5 M $NaHCO_3$ solution for 2-3 minutes before use in the electrochemical cell. Briefly, for the anode preparation, a titanium foil (99.7%, 0.25 mm thick [3 cm*1.5 cm], Sigma Aldrich) was etched for 60 minutes in boiling 1.0 M oxalic acid, then a 0.2 M solution of $H_2IrCl_6$ (CAS #110802-84-1, 99.9% Ir, STREM Chemicals) in isopropanol was drop cast onto the electrode in order to cover the entire surface. The titanium foil was first dried at 70° C. for 10 minutes in air followed by calcination at 500° C. for 10 minutes in the same ovens used for the preparation of $TiO_2$ electrodes for DSCs (Vulcan® 3-Series model 3-550). This process was repeated three times on each side of the titanium foil. The prepared electrodes were further tested with cyclic voltammetry for current-voltage properties with a saturated $CO_2$ in 0.5 M $NaHCO_3$ aqueous solution. The required size 3.6 cm² (3 cm*0.6 cm) was then cut from the prepared $IrO_2$ electrodes for use in the electrochemical cells.

Electrochemical Cell (EC) and Measurements. Electrolysis was performed in a three neck flask with total volume of 61 ml. $Au_2O_3$ (area 0.8 cm²) and $IrO_2$ (area 3.6 cm²) electrodes were completely dipped in 25 ml of a 0.5 M $NaHCO_3$ aqueous solution along with a Ag/AgCl (CH Instruments) reference electrode sealed by septa (Suba Seal, Sigma Aldrich). $CO_2$ was bubbled through the solution for 30 minutes with an exit needle in place before sealing the system. The $CO_2$ saturated system was then activated at −0.65 V vs Ag/AgCl until a steady current was reached (~500 seconds). The CO produced during this period (and the amount of CO/current generated in the first 20 minutes of SSM-DSC powered catalysis) was subtracted from the reported CO values to ensure all catalysis was powered by the SSM-DSC device. CO, $H_2$ and $O2$ were detected by a dual detector (TCD for $H_2/O_2$, FID for $CO/O_2$ with a methanizer) custom Agilent 7890B gas chromatograph instrument (additional details below).

After this the two electrodes, $Au_2O_3$ and $IrO_2$, were connected to a SSM-DSCs device (active area 0.5 cm$^2$) illuminated by a solar simulator (AAA rated for AM 1.5G sunlight) at 100 mWcm$^{-2}$. The continuous current flow through the photovoltaic-electrochemical (PV-EC) cell was monitored by a potentiostat (CHI 6054E) under controlled potential electrolysis (current versus time) conditions with no applied potential. During electrolysis headspace samples (300 μL) were taken at different intervals with a VICI valved syringe. The gas in the syringe was compressed to 250 then with the tip of the syringe submerged in a vial of ether, the valve was open to allow the pressure to equalize to atmospheric pressure. The entire 250 μL sample was then injected onto a custom Agilent 7890B Gas Chromatograph (column, Agilent PorapakQ 6 ft, 1/8 OD) with a dual detector system (TCD and FID), a methanizer before the FID detector, and a backflush system to maintain good spectrum quality in the presence of $CO_2$. Quantitation of CO and methane was made using the FID detector and $H_2$ was quantified on the TCD detector (all calibrated using standards purchased from BuyCalGas.com).

Discussion

DSCs operate by photoexcitation of a dye, which then transfers an electron from the excited-state to $TiO_2$. The electron then traverses an external circuit before being collected at a counter electrode and returning to the oxidized dye. The overall power conversion efficiency (PCE) is calculated through the equation: $PCE=(V_{oc} \times J_{sc} \times FF)I_o$, where $V_{oc}$ is the open circuit voltage, $J_{sc}$ is the short-circuit current density, FF is the fill factor, and $I_o$ is the incident light intensity. The redox shuttle should only be slightly higher in energy than the ground-state energy of the dye for minimal photovoltage loss.

Metal free organic sensitizers chosen for this study (D35 and Y123), are widely studied and well known for high absorptivity, aggregation free electrode sensitization and efficient PCEs in DSCs along with $Co^{3+/2+}$ redox shuttles. D35 offers characteristic orange color with absorption $\lambda_{max}$ at 500 nm and Y123 offer up to 40 nm red shifted light absorption properties (FIG. 4). Furthermore, redox shuttles of $Co(bpy-pz)_2^{3+/2+}$ and $Co(bpy)_3^{3+/2+}$ are capable of a theoretical maximum $V_{oc}$ of 1.36 V and 1.06 V, respectively, depending on the difference between redox potential and the energy level difference of $TiO_2$ with the conduction band energy of $TiO_2$ taken as −0.5 V versus NHE (FIG. 4). However, the highest reported values for $Co(bpy-pz)^{3+/2+}$ are up to 300 mV and for $Co(bpy)^{3+/2+}$ up to 160 mV lower than the theoretically possible for either D35 and Y123. On the other hand, $I^-/I_3^-$ system is only capable of theoretical maximum $V_{oc}$ of 0.9V, and $V_{oc}$ high as 0.882 V was recently reported.

Under the conditions described herein (FIG. 5, Table 2) with previously employed electrolyte concentrations, PCE of up to 5.1% and $V_{oc}$ of 0.950 V was achieved for D35 with $Co(bpy-pz)_2^{3+/2+}$. The $V_{oc}$ and PCE were further improved to 0.998 V and 5.9%, respectively, by increasing the concentration of $Co(bpy-pz)_2^{3+/2+}$ from 0.22 M to 0.25 M and the concentration of tert-butylpyridine (TBP) from 0.2 M to 0.5 M (FIG. 5, Table 2). An insulating capping layer (PFTS: perfluorooctyltrimethylsilane) was then used to slow the recombination of electrons in $TiO_2$ with the redox shuttles, which led to $V_{oc}$ values of up to 1040 mV, with a PCE of 6.8% (Table 2 Entries 2 & 3). This is believed to be the first time a fluorinated self-assembled monolayer (FSAM) treatment such as PFTS has been achieved with a $Co^{3+/2+}$ redox systems. The device was found to improve in PCE through an increase in both $V_{oc}$ and $J_{sc}$. An increase in electron lifetime in $TiO_2$ (FIG. 6) was observed with a PFTS treatment, indicating slower recombination kinetics. However, no shift in the conduction band of $TiO_2$ was observed based on charge-extraction from open-circuit conditions as a function of light intensity, which indicates that the gain in voltage is due to slowing recombination losses (FIG. 6).

Turning to Y123, $V_{oc}$ of up to 0.960 V and PCE of up to 8.1% were obtained, on average, with PEDOT as the counter electrode and without anti-reflecting coating (Table 2, entries 4-6). Unlike D35 devices though, Y123 based-devices were found to show lower performance as a result of apparent dye desorption from the $TiO_2$ surface with PFTS treatment (Table 2). Accordingly, only D35 devices employ a PFTS treatment in the remaining studies.

TABLE 2

D35 and Y123 optimizations with $Co(bpy-pz)_2^{3+/2+}$ electrolyte and FSAM surface treatment.

| Entry | Dye and TiO$_2$ Thickness | Treatment | $V_{oc}$ (mV) | $J_{sc}$ (mA/cm$^2$) | FF | PCE % |
|---|---|---|---|---|---|---|
| $Co(bpy-pz)_2^{3+/2+}$ electrolyte and surface treatment optimization with a scattering layer |||||||
| 1 | D35 full | None[a] | 953 ± 3 | 7.1 ± 0.3 | 74 ± 1 | 5.1 ± 0.3 |
| 2 |  | None | 998 ± 7 | 7.9 ± 0.2 | 72 ± 4 | 5.9 ± 0.4 |
| 3 |  | FSAM | 1037 ± 15 | 8.7 ± 0.4 | 74 ± 2 | 6.8 ± 0.08 |
| 4 | Y123 full | None | 965 ± 0 | 9.7 ± 0.3 | 67 ± 0.2 | 6.6 ± 0.2 |
| 5 |  | None[b] | 959 ± 21 | 11.4 ± 0.3 | 72 ± 2 | 8.1 ± 0.3 |
| 6 |  | FSAM[b] | 946 ± 5 | 9.6 ± 0.3 | 71 ± 0.9 | 6.5 ± 0.3 |
| $Co(bpy-pz)_2^{3+/2+}$ devices with thin TiO$_2$ films, without a scattering layer |||||||
| 7 | D35 0.8 μm | FSAM | 981 ± 7 | 2.8 ± 0.1 | 70 ± 3 | 2 ± 0.2 |
| 8 | D35 1.2 μm | FSAM | 979 ± 17 | 3.7 ± 0.1 | 69 ± 0.5 | 2.5 ± 0.1 |
| 9 | D35 1.5 μm | FSAM | 997 ± 9 | 5.1 ± 0.2 | 69 ± 2 | 3.5 ± 0.1 |
| 10 | D35 2.2 μm | FSAM | 1031 ± 8 | 7.1 ± 0.5 | 68 ± 2 | 5.4 ± 0.4 |
| 11 | Y123 1.2 μm | None | 1010 ± 2 | 5.2 ± 0.1 | 64 ± 1.4 | 3.5 ± 0.2 |
| 12 | Y123 2.2 μm | None | 1010 ± 2 | 7.5 ± 0.05 | 70 ± 1.7 | 5.4 ± 0.08 |

All cells employ an optimized electrolyte having concentrations as: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile unless otherwise noted. Devices employ a Pt counter electrode unless otherwise noted. Device parameters are the average of 3 cells. Active area was fixed at 0.15 cm$^2$ throughout the study, with a black tape mask. Values after cell type refer to TiO$_2$ film thickness.
"full" refers to a 4.5 μm active layer of 30 nm particles and a 4.5 μm scattering layer.
[a]Electrolyte with concentrations as previously reported for Y123, which was comprised of: 0.22M Co(bpy-pz)$_2$(PF$_6$)$_2$, 0.05M Co(bpy-pz)$_2$(PF$_6$)$_3$, 0.1M LiClO$_4$, and 0.2M tert-butylpyridine, in acetonitrile.
[b]PEDOT counter electrode used.

Careful control of device thicknesses for each electrode in the SSM-DSC system is used to balance the photon distribution to each subcell by strategically allowing light to pass through the first electrodes. Judicious photon management strategies for SSM-DSC devices are critical for high performances since subcells wired in series are limited by the lowest current subcell in the SSM-DSC device, and the maximal current is proportional to the number of photons absorbed by a subcell. Accordingly, for application of D35 and Y123, in mechanically stacked series connected tandem devices, TiO$_2$ active layer thickness was minimized without a scattering layer to permit sufficient light to pass through to bottom cells. More specifically, in this Example, the TiO$_2$ film active layer thickness for the front subcells was evaluated between 0.8-2.2 μm without a scattering layer (FIG. 5, Table 2 entries 7-10). The range of TiO$_2$ thickness was controlled by diluting the regular paste with terpineol (paste: terpineol, 1:1 or 2:1) and printing screen for thinner films.

The IV and IPCE of the different thickness devices are shown in FIG. 5 and Table 2. For devices without a scattering layer, $J_{sc}$ values ranging from 2.8-7.1 mA/cm$^2$ and IPCE peak values ranging from 38-75% could be obtained with D35 through film thickness control (FIG. 5). In a similar fashion, the $J_{sc}$ of Y123 based devices could be modulated between 5.2 and 7.5 mA/cm$^2$ by changing the film thickness (FIG. 5, Table 2 entries 11-12). For devices with a scattering layer, a peak IPCE value of 83% at 490 nm was achieved for D35 and a peak IPCE value of 74% at 530 nm was achieved for Y123. Increase in thickness from 0.8-2.2 μm showed linear increase in IPCE response for both D35 and Y123.

With a method for tuning device photocurrents in hand, SSM-DSC devices with 2-5 subcells were constructed by judicious selection of subcell thicknesses (FIGS. 7A-C, Tables 3-4). Ideally, irradiation should be equally distributed among the subcells according to photon flux, segregated based on photon potential energy, and minimal transmitted photons should be allowed through the SSM-DSC system. Thus, the front subcell was varied depending on the total number of subcells in the SSM-DSC to ensure maximal efficiency.

TABLE 3

SSM-DSC results for 2-5 subcell systems with D35, Y123 and HD-2-mono

| Entry | Subcell Type | Thickness (μm) | $V_{oc}$ (mV) | $J_{sc}$ (mA/cm$^2$) | FF | PCE % |
|---|---|---|---|---|---|---|
| 1 | D35/D35 | 1.5/full | 1965 ± 5 | 4.9 ± 0.1 | 0.71 ± 0.01 | 6.9 ± 0.2 |
| 2 | D35/Y123 | 1.5/full | 1918 ± 19 | 5.9 ± 0.2 | 0.62 ± 0.01 | 7.1 ± 0.2 |
| 3 | D35/D35/Y123 | 1.2/2.2/full | 2871 ± 14 | 3.9 ± 0.2 | 0.55 ± 0.04 | 6.4 ± 0.1 |
| 4 | D35/Y123/Y123 | 1.2/2.2/full | 2809 ± 8 | 3.7 ± 0.1 | 0.61 ± 0.01 | 6.4 ± 0.1 |
| 5 | D35/Y123/Y123[a] | 1.2/2.2/full | 2666 ± 5 | 3.6 ± 0.2 | 0.72 ± 0.02 | 7.0 ± 0.02 |
| 6 | D35/Y123/HD-2-mono | 1.2/2.2/full | 2628 ± 17 | 3.9 ± 0.3 | 0.74 ± 0.03 | 7.7 ± 0.1 |
| 7 | D35/D35/Y123/Y123 | 0.8/2.2/2.2/full | 3718 ± 8 | 2.7 ± 0.1 | 0.58 ± 0.03 | 5.8 ± 0.2 |
| 8 | D35/D35/Y123/Y123/Y123 | 0.8/2.2/1.2/2.2/full | 4670 ± 38 | 2.4 ± 0.1 | 0.38 ± 0.05 | 4.3 ± 0.3 |
| 9 | D35/D35/Y123/Y123/HD-2-mono | 0.8/2.2/1.2/2.2/full | 4377 ± 12 | 2.9 ± 0.5 | 0.35 ± 0.02 | 4.4 ± 0.3 |
| 10 | 4 + 4 (Table 5, entry 4) | | 7516 | 1.7 | 0.34 | 4.4 |
| 11 | 4 + 5 (Table 5, entry 4 & 6) | | 8546 | 1.9 | 0.25 | 4.1 |

Front cells are the first dyes listed with the respective thickness of the TiO$_2$ film listed first as well. Subsequent subcells are listed in order from front to back.

"Full" indicates subcells use a 4.5 μm TiO$_2$ active layer and a 4.5 μm TiO$_2$ scattering layer.

Electrolyte used for all cells unless otherwise noted is as follows: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile.

[a]Indicates Co(bpy)$_3^{3+/2+}$ was used in this subcell

TABLE 4

SSM-DSC results for comparison of different front cells thicknesses.

| Entry | Subcell Type | Thickness (μm) | $V_{oc}$ (mV) | $J_{sc}$ (mA/cm$^2$) | FF | PCE % |
|---|---|---|---|---|---|---|
| 1 | D35/Y123 | 1.5/full | 1918 ± 19 | 5.9 ± 0.2 | 0.62 ± 0.01 | 7.1 ± 0.2 |
| 2 | D35/Y123 | 2.2/full | 1930 ± 10 | 7.2 ± 0.2 | 0.51 ± 0.01 | 7.2 ± 0.3 |
| 3 | D35/D35/Y123/Y123 | 0.8/2.2/2.2/full | 3718 ± 8 | 2.7 ± 0.1 | 0.58 ± 0.03 | 5.8 ± 0.2 |
| 4 | D35/D35/Y123/Y123 | 1.2/2.2/2.2/full | 3776 ± 9 | 4.1 ± 0.3 | 0.35 ± 0.02 | 5.4 ± 0.2 |
| 5 | D35/D35/Y123/Y123/Y123 | 0.8/2.2/1.2/2.2/full | 4670 ± 38 | 2.4 ± 0.1 | 0.38 ± 0.05 | 4.3 ± 0.3 |
| 6 | D35/D35/Y123/Y123/Y123 | 1.2/2.2/1.2/2.2/full | 4667 ± 32 | 3.7 ± 0.1 | 0.22 ± 0.03 | 3.8 ± 0.4 |

Front cells are the first dyes listed with the respective thickness of the TiO$_2$ film listed first as well. Subsequent subcells are listed in order from front to back.

"Full" indicates subcells use a 4.5 μm TiO$_2$ active layer and a 4.5 μm TiO$_2$ scattering layer.

Electrolyte used for all cells unless otherwise noted is as follows: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile.

For a two subcell SSM-DSC with D35/D35 (1.5 μm/full), a record high $V_{oc}$ is obtained at 1.97 V with a PCE of 6.9% (FIGS. 7A-B, Table 3 entry 1). A D35/Y123 (1.5 μm/full) SSM-DSC using a broader absorbing second dye led to a $V_{oc}$ of 1.92 V and higher PCE of 7.1% (FIGS. 7A-B, Table 3 entry 2). The substantially improved efficient light harvesting in the tandem cells with D35 at the bottom as compared to Y123 at the bottom is believed to be due to better complement of top and bottom cell light absorption properties. A loss of FF was also observed for the D35/Y123 SSM-DSC when compared to the D35/D35 system (0.71 vs 0.62). This loss is due to a mismatch of current through the two devices. It was further observed that thickness of the front device showed a large effect on FF and $J_{sc}$, whereas overall PCE was comparable (Table 4 entries 1-2).

Adding a third subcell (D35/D35/Y123, 1.2/2.2/full) further increased the device photovoltage to 2.87 V with a PCE of 6.4%. Changing the center subcell to Y123 led to a comparable $V_{oc}$ of 2.81 V with a PCE of 6.4%, however; a significant increase in FF was observed for the D35/Y123/Y123 system at 0.61 (from 0.55) due to a better matching of subcell $J_{sc}$ values. Although the current is generally thought to be limited by the minimum current device in series tandem devices, a current pushing-up (i.e., tandem device current higher than the lowest current device) was noticed. In this configuration, the third cell was found to be current limiting via IV and IPCE measurements and diminishing overall device performances (FIGS. 8A-9B, Table 3 entries 4-6). FIG. 8C compares the IPCE for subcells in an SSM-DSC device with a combined IPCE of three subcells showing a peak IPCE of ~60% near 600 nm. Changing the redox shuttle system from $[Co(bpy-pz)_2]^{2+/3+}$ to $[Co(bpy)_3]^{2+/3+}$ for the third cell alone (Table 3 entry 5) gave a significant increase in current leading to an SSM-DSC with a $V_{oc}$ 2.67 V and 7.0% PCE. To further increase the current at the back cell, a broader absorbing Ru-sensitizer was selected (HD-2-mono) with $I^-/I_3^-$ as the redox shuttle system (FIG. 2). A D35/Y123/HD-2-mono SSM-DSC system gives a high PCE of 7.7% with a $V_{oc}$ of 2.62 V. Both the D35/Y123/Y123 and D35/Y123/HD-2-mono devices gave excellent fill factors (0.72 and 0.74, respectively) owing to very well balanced currents through all three devices as shown by change in IV and IPCE curves (FIGS. 8A-9B).

Although a decrease in $J_{sc}$ is normally considered the limiting factor for stacked DSC devices, based upon the analysis of two to three stacked devices discussed above, SSM-DSC systems with 4 and 5 subcells were constructed to evaluate the effects on photovoltage with increasing subcell number (FIGS. 7A-C, Table 3 Entries 7-9). A 4 subcell SSM-DSC system with D35/D35/Y123/Y123 (0.8/2.2/2.2/full) gave a $V_{oc}$ of 3.72 V with a PCE of 5.8%. The PCE value was similar to the 3 subcell system with these dyes. Two 5 subcell systems were constructed with identical first four subcells with the final cell varying: D35/D35/Y123/Y123/Y123 or HD-2-mono. These devices gave $V_{oc}$ values of 4.67 V and 4.38 V respectively with similar overall PCE values at 4.3 and 4.4%.

The four and five device stacks were also analyzed with different front device thicknesses, where the thickness of each individual device was chosen strategically to allow enough light to pass to next device. Thinner front devices including $TiO_2$ with a thickness of 0.8 μm lead to overall higher PCE and FF. The effect of mismatched currents in different devices is illustrated in FIGS. 7A-C(middle right) by sudden humps. It was observed that instead of following the normal trend of current being limited by the lowest current device in the series tandem, $J_{sc}$ and FF were found to interchange. Referring to Table 3, device parameters generally followed the front device current, however, as noticed from the IV graphs and device parameters, high $J_{sc}$ lead to lower FF and vice versa. To the best of our knowledge, this is a record demonstration of photovoltage in a dye-sensitized solar cell system from a single illuminated area.

To evaluate the equal distribution of photons, incident photon-to-current conversion efficiency (IPCE) (FIGS. 8A-E) and IV measurements (Tables 5-7) were made for each individual cell after being configured in an SSM-DSC system. For a three device system with a $Co(bpy-pz)_2^{3+/2+}$ redox shuttle, it was noted that in one configuration the third device had a $J_{sc}$ of 2.6 mA/cm², which was decreased as compared to the 3.7 mA/cm² $J_{sc}$ of the front two devices (Table 6). However, increased $J_{sc}$ was achieved by replacing the third device with Y123 employing $Co(bpy)_3^{3+/2+}$ and/or HD-2-mono employing an iodine redox shuttle (FIG. 9A, Table 6). With these configurations, $J_{sc}$ for the third device in the stack increased to 3.2 and 3.6 mA/cm² for Y123 with $Co(bpy)^{3+/2+}$ and HD-2-mono, respectively. As the result of better current match in $J_{sc}$ of three devices in the stack, increased FF (61% to 74%) and overall PCE (6.4% to 7.7%) was achieved as well (FIG. 9B).

TABLE 5

Tandem device and its individual subcell photovoltaic characteristics for $Co(bpy-pz)_2^{3+/2+}$ based electrolyte with two and three stacked devices.

| Dye and $TiO_2$ Thickness (μm) | Position | $V_{oc}$ (mV) | $J_{sc}$ (mA/cm²) | FF % | PCE % |
|---|---|---|---|---|---|
| D35/D35 | | | | | |
| D35 1.5 μm | itself | 997 ± 9 | 5.1 ± 0.2 | 69 ± 2 | 3.5 ± 0.1 |
| D35 full | itself | 1037 ± 15 | 8.7 ± 0.4 | 74 ± 2 | 6.8 ± 0.08 |
|  | 2nd | 984 ± 8 | 4.9 ± 0.1 | 73 ± 2 | 4.0 ± 0.2 |
| D35/D35 (1.5/full) | Tandem | 1965 ± 5 | 4.9 ± 0.05 | 71 ± 1 | 6.9 ± 0.2 |
| D35/Y123 | | | | | |
| D35 1.5 μm | itself | 997 ± 9 | 5.1 ± 0.2 | 69 ± 2 | 3.5 ± 0.1 |
| Y123 full | itself | 959 ± 21 | 11.4 ± 0.3 | 72 ± 2 | 8.1 ± 0.3 |
|  | 2nd | 905 ± 13 | 6.2 ± 0.4 | 77 ± 2 | 4.5 ± 0.4 |
| D35/Y123 (1.5/full) | Tandem | 1918 ± 19 | 5.9 ± 0.2 | 62 ± 1 | 7.1 ± 0.2 |
| D35/D35/Y123 | | | | | |
| D35 1.2 μm | itself | 979 ± 17 | 3.7 ± 0.1 | 69 ± 0.5 | 2.5 ± 0.1 |
| D35 2.2 μm | itself | 1031 ± 8 | 7.1 ± 0.5 | 68 ± 2 | 5.4 ± 0.4 |
|  | 2nd | 987 ± 5 | 2.3 ± 0.2 | 71 ± 5 | 1.8 ± 0.03 |

TABLE 5-continued

Tandem device and its individual subcell photovoltaic characteristics for Co(bpy-pz)$_2^{3+/2+}$ based electrolyte with two and three stacked devices.

| Dye and TiO$_2$ Thickness (μm) | Position | V$_{oc}$ (mV) | J$_{sc}$ (mA/cm$^2$) | FF % | PCE % |
|---|---|---|---|---|---|
| Y123 full | itself | 959 ± 21 | 11.4 ± 0.3 | 72 ± 2 | 8.1 ± 0.3 |
|  | 3rd | 876 ± 26 | 3.3 ± 0.1 | 78 ± 1 | 2.4 ± 0.02 |
| D35/D35/Y123 (1.2/2.2/full) | Tandem | 2871 ± 14 | 3.9 ± 0.2 | 55 ± 4 | 6.4 ± 0.1 |

"itself" refers to measurements made on this subcell when taken out of the SSM-DSC configuration and measured directly.
"2$^{nd}$" or "3$^{rd}$" refers to measurements made on this specific subcell only, when in the SSM-DSC configuration. Front cells are the first dyes listed with the respective thickness of the TiO$_2$ film listed first as well. Subsequent subcells are listed in order from front to back.
"Full" indicates subcells use a 4.5 μm TiO$_2$ active layer and a 4.5 μm TiO$_2$ scattering layer. Electrolyte used for all cells unless otherwise noted is as follows: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile.

TABLE 6

Tandem SSM-DSC devices and subcell photovoltaic characteristics for varying electrolyte at the final cell.

| Dye and TiO$_2$ Thickness | Position | V$_{oc}$ (mV) | J$_{sc}$ (mA/cm$^2$) | FF | PCE % |
|---|---|---|---|---|---|
| front two subcells based on D35/Y123 used for the remainder of the table ||||||
| D35 1.2 μm | itself | 979 ± 17 | 3.7 ± 0.1 | 69 ± 0.5 | 2.5 ± 0.1 |
| Y123 2.2 μm | itself | 998 ± 12 | 7.9 ± 0.4 | 71 ± 2 | 5.7 ± 0.3 |
|  | 2nd | 958 ± 8 | 3.7 ± 0.2 | 76 ± 2 | 2.7 ± 0.2 |
| 3$^{rd}$ (and final) subcell based on Y123 employing Co(bpy-pz)$_2^{3+/2+}$ ||||||
| Y123 full | itself | 959 ± 21 | 11.4 ± 0.3 | 72 ± 2 | 8.1 ± 0.3 |
|  | 3rd | 883 ± 15 | 2.6 ± 0.05 | 78 ± 1 | 1.9 ± 0.05 |
| D35/Y123/Y123 | Tandem | 2809 ± 8 | 3.7 ± 0.1 | 61 ± 1 | 6.4 ± 0.1 |
| 3$^{rd}$ (and final) subcell based on Y123 employing Co(bpy)$_3^{3+/2+}$ ||||||
| Y123 full | itself | 811 ± 18 | 12.3 ± 0.5 | 73 ± 2 | 7.6 ± 0.2 |
|  | 3rd | 732 ± 20 | 3.2 ± 0.1 | 78 ± 0.6 | 2.0 ± 0.1 |
| D35/Y123/Y123 | Tandem | 2666 ± 5 | 3.6 ± 0.2 | 72 ± 2 | 7.0 ± 0.02 |
| 3$^{rd}$ (and final) subcell based on HD-2-mono employing (I$^-$/I$_3^-$) ||||||
| HD-2-mono full | itself | 719 ± 8 | 16.6 ± 0.1 | 0.73 ± 0.01 | 8.8 ± 0.1 |
|  | 3rd | 688 ± 20 | 3.6 ± 0.05 | 78 ± 1 | 1.84 ± 0.1 |
| D35/Y123/HD-2-mono | Tandem | 2628 ± 17 | 3.9 ± 0.3 | 74 ± 3 | 7.7 ± 0.1 |

"itself" refers to measurements made on this subcell when taken out of the SSM-DSC configuration and measured directly.
"2$^{nd}$" or "3$^{rd}$" refers to measurements made on this specific subcell only, when in the SSM-DSC configuration. Front cells are the first dyes listed with the respective thickness of the TiO$_2$ film listed first as well. Subsequent subcells are listed in order from front to back.
"Full" indicates subcells use a 4.5 μm TiO$_2$ active layer and a 4.5 μm TiO$_2$ scattering layer. Electrolyte used for all cells unless otherwise noted is as follows: for Co(bpy-pz)$_2^{3+/2+}$: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile; for Co(bpy)$_3^{3+/2+}$: 0.25M Co(bpy-pz)$_2$(PF$_6$)$_2$, 0.05M Co(bpy-pz)$_2$(PF$_6$)$_3$, 0.1M LiTFSI, and 0.5M tert-butylpyridine, in acetonitrile; for I$^-$/I$_3^-$: electrode thickness was 10.0 μm 30 nm TiO$_2$ particles and 4.5 μm scattering layer. Iodine electrolyte was used: 1.0M DMII (1,3-dimethylimidazolium iodide), 0.05M LiI, 30 mM I$_2$, 0.5M TBP (4-tert-butylpyridine), 0.1M GNCS (guanadinium thiocyanate) in acetonitrile and valeronitrile (v/v, 85/15).

TABLE 7

Tandem device and its individual subcell photovoltaic characteristics for Co(bpy-pz)$_2^{3+/2+}$ based electrolyte with 4 and 5 stacked devices. See Table 6 for device parameters.

| Dye and TiO$_2$ Thickness | Position | V$_{oc}$ (mV) | J$_{sc}$ (mA/cm$^2$) | FF | PCE % |
|---|---|---|---|---|---|
| D35 (0.8 μm)/D35/Y123/Y123 ||||||
| D35 0.8 μm | front | 981 ± 7 | 2.8 ± 0.1 | 70 ± 3 | 2 ± 0.2 |
| D35 2.2 μm | itself | 1031 ± 8 | 7.1 ± 0.5 | 68 ± 2 | 5.4 ± 0.4 |
|  | 2nd | 970 ± 22 | 2.5 ± 0.3 | 71 ± 02 | 1.8 ± 0.1 |
| Y123 1.2 μm | itself | 998 ± 12 | 7.9 ± 0.4 | 71 ± 2 | 5.7 ± 0.3 |
|  | 3rd | 930 ± 24 | 2.1 ± 0.3 | 77 ± 1 | 1.6 ± 0.3 |
| Y123 full | itself | 959 ± 21 | 11.4 ± 0.3 | 72 ± 2 | 8.1 ± 0.3 |
|  | 4th | 887 ± 14 | 1.9 ± 0.1 | 78 ± 3 | 1.4 ± 0.05 |
| D35/D35/Y123/Y123 | Tandem | 3718 ± 8 | 2.6 ± 0.1 | 58 ± 3 | 5.8 ± 0.2 |

TABLE 7-continued

Tandem device and its individual subcell photovoltaic characteristics for Co(bpy-pz)$_2^{3+/2+}$ based electrolyte with 4 and 5 stacked devices. See Table 6 for device parameters.

| Dye and TiO$_2$ Thickness | Position | V$_{oc}$ (mV) | J$_{sc}$ (mA/cm$^2$) | FF | PCE % |
|---|---|---|---|---|---|
| D35 (1.2 μm)/D35/Y123/Y123 | | | | | |
| D35 1.2 μm | front | 979 ± 17 | 3.7 ± 0.1 | 69 ± 0.5 | 2.5 ± 0.1 |
| D35 2.2 μm | itself | 1031 ± 8 | 7.1 ± 0.5 | 68 ± 2 | 5.4 ± 0.4 |
|  | 2nd | 987 ± 5 | 2.3 ± 0.2 | 71 ± 5 | 1.8 ± 0.03 |
| Y123 1.2 μm | itself | 998 ± 12 | 7.9 ± 0.4 | 71 ± 2 | 5.7 ± 0.3 |
|  | 3rd | 937 ± 5 | 1.7 ± 0.1 | 78 ± 1 | 1.3 ± 0.1 |
| Y123 full | itself | 959 ± 21 | 11.4 ± 0.3 | 72 ± 2 | 8.1 ± 0.3 |
|  | 4th | 867 ± 5 | 1.6 ± 0.05 | 79 ± 2 | 1.2 ± 0.02 |
| D35/D35/Y123/Y123 | Tandem | 3776 ± 10 | 3.9 ± 0.3 | 35 ± 2 | 5.4 ± 0.2 |
| D35 (0.8 μm)/D35/Y123/Y123/Y123 | | | | | |
| D35 1.2 μm | front | 981 ± 7 | 2.8 ± 0.1 | 70 ± 3 | 2 ± 0.2 |
| D35 2.2 μm | itself | 1031 ± 8 | 7.1 ± 0.5 | 68 ± 2 | 5.4 ± 0.4 |
|  | 2nd | 970 ± 22 | 2.5 ± 0.3 | 71 ± 02 | 1.8 ± 0.1 |
| Y123 1.2 μm | itself | 1003 ± 7 | 6.3 ± 0.3 | 71 ± 4 | 4.6 ± 0.4 |
|  | 3rd | 941 ± 35 | 1.3 ± 0.3 | 75 ± 5 | 0.94 ± 0.1 |
| Y123 2.2 μm | itself | 998 ± 12 | 7.9 ± 0.4 | 71 ± 2 | 5.7 ± 0.3 |
|  | 4th | 925 ± 18 | 1.1 ± 0.2 | 74 ± 2 | 0.75 ± 0.2 |
| Y123 full | itself | 959 ± 21 | 11.4 ± 0.3 | 72 ± 2 | 8.1 ± 0.3 |
|  | 5th | 853 ± 10 | 1.0 ± 0.05 | 78 ± 2 | 0.77 ± 0.05 |
| D35/D35/Y123/Y123/Y123 | Tandem | 4670 ± 38 | 2.4 ± 0.1 | 38 ± 5 | 4.3 ± 0.3 |
| D35 (1.2 μm)/D35/Y123/Y123/Y123 | | | | | |
| D35 1.2 μm | front | 979 ± 17 | 3.7 ± 0.1 | 69 ± 0.5 | 2.5 ± 0.1 |
| D35 2.2 μm | itself | 1031 ± 8 | 7.1 ± 0.5 | 68 ± 2 | 5.4 ± 0.4 |
|  | 2nd | 987 ± 5 | 2.3 ± 0.2 | 71 ± 5 | 1.8 ± 0.03 |
| Y123 1.2 μm | itself | 1003 ± 7 | 6.3 ± 0.3 | 71 ± 4 | 4.6 ± 0.4 |
|  | 3rd | 927 ± 25 | 1.0 ± 0.1 | 79 ± 0.4 | 0.8 ± 0.1 |
| Y123 2.2 μm | itself | 998 ± 12 | 7.9 ± 0.4 | 71 ± 2 | 5.7 ± 0.3 |
|  | 4th | 914 ± 3 | 0.9 ± 0.08 | 73 ± 2 | 0.6 ± 0.02 |
| Y123 full | itself | 959 ± 21 | 11.4 ± 0.3 | 72 ± 2 | 8.1 ± 0.3 |
|  | 5th | 852 ± 10 | 0.9 ± 0.2 | 79 ± 2 | 0.7 ± 0.1 |
| D35/D35/Y123/Y123/Y123 | Tandem | 4660 ± 32 | 3.7 ± 0.1 | 22 ± 3 | 3.8 ± 0.4 |

Additionally, two SSM-DSC systems were connected in series with two side-by-side illuminated areas to further test the limits of this approach. Two sets of 4 subcell SSM-DSC systems wired in series and illuminating them side by side gave an overall V$_{oc}$ of 7.52 V with a 4.4% PCE (FIG. 7C, Table 3 entry 10). In a similar experiment, combining 4 and 5 subcell SSM-DSC systems led to an 8.55 V V$_{oc}$ and a 4.1% PCE (FIG. 7C, Table 3 entry 11). Without wishing to be bound by theory, it is believed that this represents the highest voltages obtained with a DSC device with a double illuminated area.

IV and IPCE for D35, Y123, and HD-2-mono were also measured with Co(bpy)$_3^{3+23+}$ electrolyte (FIG. 10, Table 8). As demonstrated in Table 8, FSAM treatment with Co(bpy)$_3^{3+/2+}$ and D35 increased V$_{oc}$ by up to 70 mV, similar to previously studied Ru (II) dye and I$^-$/I$_3^-$ which improved V$_{oc}$ by up to 70 mV with similar TiO$_2$ films. The results from Co(bpy)$_3^{2+/3+}$ based SSM-DSC devices are shown in FIG. 11 and Tables 9-10. Comparatively, Co(bpy-pz)$_2^{3+/2+}$ based D35/D35 devices resulted in higher V$_{oc}$ (1.965 V) compared to (1.861 V) of Co(bpy)$_3^{3+/2+}$ due to inherently more positive redox potential of former, with comparable overall PCE.

TABLE 8

D35, Y123 and HD-2-mono optimization with Co(bpy)$_3^{3+/2+}$ electrolyte and FSAM surface treatment.

| Entry | Dye and TiO$_2$ Thickness | Treatment | V$_{oc}$ (mV) | J$_{sc}$ (mA/cm$^2$) | FF | PCE % |
|---|---|---|---|---|---|---|
| Co(bpy)$_3^{3+/2+}$ electrolyte and surface treatment optimization with scattering layer | | | | | | |
| 1 | D35[a,b] | None | 854 ± 6 | 10.3 ± 0.3 | 73 ± 1.8 | 6.6 ± 0.1 |
| 2 | D35[b] | None | 854 ± 14 | 10.7 ± 0.5 | 74 ± 1 | 6.9 ± 0.2 |
| 3 |  | FSAM | 921 ± 15 | 10.2 ± 0.6 | 73 ± 4 | 7 ± 0.4 |
| 4 | Y123[b] | none | 842 ± 23 | 12.3 ± 1.3 | 72 ± 1 | 7.7 ± 0.4 |
| 5 | HD-2-mono[c,d] | none | 719 ± 8 | 16.6 ± 0.1 | 73 ± 0.01 | 8.8 ± 0.1 |

TABLE 8-continued

D35, Y123 and HD-2-mono optimization with Co(bpy)$_3^{3+/2+}$ electrolyte and FSAM surface treatment.

| Entry | Dye and TiO$_2$ Thickness | Treatment | V$_{oc}$ (mV) | J$_{sc}$ (mA/cm$^2$) | FF | PCE % |
|---|---|---|---|---|---|---|
| | Co(bpy)$_3^{3+/2+}$ devices with different thickness and without scattering layer | | | | | |
| 6 | D35 1.2 μm | FSAM | 993 ± 23 | 3.2 ± 0.15 | 73 ± 1.4 | 2.4 ± 0.08 |
| 7 | D35 2.2 μm | FSAM | 974 ± 14 | 6.1 ± 0.4 | 67 ± 3 | 4.1 ± 0.2 |
| 8 | Y123 1.2 μm | None | 973 ± 28 | 5.5 ± 0.3 | 66 ± 8 | 3.6 ± 0.3 |
| 9 | Y123 2.2 μm | None | 898 ± 25 | 7.4 ± 0.96 | 70 ± 4 | 5 ± 0.5 |

All cells employ the optimized electrolyte having concentrations as: 0.25M Co(bpy)$_3$(PF$_6$)$_2$, 0.05M Co(bpy)$_3$(PF$_6$)$_3$, 0.1M LiTFSI, and 0.5M tert-butylpyridine in acetonitrile unless otherwise noted.
[a] Electrolyte with concentrations as: 0.25M Co(bpy)$_3$(PF$_6$)$_2$, 0.05M Co(bpy)$_3$(PF$_6$)$_3$, 0.1M LiTFSI, and 0.25M tert-butylpyridine in acetonitrile.
[b] Electrode thickness was 4.5 μm 30 nm TiO$_2$ particles and 4.5 μm scattering layer.
[c] Electrode thickness was 10.0 μm 30 nm TiO$_2$ particles and 4.5 μm scattering layer.
[d] Iodine electrolyte was used: 1.0M DMII (1,3-dimethylimidazolium iodide), 0.05M LiI, 30 mM I$_2$, 0.5M TBP (4-tert-butylpyridine), 0.1M GNCS (guanadinium thiocyanate) in acetonitrile and valeronitrile (v/v, 85/15).

TABLE 9

Summary of Co(bpy)$_3^{3+/2+}$ based SSM-DSCs.

| Entry | Dye | Thickness (μm) | V$_{oc}$ (mV) | J$_{sc}$ (mA/cm$^2$) | FF % | PCE % |
|---|---|---|---|---|---|---|
| 1 | D35/D35 | 1.5/full | 1824 ± 5 | 5.1 ± 0.1 | 71 ± 1 | 6.5 ± 0.1 |
| 2 | D35/Y123 | 2.2/full | 1832 ± 12 | 5.6 ± 0.2 | 75 ± 3 | 7.6 ± 0.01 |
| 3 | D35/D35/Y123 | 1.2/3/full | 2666 ± 30 | 3.9 ± 0.1 | 52 ± 1 | 5.3 ± 0.1 |
| 4 | D35/Y123/Y123 | 2.2/2.2/full | 2584 ± 30 | 3.4 ± 0.3 | 75 ± 5 | 6.7 ± 0.2 |
| 5 | D35/D35/Y123/Y123 | 1.2/2.2/2.2/full | 3557 ± 54 | 2.2 ± 0.2 | 64 ± 8 | 5.1 ± 0.6 |
| 6 | D35/D35/Y123/Y123/Y123 | 1.2/2.2/1.2/2.2/full | 4382 ± 54 | 2.1 ± 0.3 | 50 ± 9 | 4.7 ± 0.3 |

Front cells are the first dyes listed with the respective thickness of the TiO$_2$ film listed first as well. Subsequent subcells are listed in order from front to back.
"Full" indicates subcells use a 4.5 μm TiO$_2$ active layer and a 4.5 μm TiO$_2$ scattering layer.
Electrolyte used for all cells unless otherwise noted is as follows: 0.25M Co(bpy)$_3$(PF$_6$)$_2$, 0.05M Co(bpy)$_3$(PF$_6$)$_3$, 0.1M LiTFSI, and 0.5M tert-butylpyridine, in acetonitrile.

TABLE 10

Tandem device and its individual subcell photovoltaic characteristics for Co(bpy)$_3^{3+/2+}$ based electrolyte with 2 to 5 subcell SSM-DSC devices.

| Dye and TiO$_2$ Thickness | Position | V$_{oc}$ (mV) | J$_{sc}$ (mA/cm$^2$) | FF % | PCE % |
|---|---|---|---|---|---|
| D35/D35 | | | | | |
| D35 1.5 μm | itself | 937 ± 3 | 5.2 ± 0.2 | 66 ± 2 | 3.3 ± 0.1 |
| D35 full | itself | 921 ± 15 | 10.2 ± 0.6 | 73 ± 4 | 7 ± 0.4 |
| | 2nd | 892 ± 7 | 5.0 ± 0.2 | 76 ± 1 | 3.6 ± 0.2 |
| D35/D35 | Tandem | 1824 ± 5 | 5.1 ± 0.1 | 71 ± 1.1 | 6.5 ± 0.1 |
| D35/Y123 | | | | | |
| D35 2.2 μm | itself | 974 ± 14 | 6.1 ± 0.4 | 67 ± 3 | 4.1 ± 0.2 |
| Y123 full | itself | 842 ± 23 | 12.3 ± 1.3 | 72 ± 1 | 7.7 ± 0.4 |
| | 2nd | 835 ± 33 | 5.6 ± 0.05 | 76 ± 2 | 3.5 ± 0.1 |
| D35/Y123 | Tandem | 1832 ± 12 | 5.6 ± 0.2 | 75 ± 3 | 7.6 ± 0.01 |
| D35/D35/Y123 | | | | | |
| D35 1.2 μm | itself | 987 ± 11 | 3.9 ± 0.1 | 69 ± 1 | 2.9 ± 0.03 |
| D35 3 μm | itself | 948 ± 2 | 7 ± 0.4 | 73 ± 1 | 4.9 ± 0.2 |
| | 2nd | 930 ± 9 | 2.4 ± 0.3 | 71 ± 5 | 1.7 ± 0.1 |
| Y123 full | itself | 837 ± 23 | 11.9 ± 0.7 | 73 ± 2 | 7.6 ± 0.1 |
| | 3rd | 732 ± 2 | 3.9 ± 0.1 | 76 ± 0.5 | 2.4 ± 0.02 |
| D35/D35/Y123 | Tandem | 2666 ± 30 | 3.9 ± 0.1 | 52 ± 1 | 5.3 ± 0.1 |
| D35/Y123/Y123 | | | | | |
| D35 2.2 μm | itself | 974 ± 14 | 6.1 ± 0.4 | 67 ± 3 | 4.1 ± 0.2 |
| Y123 2.2 μm | itself | 898 ± 25 | 7.4 ± 0.96 | 70 ± 4 | 5 ± 0.5 |
| | 2nd | 875 ± 5 | 3.1 ± 0.4 | 77 ± 4 | 2.2 ± 0.2 |
| Y123 full | itself | 842 ± 23 | 12.3 ± 1.3 | 72 ± 1 | 7.7 ± 0.4 |
| | 3rd | 732 ± 20 | 3.4 ± 0.1 | 78 ± 0.6 | 2.1 ± 0.1 |
| D35/Y123/Y123 | Tandem | 2584 ± 30 | 3.4 ± 0.3 | 75 ± 5 | 6.7 ± 0.2 |

TABLE 10-continued

Tandem device and its individual subcell photovoltaic characteristics for Co(bpy)$_3^{3+/2+}$ based electrolyte with 2 to 5 subcell SSM-DSC devices.

| Dye and TiO$_2$ Thickness | Position | V$_{oc}$ (mV) | J$_{sc}$ (mA/cm$^2$) | FF % | PCE % |
|---|---|---|---|---|---|
| D35/D35/Y123/Y123 | | | | | |
| D35 1.2 µm | front | 993 ± 23 | 3.2 ± 0.15 | 73 ± 1.4 | 2.4 ± 0.08 |
| D35 2.2 µm | itself | 974 ± 14 | 6.1 ± 0.4 | 67 ± 3 | 4.1 ± 0.2 |
| | 2nd | 949 ± 38 | 2 ± 0.2 | 77 ± 3 | 1.3 ± 0.2 |
| Y123 1.2 µm | itself | 898 ± 25 | 7.4 ± 0.96 | 70 ± 4 | 5 ± 0.5 |
| | 3rd | 850 ± 16 | 1.8 ± 0.4 | 77 ± 5 | 1.2 ± 0.2 |
| Y123 full | itself | 842 ± 23 | 12.3 ± 1.3 | 72 ± 1 | 7.7 ± 0.4 |
| | 4th | 762 ± 36 | 2.6 ± 0.5 | 79 ± 3 | 1.6 ± 0.3 |
| D35/D35/Y123/Y123 | Tandem | 3557 ± 54 | 2.2 ± 0.2 | 64 ± 8 | 5.1 ± 0.6 |
| D35/D35/Y123/Y123/Y123 | | | | | |
| D35 1.2 µm | front | 993 ± 23 | 3.2 ± 0.15 | 73 ± 1.4 | 2.4 ± 0.08 |
| D35 2.2 µm | itself | 974 ± 14 | 6.1 ± 0.4 | 67 ± 3 | 4.1 ± 0.2 |
| | 2nd | 949 ± 38 | 2 ± 0.2 | 77 ± 3 | 1.3 ± 0.2 |
| Y123 1.2 µm | itself | 973 ± 28 | 5.5 ± 0.3 | 66 ± 8 | 3.6 ± 0.3 |
| | 3rd | 910 ± 26 | 1.3 ± 0.2 | 78 ± 3 | 1 ± 0.1 |
| Y123 2.2 µm | itself | 898 ± 25 | 7.4 ± 0.96 | 70 ± 4 | 5 ± 0.5 |
| | 4th | 825 ± 13 | 1.2 ± 0.08 | 78 ± 3 | 0.8 ± 0.04 |
| Y123 full | itself | 842 ± 23 | 12.3 ± 1.3 | 72 ± 1 | 7.7 ± 0.4 |
| | 5th | 747 ± 43 | 2.1 ± 0.2 | 78 ± 1 | 1.4 ± 0.1 |
| D35/D35/Y123/Y123/Y123 | Tandem | 4382 ± 54 | 2.1 ± 0.3 | 50 ± 9 | 4.7 ± 0.3 |

"itself" refers to measurements made on this subcell when taken out of the SSM-DSC configuration and measured directly.
"2$^{nd}$, 3$^{rd}$, 4$^{th}$ or 5$^{th}$" refers to measurements made on this specific subcell only, when in the SSM-DSC configuration. Front cells are the first dyes listed with the respective thickness of the TiO$_2$ film listed first as well. Subsequent subcells are listed in order from front to back.
"Full" indicates subcells use a 4.5 µm TiO$_2$ active layer and a 4.5 µm TiO$_2$ scattering layer. Electrolyte used for all cells unless otherwise noted is as follows: 0.25M Co(bpy)$_2$(PF$_6$)$_2$, 0.05M Co(bpy)$_2$(PF$_6$)$_3$, 0.1M LiTFSI, and 0.5M tert-butylpyridine, in acetonitrile.

Intriguingly, the SSM-DSC system maintains high photovoltages even under low light conditions at 3.99 V at 10% sun intensity for a PCE of 7.0% (FIG. 12, Table 11). This SSM-DSCs system is highly attractive for indoor light-to-electric applications requiring high voltages such as a lithium ion battery charging at ~3.7-4.0 V.

TABLE 11

Device parameters for a 5 subcell SSM-DSC device (the final entry in Table 10) with the Co(bpy)$_3^{3+/2+}$ redox shuttle measured under different % sun values.

| % Sun | V$_{oc}$ (mV) | J$_{sc}$ (mA/cm$^2$) | FF | PCE % |
|---|---|---|---|---|
| 100% | 4369 | 1.9 | 57.9 | 4.9 |
| 79% | 4322 | 1.6 | 58 | 4.1 (5.2%) |
| 50% | 4256 | 1.1 | 58 | 2.8 (5.6%) |
| 32% | 4190 | 0.8 | 59 | 2 (6.25%) |
| 10% | 3990 | 0.3 | 60 | 0.7 (7%) |

Electrocatalytic Reduction of CO$_2$ to CO

An interesting approach for solar-to-fuel conversion is the application of integrated photovoltaic-electrochemical cell (PV-EC) devices that operate without external bias. As a demonstration of the utility of the SSM-DSC systems discussed above, a 3 subcell SSM-DSC system was used to power the electrocatalytic reduction of CO$_2$ to CO in aqueous media with no external bias using an IrO$_2$ anode and an Au$_2$O$_3$ cathode (FIG. 13). This represents the only DSC system driven with simulated sunlight and water as the electron source for solar-to-CO conversion of CO$_2$ with no external bias. An overall efficiency for CO production ($\eta_{co}$) of 2% was calculated, with a solar-to-fuel efficiency of 2.7% when H$_2$ produced is accounted for using the equation: $\eta_{co}=(J_{op} \times E_{(CO2/CO)} \times FE)I_o$, where $J_{op}$ is the operating current density, $E_{(CO2/CO)}$ is the thermodynamic free energy (1.43 V for this EC), FE is the Faradaic efficiency, and $I_o$ is the incident solar power density (FIG. 14). The diminishment of J$_{op}$ overtime was found to be due to deterioration of the performance of only the front cell in the SSM-DSC system (FIG. 4, Table 12). This loss in performance over time for the front device was found to be fully circumvented through the use of a gel electrolyte along with a 385 nm UV cutoff filter (FIGS. 15-16).

TABLE 12

Comparison of SSM-DSC (D35/Y123/Y123 (Co(bpy)$_3^{3+/2+}$) device parameters before and after powering CO$_2$ reduction.

| Cell type | V$_{oc}$ (mV) | J$_{sc}$ (mA/cm$^2$) | FF | PCE % |
|---|---|---|---|---|
| SSM-DSC with 1.2 µm front device | | | | |
| Before electrolysis | 2690 | 3.9 | 69 | 6.95 |
| After electrolysis | 2540 | 2.8 | 27 | 1.9 |
| SSM-DSC with 2.2 µm front device | | | | |
| Before electrolysis | 2695 | 3.7 | 60 | 6.2 |
| After electrolysis | 2578 | 3.5 | 42 | 3.9 |

In a dramatic display of SSM-DSC device stability, a SSM-DSC device was constructed with an IrO$_2$ covered titanium electrode attached at the SSM-DSC cathode and a platinum wire connected to the SSM-DSC photoanode (FIG. 17). This device was fully submerged in an aqueous solution and irradiated with a solar simulator in a beaker open to air. A steady flow of O$_2$ and H$_2$ can be observed (FIG. 18) at the electrodes at approximately 0.5 mL of gas per second using a laboratory test cell design. This rate can be dramatically enhanced through increases in the solar active area size. This stands in stark contrast to other solar cell technologies that require precautions such as Argon chambers.

CONCLUSION

Sequential series multijunction dye-sensitized solar cells (SSM-DSCs), which are mechanically stacked single illuminated area DSC devices wired in series, are reported to have the highest photovoltages obtained from a single illuminated area DSC. In this Example, single illuminated area SSM-DSCs with more than 2 subcells were analyzed for the first time. The use of multiple photoactive films under one area within the SSM-DSC framework is made possible by fine tuning the thickness of $TiO_2$ in each device and judicious dye selection to allow for excellent light distribution among the films. Photovoltages ($V_{oc}$) ranging from 1.9-4.7 V with $J_{sc}$ from 6 to 2.4 $mA/cm^2$ and power conversion efficiency (PCE) of 7.7 to 4.1% were observed for SSM-DSCs fabricated from 2-5 stacked subcells constructed with metal-free organic dyes and cobalt redox shuttles. In particular, balancing the light transmission and absorption through $TiO_2$ film thickness of the individual subcells provided $V_{oc}$ values per unit area as high as ~4.7 V for a single illuminated area device connected in series, with a PCE of ~4.4%. This remarkable $V_{oc}$ was further enhanced by series connection of two SSM-DSCs devices irradiated side by side, which lead to an exceptionally high $V_{oc}$ of 8.5 V, $J_{sc}$ 1.9 ($mA/cm^2$), FF of 25% and PCE of 4%.

The SSM-DSC approach permits incorporation of materials designed to use the maximal potential energy of photons in each region of the solar spectrum. Importantly, SSM-DSCs were observed to maintain high $V_{oc}$ under low-light conditions, rendering these systems very attractive for indoor applications. Additionally, a SSM-DSC was found to have a solar-to-fuel conversion efficiency of 2% (2.7% including $H_2$ production) for the reduction of $CO_2$ to CO with $IrO_2$ and $Au_2O_3$ electrocatalysts, without an external bias. These devices have applicability in areas such as, but not limited to, solar-to-fuel devices and portable energy charging systems from a low area solar cell.

Example 2

This Example describes the stepwise synthesis of (E)-2-cyano-3-(4-(7-(2,2',2'',4,4''-pentakis(hexyloxy)-[1,1':3',1''-terphenyl]-5'-yl)benzo[c][1,2,5]thiadiazol-4-yl)phenyl)acrylic acid, as illustrated in FIG. 19.

5-bromo-2-(hexyloxy)-1,3-diiodobenzene (1)

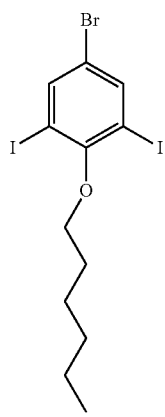 [SMILES: CCCCCCOc1c(I)cc(Br)cc1I]

To an oven dry, $N_2$ filled round bottom flask was added 4-bromo-2,6-diiodophenol (5.0 g, 11.8 mmol), 1-bromohexane (778 ml, 14.1 mmol), $K_2CO_3$ (2.4 g, 17.7 mmol) in 25 ml of DMF. The reaction mixture was heated to 90° C. for 16 hrs. The crude product was extracted with hexanes to give a light yellow oil (5.8 g, 97% yield). $^1H$ NMR (500 MHz, $CDCl_3$) δ 7.09 (s, 2H), 3.96 (t, J=10.0 Hz, 3H), 1.94-1.91 (m, 2H), 1.58-1.56 (m, 2H), 1.40-1.39 (m, 4H), 0.95 (t, J=5.0 Hz)). $^{13}C$ NMR (175 MHz, $CDCl_3$) δ 157.7, 141.7, 1178.0, 91.3, 73.7, 31.7, 30.0, 25.6, 22.6, 14.1. IR (neat, $cm^{-1}$) 3086.5, 3054.9, 2924.0, 2856.5, 2361.4, 2334.9, 2091.2, 1994.6, 1731.5, 1542.8, 1526.4, 1460.1, 1424.6, 1372.4, 1239.4, 1050.3, 985.8, 922.2, 860.0.

Synthesis of 5'-bromo-2,2',2'',4,4''-pentakis(hesxyl)-1,1':3',1''-terphenyl (2)

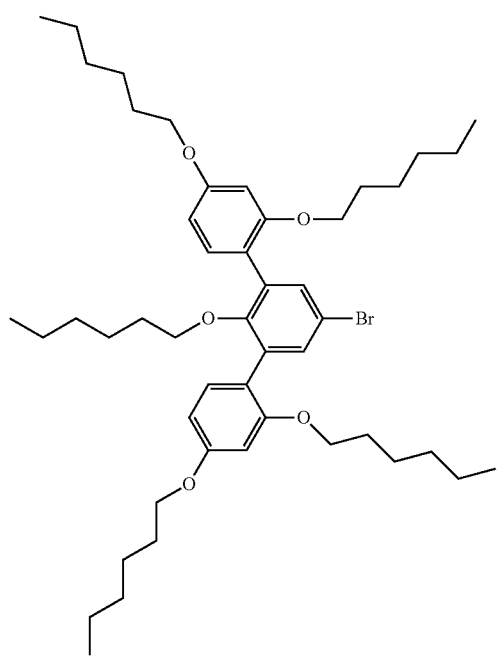 [SMILES: CCCCCCOc1ccc(-c2cc(Br)cc(-c3ccc(OCCCCCC)cc3OCCCCCC)c2OCCCCCC)c(OCCCCCC)c1]

To an oven dry, $N_2$ filled pressure flask was added 5-bromo-2-(hexyloxy)-1,3-diiodobenzene (718 mg, 1.41 mmol), $Pd(PPh_3)_4$ (163 mg, 0.1 mol %), (2,4-bis(hexyloxy)phenyl)boronic acid (1.0 g, 3.1 mmol) in 5 ml of toluene. 1.22 ml of a 2M solution of $K_2CO_3$ and 3 drops of Aliquot 336 were then added to the reaction mixture and heated to 110° C. for 16 hrs. The crude product was extracted with DCM and purified by silica gel chromatography using 10% DCM/Hex to give a colorless oil (604 mg, 53% yield). $^1H$ NMR (300 MHz, $CDCl_3$) δ 7.37 (s, 2H), 7.24 (d, J=9.0 Hz, 2H), 6.54-6.49 (m, 4H), 4.00-3.93 (m, 8H), 3.18 (t, J=6.0, 2H), 1.82-1.69 (m, 8H), 1.52-1.29 (m, 24H), 1.1-1.0 (m, 4H), 0.96-0.88 (m, 16H), 0.78 (t, J=6.0 Hz, 3H). $^{13}C$ NMR (175 MHz, $CDCl_3$) δ 159.9, 157.3, 154.8, 134.1, 133.3, 132.0, 119.8, 114.6, 104.7, 100.1, 72.6, 68.4, 68.1, 31.6, 31.5, 31.4, 29.8, 29.3, 29.1, 25.8, 25.8, 25.4, 22.6, 22.6, 22.6, 14.1, 14.1, 14.0. IR (neat, $cm^{-1}$) 2924.0, 2858.2, 2350.3, 2115.8, 1607.1, 1577.2, 1504.8, 1462.7, 1420.2, 1297.3, 1176.2, 1113.7, 1024.3, 212.3. HRMS (ESI) m/z $C_{48}H_{73}BrO_5Cs$ ($[M+Cs]^+$) 941.3696, found 943.3630.

53

Synthesis of (2,2',2",4,4"-pentakis(hexyloxy)-[1,1': 3',1"-terphsnyl]-5'-yl)boronic acid (3)

54

4-(7-(2,2',2",4,4"-pentakis(hexyloxy)-[1,1':3',1"-terphenyl]-5% yl)benzo[c][1,2,5] thiadiazol-4-yl) benzaldehyde (4)

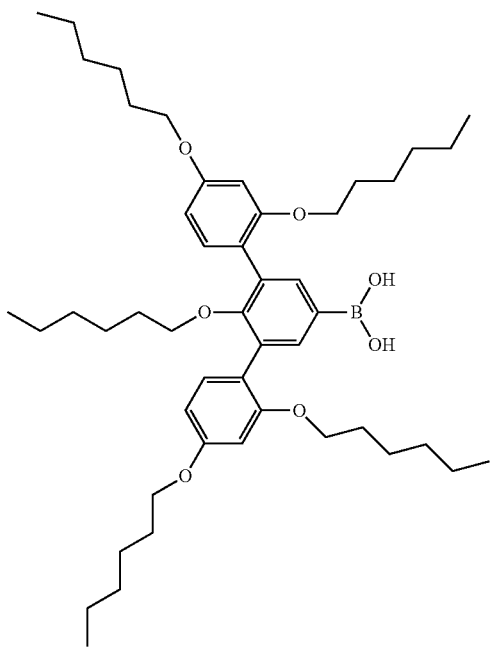 [SMILES: CCCCCCOc1ccc(-c2cc(B(O)O)cc(-c3ccc(OCCCCCC)cc3OCCCCCC)c2OCCCCCC)c(OCCCCCC)c1]

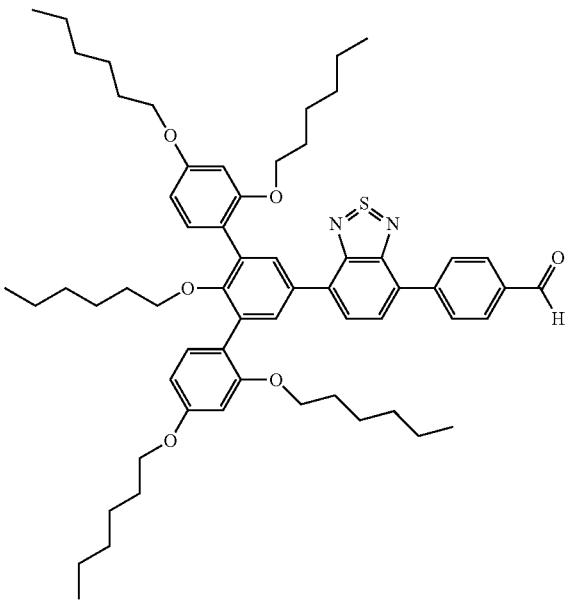 [SMILES: CCCCCCOc1ccc(-c2cc(-c3ccc(-c4ccc(C=O)cc4)c4c3N=S=N4)cc(-c3ccc(OCCCCCC)cc3OCCCCCC)c2OCCCCCC)c(OCCCCCC)c1]

To an oven dry, $N_2$ filled round bottom flask was added 2 (200 mg, 0.12 mmol) in 1 ml of anhydrous THF. The reaction mixture was cooled to −78° C. and 2.5 M n-butyl lithium (0.12 ml, 0.14 mmol) was added dropwise. The reaction was left to stir at −78° C. for 1½ hrs. Trimethyl borate (0.09 ml, 0.81 mmol) was then added dropwise to the reaction mixture and left to cool to room temperature overnight. A 3:1 10% HCl:Et$_2$O was added and the crude product was extracted with Et20 and purified by silica gel chromatography using 5% EtAc/Hex to give a light yellow oil (108 mg, 57% yield). $^1$H NMR (500 MHz, CDCl$_3$) δ 8.03 (s, 2H), 7.26 (d, J=9 Hz, 2H), 6.51-6.54 (m, 4H), 4.02 (t, J=5 Hz, 4H), 3.88 (t, J=5 Hz, 4H), 3.27 (t, J=5 Hz, 2H), 1.82-1.69 (m, 8H), 1.52-1.29 (m, 24H), 1.0-1.082 (m, 4H), 0.88-0.96 (m, 16H), 0.78 (t, J=6.0, 3H). $^{13}$C NMR (175 MHz, CDCl$_3$) δ 202.2, 154.7, 152.9, 133.9, 127.3, 126.8, 116.7, 99.8, 95.4, 26.9, 26.7, 26.2, 25.1, 24.7, 24.6, 24.4, 21.1, 21.0, 20.8, 20.6, 17.9, 17.9, 17.7. IR (neat, cm$^{-1}$) 3470.2, 3377.2, 2928.1, 2861.8, 2362.1, 2160.5, 1973.2, 1679.6, 1603.2, 1504.0, 1463.8, 1353.1, 1249.0, 1171.2, 1111.6, 1016.0, 954.3, 12.3. HRMS (ESI) m/z C$_{48}$H75BO7Cs ([M+Cs]$^+$) 907.4669, found 907.5184.

To an oven dry, $N_2$ filled pressure flask was added 4-(7-bromobenzo[c][1,2,5]thiadiazol-4-yl)benzaldehyde (FIG. 20) (45 mg, 0.14 mmol), 3 (109 mg, 0.15 mmol), Pd(PPh$_3$)$_4$ (16 mg, 0.1 mol %), 0.1 ml of 2 M solution of K$_2$CO$_3$ and 2 ml of (THF:toluene, 1:1). The vial was sealed and reaction mixture was stirred at 110° C. for 12 hrs. The crude product was extracted with DCM and purified by silica gel chromatography using 20% EtAc/Hex to give a yellow oil (104 mg, 76% yield). $^1$H NMR (500 MHz, CDCl$_3$) δ 10.14 (s, 1H), 8.20 (d, J=10.0 Hz, 2H), 8.08 (d, J=10.0 Hz, 2H), 7.96 (s, 2H), 7.86 (s, 2H), 7.40 (d, J=10 Hz, 2H), 6.59-6.57 (m, 4H), 4.03 (t, J=10.0 Hz, 4H), 4.00 (t, J=10.0 Hz, 4H), 3.32 (t, J=5.0 Hz, 2H), 1.86-1.83 (m, 4H), 1.75-1.72 (m, 4H), 1.39-1.32 (m, 4H), 1.0-1.082 (m, 4H), 0.88-0.96 (m, 16H), 0.78 (t, J=6.0, 3H). $^{13}$C NMR (175 MHz, CDCl$_3$) δ 203.6,9, 191.9, 171.1, 159.7, 157.4, 154.2, 143.6, 132.4, 132.3, 131.7, 130.7, 130.0, 129.8, 129.0, 127, 120.9, 104.7, 100.2, 72.7, 68.5, 68.1, 34.7, 34.5, 31.7, 31.5, 29.9, 29.4, 29.2, 29.1, 25.8, 25.8, 25.4, 25.3, 22.5, 21.1, 20.7. IR (neat, cm$^{-1}$) 2928.0, 2861.9, 2361.9, 2029.3, 1940.2, 1701.7, 1636.9, 1505.8, 1461.7, 1301.3, 11 78.4. HRMS (ESI) m/z C$_{61}$H$_{80}$N$_2$O$_6$S ([M+Cs]$^+$) 1101.4791, found 1101.5381.

(E)-2-cyano-3-(4-(7-(2,2',2'',4,4''-pentakis(hexyloxy)-[1,1':3',1''-terphenyl]-F-yl)benzo[c][1,2,5]thiadiazol-4-yl)phenyl)acrylic acid (5)

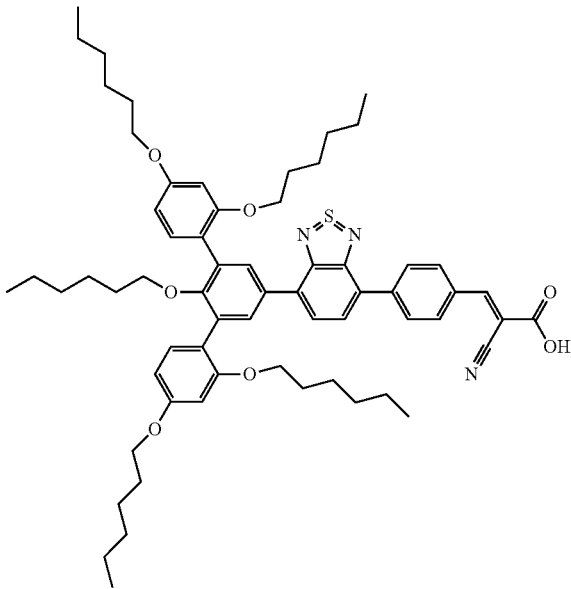 [SMILES: CCCCCCOc1ccc(-c2cc(-c3ccc(-c4ccc(/C=C(\C#N)C(=O)O)cc4)c4c3N=S=N4)cc(-c3ccc(OCCCCCC)cc3OCCCCCC)c2OCCCCCC)c(OCCCCCC)c1]

To an oven dry, N$_2$ filled pressure flask was added 4 (104 mg, 0.12 mmol), cyanoacetic acid (270 mg, 0.32 mmol), piperidine (0.074 ml, 0.75 mmol) and 2 ml of Chloroform. The vial was sealed and reaction mixture was stirred at 90° C. for 1 hr. The crude product was extracted with DCM and purified by silica gel chromatography using DCM, 5% MeOH/DCM and 10% MeOH/DCM to give a yellow oil (80 mg, 73% yield). $^1$H NMR (500 MHz, CDCl$_3$) δ 8.40 (s, 1H), 8.22 (ap s, 4H), 7.96 (s, 2H), 7.87 (ap s, 2H), 7.39 (d, J=10.0 Hz, 2H), 6.60-6.56 (m, 4H), 4.03 (t, J=5.0 Hz, 4H), 4.00 (t, J=5.0 Hz, 4H), 3.32 (t, J=5.0 Hz, 2H), 1.86-1.75 (m, 4H), 1.75-1.70 (m, 4H), 1.54-1.40 (m, 4H), 1.35-1.11 (m, 28H), 0.95 (t, J=7.0 Hz 6H), 0.81 (t, J=10.0, 3H), 0.76 (t, J=10.0 Hz, 6H). An absorption spectrum is illustrated in FIG. 21.

Synthesis of Redox Shuttle

Fe(bpy)$_3$$^{+2}$PF$_6$ 2,2'-bipyridine (1.85 g, 2.27 mmol) was dissolved in 15 ml of ethanol and heated to 60° C. The reaction mixture was added slowly to a stirring solution of FeCl$_2$ (0.500 g, 3.95 mmol) of in 10 ml of water also at 60° C. The solution immediately turns bright red. After 1 hr. the reaction mixture was cooled to room temperature and a saturated solution of KPF$_6$ in water was added to precipitate out the hexafluorophosphate salt. The complex was collected by vacuum filtration and was bed with water and ethanol to give the diamagnetic product as a bright red solid. $^1$HNMR (300 MHz, Acetone-d$_6$) δ 8.86 (d, J=9.0 Hz, 2H), 8.29 (t, J=6.0 Hz, 2H), 7.75 (d, J=6.0 Hz, 2H), 7.60 (t, J=6.0 Hz, 2H).

Fe(bpy)$_3$$^{3+}$ PF$_6$ 2,2'-bipyridine (1.85 g, 2.27 mmol) was dissolved in 15 ml of ethanol and heated to 60° C. The reaction mixture was added slowly to a stirring solution of FeCl$_3$ (0.500 g, 3.95 mmol) of in 10 ml of water also at 60° C. The solution immediately turns brown. After 1 hr. the reaction mixture was cooled to room temperature and a saturated solution of KPF$_6$ in water was added to precipitate out the hexafluorophosphate salt. The complex was collected by vacuum filtration and washed with water and ethanol to give the paramagnetic product as a light brown solid.

Example 3

This Example describes the results of Fe(bpy)$_3$$^{3+/2+}$ concentration studies (3+3+5 microns TiO$_2$) (Table 13).

TABLE 13

Parameters for Fe(bpy) concentration studies (3 + 3 + 5 microns).

| Cell PEDOT | $V_{oc}$ (mV) | $J_{sc}$ | FF | PCE | # Cells |
|---|---|---|---|---|---|
| RR-9 Fe(bpy)$_3$ E1 | 1.18 ± 0.009 | 2.4 ± 0 | 0.64 ± 0.02 | 2.0 ± 0.05 | 2 |
| RR-9 Fe(bpy)$_3$ E2 | 0.696 | 0.1 | 0.64 | 0.04 | 1 |
| RR-9 Fe(bpy)$_3$ E3 | 1.264 | 2.4 | 0.55 | 1.7 | 1 |

E1 = 0.25M Fe(bpy)$_3$$^{2+}$ 0.5M Fe(bpy)$_3$$^{3+}$
E2 = 0.15M Fe(bpy)$_3$$^{2+}$ 0.05M Fe(bpy)$_3$$^{3+}$
E3 = 0.35M Fe(bpy)$_3$$^{2+}$ 0.05M Fe(bpy)$_3$$^{3+}$ (Sat. Solution)
Cells were dipped in EtOH:TFH (4:1) solution for 19 hours.

This Example describes the results of LiTFSI concentration studies (3+3+5 microns) (Table 14).

TABLE 14

Parameters for LiTFSI concentration studies (3 + 3 + 5 microns).

| Cell PEDOT | $V_{oc}$ (mV) | $J_{sc}$ | FF | PCE | # Cells |
|---|---|---|---|---|---|
| RR-9 Fe(bpy)$_3$ 0.05M E1 | 1.156 ± 0.04 | 2.2 ± 0.2 | 0.47 ± 0.07 | 1.2 ± 0.1 | 2 |
| RR-9 Fe(bpy)$_3$ 0.5M E1 | 1.026 ± 0.02 | 1.6 ± 0.1 | 0.54 ± 0.007 | 1.0 ± 0.1 | 2 |
| RR-9 Fe(bpy)$_3$ 0.1M E1 | 1.18 ± 0.009 | 2.4 ± 0 | 0.64 ± 0.02 | 2.0 ± 0.05 | 2 |

E1 = 0.25M Fe(bpy)$_3$$^{2+}$ 0.05M Fe(bpy)$_3$$^{3+}$
Cells were dipped in 60:1 CDCA 4:1 EtOH/THF solution Example 5

This Example describes the results of solvents studies (3+3+5 microns) (Table 15).

TABLE 15

Parameters for solvents studies (3 + 3 + 5 microns).

| Cell PEDOT/E1 | $V_{oc}$ (mV) | $J_{sc}$ | FF | PCE | # Cells |
|---|---|---|---|---|---|
| RR-9 Fe(bpy)$_3$ MeCN/ButEtOH | 1.219 ± 0.04 | 2.8 ± 0.07 | 0.44 ± 0.03 | 1.6 ± 0.2 | 2 |
| RR-9 Fe(bpy)$_3$ EtOH/THF | 1.131 ± 0.03 | 2.2 ± 0.2 | 0.55 ± 0.02 | 1.4 ± 0.2 | 2 |
| RR-9 Fe(bpy)$_3$ DCM/EtOH | 1.029 ± 0.03 | 1.7 ± 0.2 | 0.48 ± 0.07 | 0.9 ± 0.3 | 2 |
| RR-9 Fe(bpy)$_3$ CB | 1.013 | 1.5 | 0.56 | 0.9 | 1 |

E1 = 0.25M Fe(bpy)$_3^{2+}$ 0.05M Fe(bpy)$_3^{3+}$

Example 6

This Example describes the results of dye concentration studies (3+3+5 microns) (Table 16).

TABLE 16

Parameters for dye concentration studies (3 + 3 + 5 microns).

| Cell PEDOT/E1 | $V_{oc}$ (mV) | $J_{sc}$ | FF | PCE | # Cells |
|---|---|---|---|---|---|
| RR-9 Fe(bpy)$_3$ 0.1M dye | 1.1016 | 1.3 | 0.48 | 0.7 | 1 |
| RR-9 Fe(bpy)$_3$ 0.5M dye | 1.280 ± 0.02 | 2.8 ± 0 | 0.44 ± 0.05 | 1.7 ± 0.2 | 2 |
| RR-9 Fe(bpy)$_3$ 1.0M dye | 1.283 ± 0.03 | 2.8 ± 0.07 | 0.42 ± 0.007 | 1.6 ± 0.01 | 2 |
| RR-9 Fe(bpy)$_3$ 0.5M dye 30 min N$_2$ | 1.409 | 2.8 | 0.56 | 2.4 | 1 |
| RR-9 Fe(bpy)$_3$ 0.5M dye 30 min N$_2$ overnight | 1.401 | 2.6 | 0.50 | 1.9 | 1 |

E1 = 0.25M Fe(bpy)$_3^{2+}$ 0.05M Fe(bpy)$_3^{3+}$

Cells were dipped in MeCN/ButOH (1:1) for 19 hours for experiment without N$_2$

Example 7

This Example describes the results of N$_2$ bubbling studies (3+3+5 microns) (Table 17).

TABLE 17

Parameters for N$_2$ bubbling studies (3 + 3 + 5 microns).

| Cell PEDOT/E1 | $V_{oc}$ (mV) | $J_{sc}$ | FF | PCE | # Cells |
|---|---|---|---|---|---|
| RR-9 Fe(bpy)$_3$ 0.5M dye no N$_2$ 19 hour dipping | 1.280 ± 0.02 | 2.8 ± 0 | 0.44 ± 0.05 | 1.7 ± 0.2 | 2 |
| RR-9 Fe(bpy)$_3$ 0.5M 15 min N$_2$ | 1.302 | 2.3 | 0.53 | 1.7 | 1 |
| RR-9 Fe(bpy)$_3$ 0.5M 30 min N$_2$ | 1.409 | 2.8 | 0.56 | 2.4 | 1 |
| RR-9 Fe(bpy)$_3$ 0.5M 45 min N$_2$ | 1.283 ± 0.01 | 2.7 ± 0.2 | 0.51 ± 0.01 | 1.8 ± 0.06 | 2 |

E1 = 0.25M Fe(bpy)$_3^{2+}$ 0.05M Fe(bpy)$_3^{3+}$

After bubbling N$_2$ all cells were let to sit in dye solution for an extra 30 minutes.

Example 8

This Example describes the results of dipping time studies (3+5 microns) (Table 18).

TABLE 18

Parameters for dipping time (3 + 5 microns) studies.

| Cell PEDOT/E1 | $V_{oc}$ (mV) | $J_{sc}$ | FF | PCE | # Cells |
|---|---|---|---|---|---|
| RR-9 Fe(bpy)$_3$ 0.5M dye 19 hour dipping | 1.312 | 2.1 | 0.45 | 1.3 | 1 |
| RR-9 Fe(bpy)$_3$ 0.5M 2 hours | 1.224 ± 0.009 | 2.0 ± 0.07 | 0.55 ± 0.03 | 1.4 ± 0 | 2 |
| RR-9 Fe(bpy)$_3$ 4 hours | 1.401 ± 0.01 | 2.6 ± 0.3 | 0.49 ± 0.02 | 1.8 ± 0.1 | 2 |
| RR-9 Fe(bpy)$_3$ 12 hours | 1.359 ± 0.002 | 2.4 ± 0.07 | 0.51 ± 0.04 | 1.7 ± 0.07 | 2 |

E1 = 0.25M Fe(bpy)$_3^{2+}$ 0.05M Fe(bpy)$_3^{3+}$

Example 9

This Example describes the results of thickness studies (Table 19).

TABLE 19

Parameters for thickness studies.

| Cell PEDOT/E1 | $V_{oc}$ (mV) | $J_{sc}$ | FF | PCE | # Cells |
|---|---|---|---|---|---|
| RR-9 Fe(bpy)$_3$ 3 + 5 | 1.312 | 2.1 | 0.45 | 1.3 | 1 |
| RR-9 Fe(bpy)$_3$ 3 +3 + 5 | 1.280 ± 0.02 | 2.8 ± 0 | 0.44 ± 0.05 | 1.7 ± 0.2 | 2 |
| RR-9 Fe(bpy)$_3$ 3 +3 + 3 + 5 | 1.192 ± 0.07 | 1.4 ± 0.07 | 0.55 ± 0.03 | 1.0 ± 0.2 | 2 |

E1 = 0.25M Fe(bpy)$_3^{2+}$ 0.05M Fe(bpy)$_3^{3+}$

Cells were dipped for 19 hours.

Made with old dye solution.

Example 10

Introduction

Since the seminal discovered by O'Regan and Gratzel of dye sensitized solar cells (DSCs) in 1991, it has been a topic of extensive research. While improving the overall efficiency of the devices has been a topic of intense research throughout the years, improving the open circuit voltage ($V_{oc}$) has emerged as an important topic of research. DSCs are a clean energy source that with voltage improvements can be used to power a number of electrocatalysts for chemical transformations such as hydrogen production from water splitting or carbon fuels from co, reduction, and DSCs can provide a high voltage electrical source to power electronic devices. DSC devices operate through (1) the absorption of light by the organic component (dye), (2) transfer of an excited-state electron to the semiconductor (commonly TiO$_2$), (3) the electron then travels an external circuit to a counter electrode where (4) the redox mediator collects the electron and returns it to the dye to complete the electrical circuit. The maximum voltage provided is defined by the energetic distance between the semiconductor conduction band and the redox shuttle electrochemical potential. A redox shuttle with a low oxidation potential can be selected to give higher $V_{oc}$. Tuning the redox shuttle potentials also requires novel wide band dye designs as the electron transfer from the redox shuttle to the dye (step 4 above) to complete the circuit requires that the oxidized dyes redox potential be below that of the redox shuttle. Herein we report the first Fe redox mediator system to be used in a DSC cell and a novel wide band gap dye (RR9) that together this system produces a 1.4 V cell. Furthermore, prior attempts to increase the $V_{oc}$ required the use of Mg$^{+2}$ doped treatments to raise the CB of TiO$_2$, our system does not require any treatment on the TiO$_2$ CB to achieve a 1.4V cell.

Results and Discussions

FIGS. 22A-B illustrates the chemical structures of RR9 and Fe(bpy)$_3^{3+/2+}$ redox mediator. RR9 is a simple Donor-bridge-acceptor (D-π-A) moiety dye with a donor molecule featuring 5 hydroxyl chains to prevent the non-productive recombination with the redox mediator pathway and dye aggregation. The energy levels of RR9 were evaluated to be 1.5 V for the ground state oxidation and −1.1 V for the excited-state oxidation, suitable to work with the Fe(bpy)$_3^{3+/2+}$ redox shuttles that have an oxidation potential at 1.3 V (Table 20).

TABLE 20

| Dye and Redox mediator | Absorbance data[a] | | | Electrochemical data | | |
|---|---|---|---|---|---|---|
| | $\lambda_{max}$ (nm) | ε ($M^{-1}cm^{-1}$) | $\lambda_{onset}$ (nm)[b] | $E_{(S+/S)}$ (V)[c] | $E_{(S+/S)}$ (V)[d] | $E_g^{opt}$ (eV)[e] |
| RR9 | 412 | 18480 | 475 | 1.5 | −1.1 | |
| $Fe(ppy)_3^{+2/+3}$ | | | | 1.3 | | |

Designing dyes with energetics suitable for use at various positions is critical in further improving the performance of SSM-DSC devices. These energetic values show an encouraging initial direction where this molecular dye design approach has been put forward. As shown in Table 21 below, which compares RR9 to a benchmark dye, a record setting photovoltage of 1.4 V was achieved through this redox shuttle-dye pair. This allows for the front cell in a DSC system to generate 1.4 V rather than 1.0 V in the above example and can lead to SSM-DSCs with overall performances of >10 V for two side by side systems.

TABLE 21

Photovoltaic Parameters of DSC Devices

| Entry | Dye ($TiO_2$ thickness) | Redox Shuttle[a] | $V_{oc}$ [mV] | $J_{sc}$ [mA/cm$^2$] | FF | PCE [%] |
|---|---|---|---|---|---|---|
| 1 | RR9 (2.7 μm) | Fe | 1420 | 2.8 | 0.47 | 1.9 |
| 2 | D35 (2.7 μm) | Fe | 550 | 0.1 | 0.56 | 0.0 |
| 3 | RR9 (2.7 μm) | Co | 680 | 3.5 | 0.72 | 1.8 |
| 4 | D35 (2.7 μm) | Co | 760 | 8.8 | 0.67 | 4.6 |

[a]Fe is $Fe(bpy)_3^{3+/2+}$. Co is $Co(bpy)_3^{3+/2+}$ unless noted. All values are average of two cells.

During device optimization several parameters were evaluated, our best results were with MeCN/tBuOH and a minimal amount of chlorobenzene in order to solubilize the dye in this combination of solvents (FIG. 23). Initially we used $TiO_2$ 5.3 microns thick and a 5 micron scattering layer and a 19 hrs dipping time. To further enhance the performance of the device nitrogen flow was applied to the system for 30 min. The flow of $N_2$ causes the dye to penetrate deeper into the $TiO_2$ and gave an increase of ~100 mV on the best cell (FIG. 24).

A 1.4 V cell was also achieved without $N_2$ flowing by controlling the thickness of $TiO_2$. The best results were obtained with a 2.7 microns $TiO_2$ film and a 5 micron scattering layer in a 0.5M solution of MeCN/tbutOH and minimal amount of chlorobenzene with a dipping time of 4 hrs (FIG. 25). The optimized device gave an IPCE (Incident photon-to-current efficiency) of ~60% (FIGS. 26A-B).

Finally, a three subcell SSM-DSC was constructed with $RR9/Fe(bpy)_3^{+3/+2}$ as a front cell, $D35/Co(bpy-pz)_3^{+3/+2}$ as a second cell, and $Y123/Co(bpy-pz)_3^{+3/+2}$ as a third cell. As shown in Table 22, this device achieved a voltage of 3.3 V, the highest known to date for a three tandem device system, beating the previous record of 2.8 also generated by the instant inventors (FIG. 27). The optimization of the front cell ($RR9/Fe(bpy)_3^{+3/+2}$) enabled an increase of 300 mA from the previous record.

TABLE 22

Photovoltaic Parameters of SSM-DSC Devices

| Entry | Dye ($TiO_2$ thickness)[a] | Redox Shuttle[b] | $V_{oc}$ [mV] | $J_{sc}$ [mA/cm$^2$] | FF | PCE [%] |
|---|---|---|---|---|---|---|
| 1 | RR9 (1.3 μm)/D35/Y123 | Fe/Co/Co | 2790 | 1.5 | 0.48 | 2.0 |
| 2 | RR9 (1.3 μm)/D35/Y123 | Fe/Co*/Co* | 3100 | 1.8 | 0.54 | 3.1 |
| 3 | RR9 (1.5 μm)/D35/Y123 | Fe/Co*/Co* | 3180 | 2.2 | 0.49 | 3.5 |
| 4 | RR9 (1.3 μm)/Y123/Y123 | Fe/Co*/Co* | 3340 | 1.9 | 0.56 | 3.5 |

[a]For D35 and Y123 subcells the $TiO_2$ thickness is 2.2 μm and 4.5 μm, respectively.
[b]Fe is $Fe(bpy)_3^{3+/2+}$.
Co is $Co(bpy)_3^{3+/2+}$ unless noted.
Co* is $Co(bpy-pz)_2^{3+/2+}$.
All values are average of two cells.

Conclusion

A $Fe(bpy)_3^{+3/+2}$ redox shuttle was successfully used as a redox mediator in a DSC system for the first time. It's ground state oxidation potential of 1.3 V in conjunction with a wide band gap dye RR9 (1.5 V) generated a device with a $V_{oc}$ up to 1.42 V (FIG. 28). To the best of our knowledge, this system is the highest photovoltage achieved by a single junction DSC device without metal oxide doping. Finally, a three devices tandem system was constructed with $RR9/Fe(bpy)_3^{+3/+2}$ as a front cell, $D35/Co(bpy-pz)_3^{+3/+2}$ as a second cell and $Y123/Co(bpy-pz)_3^{-3/-2}$ as a third cell. This tandem system achieved 3.3V (FIG. 28), the highest voltage for a three subcell device tandem to date, beating the previous record of 2.8 V also generated by our lab. Research is under way in our lab to test this redox mediator system with new dye designs as well as modifying the ligands on the Fe complex to increase the $V_{oc}$ even further. The further increase in $V_{oc}$ can potentially allow for a single junction DSC to provide enough voltage to power electrocatalytic water oxidation for the first time. At approximately 1.5 V water oxidation to generate hydrogen gas as a fuel becomes possible for the first time. This strategy will certainly lead to materials with these capabilities.

Example 11

This Example is directed to development of novel dyes designed to maximize the voltages of specific subcells in SSM-DSC devices. A range of dyes with excited—states near −0.7 V and a variable array of ground-state potentials (0.3-2.4 V vs NHE) are highly desirable. Accordingly, several dyes with energetics nearing these values have been synthesized and tested in DSC devices. Through optimizations and the use of a novel dye structure (FIGS. 29-31), voltages exceeding 10V are possible from a single illuminated area SSM-DSC device.

Dyes AP11, AP14, AP16 and AP17 (FIG. 29) show excellent energy level control with excited-states near ideal. Additionally, the ground-state potentials of these dyes were modulated, as seen in FIG. 32A and cyclic voltammetry studies. The oxidations potentials of these dyes are shown in FIG. 32B. Furthermore, these dyes exhibited excellent performance in DSC devices with regard to high photovoltages nearing the record setting 1.4V reported herein. FIGS. 33A-B and Table 23 detail the performances of these devices.

include antireflective coatings and/or immersion oils. Referring to FIG. 37, one such antireflective coating includes CYTOP. The dyes used in this Example included D35 and Y123, both of which are discussed above, as well as B11, which is shown in FIG. 38.

The use of an antireflective coating and/or an immersion oil changed the interfacial refractive index to minimize light losses. This use of antireflective coating and/or immersion oil provided an overall power conversion efficiency (PCE) of greater than 10% with output of greater than 2 V (Table 24). The PCE of more than 10% represents a substantial increase as compared of the 3 SSM-DSC systems not including antireflective coatings and/or immersion oils.

TABLE 24

Performance of Devices Including Antireflective Coatings and Matched Refractive Index Oils.

| Device | Thickness (μm) | $V_{oc}$ (mV) | $J_{sc}$ (mA/cm$^2$) | FF % | PCE % |
|---|---|---|---|---|---|
| 2 Subcell SSM-DSC Devices | | | | | |
| Y123/B11 | 2.2/10 | 1560 | 7.9 | 0.64 | 7.9 |
| Y123/B11 CYTOP | 2.2/10 | 1550 | 9.3 | 0.60 | 8.7 |
| 3 Subcell SSM-DSC Devices | | | | | |
| D35/Y123/B11 | 1.5/2.2/10 | 2500 | 4.8 | 0.54 | 6.5 |
| D35/Y123/B11 CYTOP | 1.5/2.2/10 | 2500 | 5.4 | 0.66 | 8.6 |
| D35/B11/B11 | 1.5/2.2/10 | 2320 | 4.9 | 0.75 | 8.6 |
| D35/B11/B11 CYTOP | 1.5/2.2/10 | 2280 | 5.5 | 0.71 | 9.3 |
| D35/B11/B11 CYTOP/OIL | 1.5/2.2/10 | 2290 | 5.7 | 0.76 | 10.1 |
| 4 Subcell SSM-DSC Devices | | | | | |
| D35/D35/Y123/Y123 | 0.8/2.2/2.2/10 | 3560 | 2.2 | 0.64 | 5.1 |
| D35/D35/Y123/Y123 CYTOP | 0.8/2.2/2.2/10 | 3360 | 3.2 | 0.66 | 7.2 |
| 5 Subcell SSM-DSC Devices | | | | | |
| D35/D35/Y123/Y123/Y123 | 0.8/2.2/1.2/2.2/10 | 4380 | 2.1 | 0.50 | 4.7 |
| D35/D35/Y123/Y123/Y123 CYTOP | 0.8/1.5/1.5/2.2/10 | 4140 | 2.8 | 0.49 | 5.8 |
| D35/D35/Y123/B11/B11 CYTOP | 0.8/1.5/1.5/2.2/10 | 4070 | 2.5 | 0.64 | 6.7 |

TABLE 23

| Cell | $V_{oc}$ (V) | $J_{sc}$ (mA/cm$^2$) | FF (%) | PCE (%) |
|---|---|---|---|---|
| AP11 | 1.20 | 3.0 | 0.48 | 1.7 |
| AP14 | 1.24 | 2.8 | 0.49 | 1.9 |
| AP16 | 1.33 | 3.3 | 0.45 | 2.0 |
| AP17 | TBA | TBA | TBA | TBA |

A schematic of a method for synthesizing various donor groups, including those of dyes AP11, AP14, AP16, and AP17, is shown in FIG. 34. FIG. 35 shows a schematic of a method for synthesizing dyes including the donor groups of FIG. 34.

As illustrated in Examples 10-11, the novel dye design and low energy redox shuttle pairing can dramatically improve the record high voltages observed in Examples 1-9. Examples 10 and 11 offer a novel path forward in potentially powering higher voltage systems with low surface areas such as laptops and transport vehicle electronics.

Example 12

This Example is directed to development of novel devices incorporating antireflective coatings and/or immersion oils. More specifically, as illustrated in FIG. 36, the SSM-DSC systems discussed hereinabove were modified to further FIG. 39 illustrates the IV potential of the D35/B11/B11, D35/B11/B11 CYTOP, and D35/B11/B11 CYTOP/OIL 3 subcell SSM-DSC devices in Table 24. As shown therein, each of the devices has a similar potential ($V_{oc}$). However, the CYTOP and CYTOP/OIL devices have a higher initial current density ($J_{sc}$) than the device without CYTOP or oil, while the device with just CYTOP has the quickest initial decline in current density.

While the disclosure is susceptible to various modifications and alternative forms, specific embodiments thereof have been shown by way of example in the drawings and are herein described below in detail. It should be understood, however, that the description of specific embodiments is not intended to limit the disclosure to cover all modifications, equivalents and alternatives falling within the spirit and scope of the disclosure as defined by the appended claims.

REFERENCES (1) World Energy Outlook 2015. International Energy Agency 2015.
(2) Colton, W., The Outlook for Energy: A View to 2040. Exxon Mobil Corporation 2011.
(3) Olah, G. A., Beyond Oil and Gas: The Methanol Economy. Angewandte Chemie International Edition 2005, 44, 2636-2639.

(4) Chu, S.; Majumdar, A., Opportunities and Challenges for a Sustainable Energy Future. Nature 2012, 488, 294-303.

(5) Turner, J. A., Sustainable Hydrogen Production. Science 2004, 305, 972-974.

(6) Lewis, N. S.; Nocera, D. G., Powering the Planet: Chemical Challenges in Solar Energy Utilization. Proceedings of the National Academy of Sciences 2006, 103, 15729-15735.

(7) Luo, J.; Im, J. H.; Mayer, M. T.; Schreier, M.; Nazeeruddin, M. K.; Park, N. G.; Tilley, S. D.; Fan, H. J.; Gratzel, M., Water Photolysis at 12.3% Efficiency Via Perovskite Photovoltaics and Earth-Abundant Catalysts. Science 2014, 345, 1593-6.

(8) Arasiliba, K.; Miyake, Y.; Nishibayashi, Y., A Molybdenum Complex Bearing Pnp-Type Pincer Ligands Leads to the Catalytic Reduction of Dinitrogen into Ammonia. Nat Chem 2011, 3, 120-5.

(9) Joya, K. S.; Joya, Y. F.; Ocakoglu, K.; van de Krol, R., Water-Splitting Catalysis and Solar Fuel Devices: Artificial Leaves on the Move. Angewandte Chemie International Edition 2013, 52, 10426-10437.

(10) Schreier, M.; Curvat, L.; Giordano, F.; Steier, L.; Abate, A.; Zakeeruddin, S. M.; Luo, J.; Mayer, M. T.; Gratzel, M., Efficient Photosynthesis of Carbon Monoxide from Co2 Using Perovskite Photovoltaics. Nat Commun 2015, 6, 7326.

(11) Seh, Z. W.; Kibsgaard, J.; Dickens, C. F.; Chorkendorff, I.; Norskov, J. K.; Jaramillo, T. F., Combining Theory and Experiment in Electrocatalysis: Insights into Materials Design. Science 2017, 355, eaad4998.

(12) Mathew, S.; Yella, A.; Gao, P.; Humphry-Baker, R.; Curchod, B. F.; Ashari-Astani, N.; Tavernelli, I.; Rothlisberger, U.; Nazeeruddin, M. K.; Gratzel, M., Dye-Sensitized Solar Cells with 13% Efficiency Achieved through the Molecular Engineering of Porphyrin Sensitizers. Nature Chemistry 2014, 6, 242-7.

(13) Yella, A.; Lee, H. W.; Tsao, H. N.; Yi, C.; Chandiran, A. K.; Nazeeruddin, M. K.; Diau, E. W.; Yeh, C. Y.; Zakeeruddin, S. M.; Gratzel, M., Porphyrin-Sensitized Solar Cells with Cobalt (Ii/Iii)-Based Redox Electrolyte Exceed 12 Percent Efficiency. Science 2011, 334, 629-34.

(14) Yum, J. H.; Baranoff, E.; Kessler, F.; Moehl, T.; Ahmad, S.; Bessho, T.; Marchioro, A.; Ghadiri, B; Moser, J. E.; Yi, C.; Nazeeruddin, M. K.; Gratzel, M., A Cobalt Complex Redox Shuttle for Dye-Sensitized Solar Cells with High Open-Circuit Potentials. Nature Communications 2012, 3, 631.

(15) Ozawa, H.; Sugiura, T.; Kuroda, T.; Nozawa, K.; Arakawa, H., Highly Efficient Dye-Sensitized Solar Cells Based on a Ruthenium Sensitizer Bearing a Hexylthiophene Modified Terpyridine Ligand. Journal of Materials Chemistry A 2016, 4, 1762-1770.

(16) Kakiage, K.; Aoyama, Y.; Yano, T.; Oya, K.; Fujisawa, J.-i.; Hanaya, M., Highly-Efficient Dye-Sensitized Solar Cells with Collaborative Sensitization by Silyl-Anchor and Carboxy-Anchor Dyes. Chemical Communications 2015, 51, 15894-15897.

(17) Kang, S. H.; Jeong, M. J.; Eom, Y. K.; Choi, I. T.; Kwon, S. M.; Yoo, Y.; Kim, J.; Kwon, J.; Park, J. H.; Kim, H. K., Porphyrin Sensitizers with Donor Structural Engineering for Superior Performance Dye-Sensitized Solar Cells and Tandem Solar Cells for Water Splitting Applications. Advanced Energy Materials 2016, 1602117-n/a.

(18) Kwon, J.; Im, M. J.; Kim, C. U.; Won, S. H.; Kang, S. B.; Kang, S. H.; Choi, I. T.; Kim, H. K.; Kim, I. H.; Park, J. H.; Choi, K. J., Two-Terminal Dssc/Silicon Tandem Solar Cells Exceeding 18% Efficiency. Energy & Environmental Science 2016, 9, 3657-3665.

(19) Bin, A. R.; Yusoff, M.; Jang, J., Highly Efficient Photoelectrochemical Water Splitting by a Hybrid Tandem Perovskite Solar Cell. Chemical Communications 2016, 52, 5824-5827.

(20) Ito, S.; Dharmadasa, I.; Tolan, G.; Roberts, J.; Hill, G.; Miura, H.; Yum, J.-H.; Pechy, P.; Liska, P.; Comte, P., High-Voltage (1.8 V) Tandem Solar Cell System Using a Gaas/Alxga (1-X) as Graded Solar Cell and Dye-Sensitised Solar Cells with Organic Dyes Having Different Absorption Spectra. Solar Energy 2011, 85, 1220-1225.

(21) Bruder, I.; Karlsson, M.; Eickemeyer, F.; Hwang, J.; Erk, P.; Hagfeldt, A.; Weis, J.; Pschirer, N., Efficient Organic Tandem Cell Combining a Solid State Dye-Sensitized and a Vacuum Deposited Bulk Heterojunction Solar Cell. Solar Energy Materials and Solar Cells 2009, 93, 1896-1899.

(22) Kakiage, K.; Osada, H.; Aoyama, Y.; Yano, T.; Oya, K.; Iwamoto, S.; Fujisawa, J. I.; Hanaya, M., Achievement of over 1.4 V Photovoltage in a Dye-Sensitized Solar Cell by the Application of a Silyl-Anchor Coumarin Dye. Scientific Reports 2016, 6, 35888.

(23) Kakiage, K.; Tokutome, T.; Iwamoto, S.; Kyomen, T.; Hanaya, M., Fabrication of a Dye-Sensitized Solar Cell Containing a Mg-Doped $Tio_2$ Electrode and a $Br_3$-/Br- Redox Mediator with a High Open-Circuit Photovoltage of 1.21 V. Chemical Communications 2013, 49, 179-180.

(24) Cheema, H.; Delcamp, J. H., Harnessing Photovoltage: Effects of Film Thickness, $TiO_2$ Nanoparticle Size, Mgo and Surface Capping with Dscs. ACS Applied Materials & Interfaces 2017, 9, 3050-3059.

(25) Wooh, S.; Kim, T.-Y.; Song, D.; Lee, Y.-G.; Lee, T. K.; Bergmann, V. W.; Weber, S. A. L.; Bisquert, J.; Kang, Y. S.; Char, K., Surface Modification of $Tio_2$ Photoanodes with Fluorinated Self-Assembled Monolayers for Highly Efficient Dye-Sensitized Solar Cells. ACS Applied Materials & Interfaces 2015, 7, 25741-25747.

(26) Yamaguchi, T.; Uchida, Y.; Agatsuma, S.; Arakawa, H., Series-Connected Tandem Dye-Sensitized Solar Cell for Improving Efficiency to More Than 10%. Solar Energy Materials and Solar Cells 2009, 93, 733-736.

(27) Yanagida, M.; Onozawa-Komatsuzaki, N.; Kurashige, M.; Sayama, K.; Sugihara, H., Optimization of Tandem-Structured Dye-Sensitized Solar Cell. Solar Energy Materials and Solar Cells 2010, 94, 297-302.

(28) Jeong, W.-S.; Lee, J.-W.; Jung, S.; Yun, J. H.; Park, N.-G., Evaluation of External Quantum Efficiency of a 12.35% Tandem Solar Cell Comprising Dye-Sensitized and Cigs Solar Cells. Solar Energy Materials and Solar Cells 2011, 95, 3419-3423.

(29) Sullivan, P.; Schumann, S.; Da Campo, R.; Howells, T.; Duraud, A.; Shipman, M.; Hatton, R. A.; Jones, T. S., Ultra-High Voltage Multijunction Organic Solar Cells for Low-Power Electronic Applications. Advanced Energy Materials 2013, 3, 239-244.

(30) Barber, G. D.; Hoertz, P. G.; Lee, S.-H. A.; Abrams, N. M.; Mikulca, J.; Mallouk, T. E.; Liska, P.; Zakeeruddin, S. M.; Gratzel, M.; Ho-Baillie, A., Utilization of Direct and Diffuse Sunlight in a Dye-Sensitized Solar Cell Silicon Photovoltaic Hybrid Concentrator System. The Journal of Physical Chemistry Letters 2011, 2, 581-585.

(31) Chandiran, A. K.; Tetreault, N.; Humphry-Baker, R.; Kessler, F.; Baranoff, E.; Yi, C.; Nazeeruddin, M. K.; Gratzel, M., Subnanometer $Ga_2o_3$ Tunnelling Layer by Atomic Layer Deposition to Achieve 1.1 V Open-Circuit Potential in Dye-Sensitized Solar Cells. Nano Letters 2012, 12, 3941-3947.
(32) Yum, J.-H.; Moehl, T.; Yoon, J.; Chandiran, A. K.; Kessler, F.; Gratia, P.; Gratzel, M., Toward Higher Photovoltage: Effect of Blocking Layer on Cobalt Bipyridine Pyrazole Complexes as Redox Shuttle for Dye-Sensitized Solar Cells, The Journal of Physical Chemistry C 2014, 118, 16799-16805.
(33) Feldt, S. M.; Lohse, P. W.; Kessler, F.; Nazeeruddin, M. K.; Gratzel, M.; Boschloo, G.; Hagfeldt, A., Regeneration and Recombination Kinetics in Cobalt Polypyridine Based Dye-Sensitized Solar Cells, Explained Using Marcus Theory. Physical Chemistry Chemical Physics 2013, 15, 7087-7097.
(34) Safdari, M.; Lohse, P. W.; Haggman, L.; Frykstrand, S.; Hogberg, D.; Rutland, M.; Asencio, R. A.; Gardner, J.; Kloo, L.; Hagfeldt, A.; Boschloo, G., Investigation of Cobalt Redox Mediators and Effects of $Tio_2$ Film Topology in Dye-Sensitized Solar Cells. RSC Advances 2016, 6, 56580-56588.
(35) Pashaei, B.; Shahroosvand, H.; Abbasi, P., Transition Metal Complex Redox Shuttles for Dye-Sensitized Solar Cells. RSC Advances 2015, 5, 94814-94848.
(36) Eom, Y. K.; Choi, I. T.; Kang, S. H.; Lee, J.; Kim, J.; Ju, M. J.; Kim, H. K., Thieno[3,2-13][1]Benzothiophene Derivative as a New II-Bridge Unit in DIIa Structural Organic Sensitizers with over 10.47% Efficiency for Dye-Sensitized Solar Cells. Advanced Energy Materials 2015, 5, n/a-n/a.
(37) Feldt, S.; Gibson, E. A.; Gabrielsson, E.; Sun, S.; Boschloo, G.; Hagfeldt, A., Design of Organic Dyes and Cobalt Polypyridine Redox Mediators for High-Efficiency Dye-Sensitized Solar Cells. Journal of the American Chemical Society 2010, 132, 16714-16724.
(38) Yum, J.-H.; Baranoff, E.; Kessler, F.; Moehl, T.; Ahmad, S.; Bessho, T.; Marchioro, A.; Ghadiri, E.; Moser, J.-E.; Yi, C.; Nazeeruddin, M. K.; Gratzel, M., A Cobalt Complex Redox Shuttle for Dye-Sensitized Solar Cells with High Open-Circuit Potentials. Nat Commun 2012, 3, 631.
(39) Boschloo, G.; Haggman, L.; Hagfeldt, A., Quantification of the Effect of 4-Tert-Butylpyridine Addition to 1-/I3- Redox Electrolytes in Dye-Sensitized Nanostructured $Tio_2$ Solar Cells. The Journal of Physical Chemistry B 2006, 110, 13144-13150.
(40) Koops, S. E.; OKTmRegan, B. C.; Barnes, P. R. F.; Durrant, J. R., Parameters Influencing the Efficiency of Electron Injection in Dye-Sensitized Solar Cells, Journal of the American Chemical Society 2009, 131, 4808-4818.
(41) Schlichthorl, G.; Huang, S. Y.; Sprague, J.; Frank, A. J., Band Edge Movement and Recombination Kinetics in Dye-Sensitized Nanocrystalline $Tio_2$ Solar Cells: A Study by Intensity Modulated Photovoltage Spectroscopy. The Journal of Physical Chemistry B
(42) Sewvandi, G. A.; Tao, Z.; Kusunose, T.; Tanaka, Y; Nakanishi, S.; Feng, Q., Modification of $TiO_2$ Electrode with Organic Silane Interposed Layer for High-Performance of Dye-Sensitized Solar Cells. ACS Applied Materials & Interfaces 2014, 6, 5818-5826.
(43) Cong, J.; Kinschel, D.; Daniel, Q.; Safdari, M.; Gabrielsson, E.; Chen, H.; Svensson, P. H.; Sun, L.; Kloo, L., Bis(1,1-Bis(2-PyridypEthane)Copper(1/Ii) as an Efficient Redox Couple for Liquid Dye-Sensitized Solar Cells. Journal of Materials Chemistry A 2016, 4, 14550-14554.
(44) Shavaleev, N. M.; Scopelliti, R.; Gratzel, M.; Nazeeruddin, M. K. Inorganica Chimica Acta 2013, 404, 210.
(45) Feldt, S.; Gibson, E. A.; Gabrielsson, E.; Sun, S.; Boschloo, G.; Hagfeldt, A. Journal of the American Chemical Society 2010, 132, 16714.
(46) Cheema, H.; Delcamp, J. H. ACS Applied Materials & Interfaces 2017, 9, 3050.
(47) Yum, J. H.; Baranoff, E.; Kessler, F.; Moehl, T.; Ahmad, S.; Bessho, T.; Marchioro, A.; Ghadiri, E.; Moser, J. E.; Yi, C.; Nazeeruddin, M. K.; Gratzel, M. Nature Communications 2012, 3, 631.
(48) Zhang, X.; Xu, Y.; Giordano, F.; Schreier, M.; Pellet, N.; Hu, Y.; Yi, C.; Robertson, N.; Hua, J.; Zakeeruddin, S. M.; Tian, H.; Gratzel, M. Journal of the American Chemical Society 2016, 138, 10742.
(49) Gabrielsson, E.; Ellis, H.; Feldt, S.; Tian, H.; Boschloo, G.; Hagfeldt, A.; Sun, L. Advanced Energy Materials 2013, 3, 1647.
(50) Schreier, M.; Curvat, L.; Giordano, F.; Steier, L.; Abate, A.; Zakeeruddin, S. M.; Luo, J.; Mayer, M. T.; Gratzel, M. Nat Commun 2015, 6, 7326.
(51) Chen, Y.; Li, C. W.; Kanan, M. W. Journal of the American Chemical Society 2012, 134, 19969.
(52) Olah, G. A. *Angew. Chem., Int. Ed.* 2005, 44, 2636.
(53) Chu, S.; Majumdar, A. *Nature* 2012, 488, 294.
(54) Turner, J. A. *Science* 2004, 305, 972.
(55) Lewis, N. S.; Nocera, D. G. *Proc. Natl. Acad. Sci. U.S.A.* 2006, 103, 15729.
(56) Luo, J.; Im, J. H.; Mayer, M. T.; Schreier, M.; Nazeeruddin, M. K.; Park, N. G.; Tilley, S. D.; Fan, H. J.; Gratzel, M. *Science* 2014, 345, 1593.
(57) Arashiba, K.; Miyake, Y.; Nishibayashi, Y. *Nat. Chem.* 2011, 3, 120.
(58) Joya, K. S.; Joya, Y. F.; Ocakoglu, K.; van de Krol, R. *Angew. Chem., Int. Ed.* 2013, 52, 10426.
(59) Schreier, M.; Curvat, L.; Giordano, F.; Steier, L.; Abate, A.; Zakeeruddin, S. M.; Luo, J.; Mayer, M. T.; Gratzel, M. *Nat. Commun.* 2015, 6, 7326.
(60) Seh, Z. W.; Kibsgaard, J.; Dickens, C. F.; Chorkendorff, I.; Norskov, J. K.; Jaramillo, T. F. *Science* 2017, 355, eaad4998.
(61) Ager, J. W.; Shaner, M. R.; Walczak, K. A.; Sharp, I. D.; Ardo, S. *Energy Environ. Sci.* 2015, 8, 2811.
(62) Sherman, B. D.; Bergkamp, J. J.; Brown, C. L.; Moore, A. L.; Gust, D.; Moore, T. A. *Energy Environ. Sci.* 2016, 9, 1812.
(63) Jia, J.; Seitz, L. C.; Benck, J. D.; Huo, Y.; Chen, Y.; Ng, J. W. D.; Bilir, T.; Harris, J. S.; Jaramillo, T. F. *Nat. Commun.* 2016, 7, 13237.
(64) Kakiage, K.; Osada, H.; Aoyama, Y.; Yano, T.; Oya, K.; Iwamoto, S.; Fujisawa, J. I.; Hanaya, M. *Sci. Rep.* 2016, 6, 35888.
(65) Kakiage, K.; Tokutome, T.; Iwamoto, S.; Kyomen, T.; Hanaya, M. *Chem. Commun.* 2013, 49, 179.
(66) Yella, A.; Lee, H. W.; Tsao, H. N.; Yi, C.; Chandiran, A. K.; Nazeeruddin, M. K.; Diau, E. W.; Yeh, C. Y.; Zakeeruddin, S. M.; Gratzel, M. *Science* 2011, 334, 629.
(67) Yum, J. H.; Baranoff, E.; Kessler, F.; Moehl, T.; Ahmad, S.; Bessho, T.; Marchioro, A.; Ghadiri, E.; Moser, J. E.; Yi, C.; Nazeeruddin, M. K.; Gratzel, M. *Nat. Commun.* 2012, 3, 631.
(68) Ozawa, H.; Sugiura, T.; Kuroda, T.; Nozawa, K.; Arakawa, H. *J. Mater. Chem. A* 2016, 4,
(69) Kakiage, K.; Aoyama, Y.; Yano, T.; Oya, K.; Fujisawa, J.-i.; Hanaya, M. *Chem. Commun.* 2015, 51, 15894.
(70) Kang, S. H.; Jeong, M. J.; Eom, Y. K.; Choi, I. T.; Kwon, S. M.; Yoo, Y.; Kim, J.; Kwon, J.; Park, J. H.; Kim, H. K. *Adv. Energy Mater.* 2016, 1602117.

(71) Kwon, J.; Im, M. J.; Kim, C. U.; Won, S. H.; Kang, S. B.; Kang, S. H.; Choi, I. T.; Kim, H. K.; Kim, I. H.; Park, J. H.; Choi, K. J. *Energy Environ. Sci.* 2016, 9, 3657.

(72) Bin, A. R.; Yusoff, M.; Jang, J. *Chem. Commun.* 2016, 52, 5824.

(73) Ito, S.; Dharmadasa, I.; Tolan, G.; Roberts, J.; Hill, G.; Miura, H.; Yum, J.-H.; Pechy, P.; Liska, P.; Comte, P. *Solar Energy* 2011, 85, 1220.

(74) Bruder, I.; Karlsson, M.; Eickemeyer, F.; Hwang, J.; Erk, P.; Hagfeldt, A.; Weis, J.; Pschirer, N. *Sol. Energ. Mat. Sol. Cells* 2009, 93, 1896.

(75) Yamaguchi, T.; Uchida, Y.; Agatsuma, S.; Arakawa, H. *Sol. Energ. Mat. Sol. Cells* 2009, 93, 733.

(76) Yanagida, M.; Onozawa-Komatsuzaki, N.; Kurashige, M.; Sayama, K.; Sugihara, H. *Sol. Energ. Mat. Sol. Cells* 2010, 94, 297.

(77) Jeong, W.-S.; Lee, J.-W.; Jung, S.; Yun, J. H.; Park, N.-G. *Sol. Energ. Mat. Sol. Cells* 2011, 95,3419.

(78) Chen, B.; Zheng, X.; Bai, Y.; Padture, N. P.; Huang, J. *Adv. Energy Mater.* 2017.

(79) Sullivan, P.; Schumann, S.; Da Campo, R.; Howells, T.; Duraud, A.; Shipman, M.; Hatton, R. A.; Jones, T. S. *Adv. Energy Mater.* 2013, 3, 239.

(80) Chandiran, A. K.; Tetreault, N.; Humphry-Baker, R.; Kessler, F.; Baranoff, E.; Yi, C.; Nazeeruddin, M. K.; Gratzel, M. *Nano Lett.* 2012, 12, 3941.

(81) Yum, J.-H.; Moehl, T.; Yoon, J.; Chandiran, A. K.; Kessler, F.; Gratia, P.; Gratzel, M. *J. Phys. Chem. C* 2014, 118, 16799.

(82) Feldt, S. M.; Lohse, P. W.; Kessler, F.; Nazeeruddin, M. K.; Gratzel, M.; Boschloo, G.; Hagfeldt, A. *Phys. Chem. Chem. Phys.* 2013, 15, 7087.

(83) Safdari, M.; Lohse, P. W.; Haggman, L.; Frykstrand, S.; Hogberg, D.; Rutland, M.; Asencio, R. A.; Gardner, J.; Kloo, L.; Hagfeldt, A.; Boschloo, G. *RSC Adv.* 2016, 6, 56580.

(84) Pashaei, B.; Shahroosvand, H.; Abbasi, P. *RSC Adv.* 2015, 5, 94814.

(85) Eom, Y. K.; Choi, I. T.; Kang, S. H.; Lee, J.; Kim, J.; Ju, M. J.; Kim, H. K. *Adv. Energy Mater.* 2015, 5, n/a.

(86) Feldt, S.; Gibson, E. A.; Gabrielsson, E.; Sun, S.; Boschloo, G.; Hagfeldt, A. *J. Am. Chem. Soc.* 2010, 132, 16714.

(87) Yum, J.-H.; Baranoff, E.; Kessler, F.; Moehl, T.; Ahmad, S.; Bessho, T.; Marchioro, A.; Ghadiri, E.; Moser, J.-E.; Yi, C.; Nazeeruddin, M. K.; Gratzel, M. *Nat. Commun.* 2012, 3, 631.

(88) Cheema, H.; Delcamp, J. H. *ACS Appl. Mater. Interfaces* 2017, 9, 3050.

(89) Sewvandi, G. A.; Tao, Z.; Kusunose, T.; Tanaka, Y.; Nakanishi, S.; Feng, Q. *ACS Appl. Mater. Interfaces* 2014, 6, 5818.

(90) Wooh, S.; Kim, T.-Y.; Song, D.; Lee, Y.-G.; Lee, T. K.; Bergmann, V. W.; Weber, S. A. L.; Bisquert, J.; Kang, Y. S.; Char, K. *ACS Appl. Mater. Interfaces* 2015, 7, 25741.

(91) Tsao, H. N.; Comte, P.; Yi, C.; Gratzel, M. *Phys. Chem. Chem. Phys.* 2012, 13, 2976.

(92) Heiniger, L. P.; Giordano, F.; Moehl, T.; Gratzel, M. *Adv. Energy Mater.* 2014, 4.

(93) Miyashita, M.; Sunahara, K.; Nishikawa, T.; Uemura, Y.; Koumura, N.; Hara, K.; Mori, A.; Abe, T.; Suzuki, E.; Mori, S. *J. Am. Chem. Soc.* 2008, 130, 17874.

(94) Dualeh, A.; Delcamp, J. H.; Nazeeruddin, M. K.; Gratzel, M. *Appl. Phys. Lett.* 2012, 100, 173512.

(95) Mosconi, E.; Yum, J.-H.; Kessler, F.; Gomez Garcia, C. J.; Zuccaccia, C.; Cinti, A.; Nazeeruddin, M. K.; Gratzel, M.; De Angelis, F. *J. Am. Chem. Soc.* 2012, 134, 19438.

(96) Ronge, J.; Bosserez, T.; Martel, D.; Nervi, C.; Boarino, L.; Taulelle, F.; Decher, G.; Bordiga, S.; Martens, J. A. *Chem. Soc. Rev.* 2014, 43, 7963.

(97) Sathre, R.; Greenblatt, J. B.; Walczak, K.; Sharp, I. D.; Stevens, J. C.; Ager, J. W.; Houle, F. A. *Energy. Environ. Sci.* 2016, 9, 803.

(98) Zhou, H.; Yan, R.; Zhang, D.; Fan, T. *Chem. Eur. J.* 2016, 22, 9870.

(99) Winkler, M. T.; Cox, C. R.; Nocera, D. G.; Buonassisi, T. *Proc. Natl. Acad. Sci. U.S.A.* 2013, 110, E1076.

(100) Chen, Y.; Li, C. W.; Kanan, M. W. *J. Am. Chem. Soc.* 2012, 134, 19969.

(101) Xiang, W.; Huang, W.; Bach, U.; Spiccia, L. *Chem. Commun.* 2013, 49, 8997.

(102) Yum, J.-H.; Baranoff, E.; Kessler, F.; Moehl, T.; Ahmad, S.; Bessho, T.; Marchioro, A.; Ghadiri, E.; Moser, J.-E.; Yi, C.; Nazeeruddin, M. K.; Grätzel, M. *Nat Commun* 2012, 3, 631.

(103) Shavaleev, N. M.; Scopelliti, R.; Gratzel, M.; Nazeeruddin, M. K. *Inorganica Chimica Acta* 2013, 404, 210.

(104) Feldt, S.; Gibson, E. A.; Gabrielsson, E.; Sun, S.; Boschloo, G.; Hagfeldt, A. *Journal of the American Chemical Society* 2010, 132, 16714.

(105) Cheema, H.; Delcamp, J. H. *ACS Applied Materials & Interfaces* 2017, 9, 3050.

(106) Yum, J. H.; Baranoff, E.; Kessler, F.; Moehl, T.; Ahmad, S.; Bessho, T.; Marchioro, A.; Ghadiri, E.; Moser, J. E.; Yi, C.; Nazeeruddin, M. K.; Gratzel, M. *Nature Communications* 2012, 3, 631.

(107) Cong, J.; Kinschel, D.; Daniel, Q.; Safdari, M.; Gabrielsson, E.; Chen, H.; Svensson, P. H.; Sun, L.; Kloo, L. *Journal of Materials Chemistry A* 2016, 4, 14550.

(108) Zhang, X.; Xu, Y.; Giordano, F.; Schreier, M.; Pellet, N.; Hu, Y.; Yi, C.; Robertson, N.; Hua, J.; Zakeeruddin, S. M.; Tian, H.; Gratzel, M. *Journal of the American Chemical Society* 2016, 138, 10742.

(109) Gabrielsson, E.; Ellis, H.; Feldt, S.; Tian, H.; Boschloo, G.; Hagfeldt, A.; Sun, L. *Advanced Energy Materials* 2013, 3, 1647.

(110) Huckaba, A. J.; Yella, A.; Brogdon, P.; Scott Murphy, J.; Nazeeruddin, M. K.; Gratzel, M.; Delcamp, J. H. *Chemical Communications* 2016.

(111) Cheema, H.; Islam, A.; Han, L.; El-Shafei, A. *ACS Applied Materials & Interfaces* 2014, (112) Feldt, S. M.; Lohse, P. W.; Kessler, F.; Nazeeruddin, M. K.; Gratzel, M.; Boschloo, G.; Hagfeldt, A. *Physical Chemistry Chemical Physics* 2013, 15, 7087.

(113) Schreier, M.; Curvat, L.; Giordano, F.; Steier, L.; Abate, A.; Zakeeruddin, S. M.; Luo, J.; Mayer, M. T.; Gratzel, M. *Nat Commun* 2015, 6, 7326.

(114) Chen, Y.; Li, C. W.; Kanan, M. W. *Journal of the American Chemical Society* 2012, 134, 19969.

What is claimed is:
1. A dye, comprising:
an electron deficient acceptor moiety;
a medium electron density π-bridge moiety; and
an electron rich donor moiety comprising
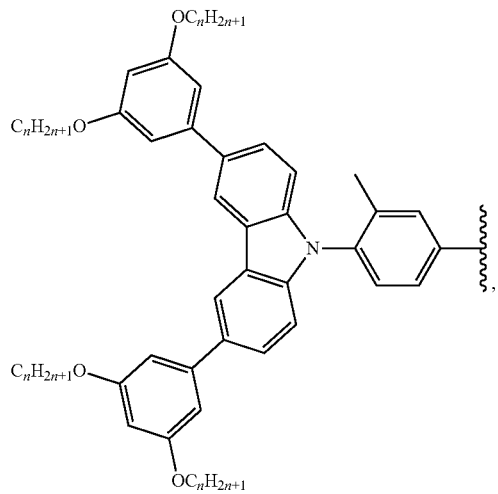
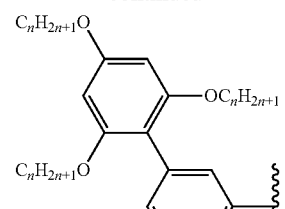
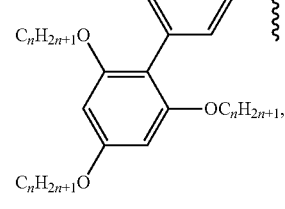
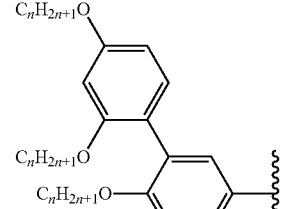
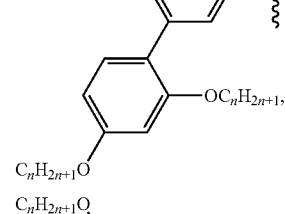
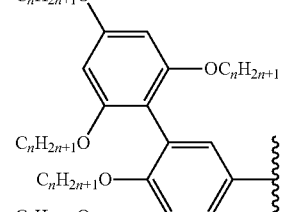
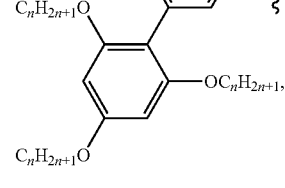
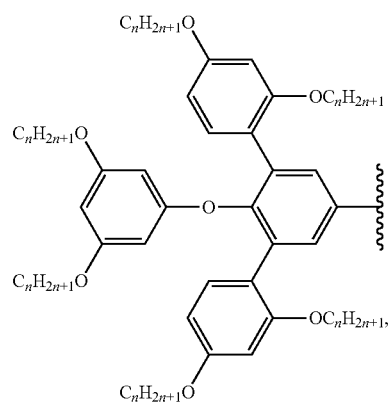

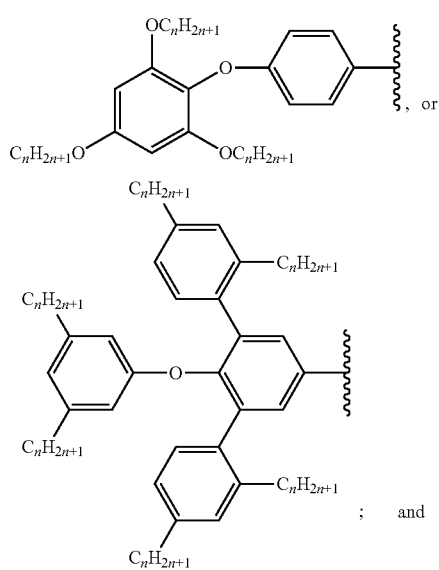
wherein n is between 1 and 30.
2. The dye of claim 1, wherein the π-bridge moiety comprises:
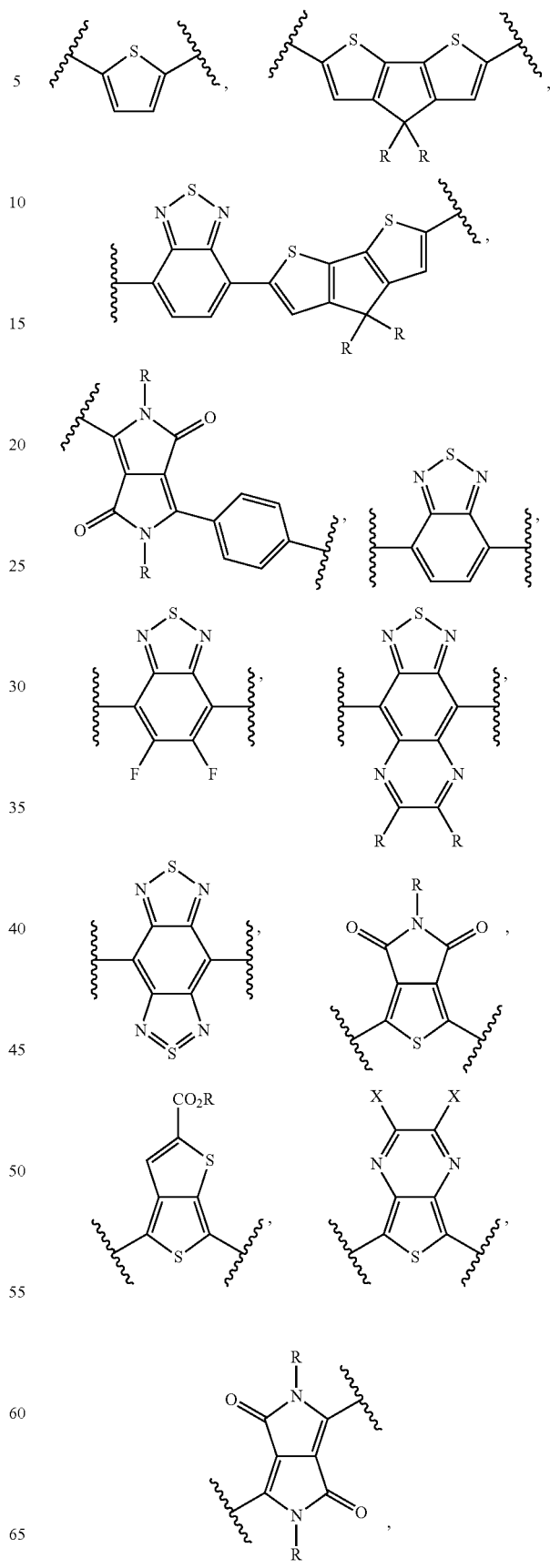

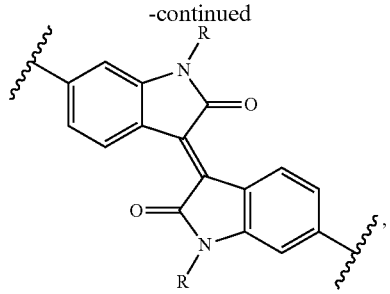

-continued or derivatives thereof;
wherein each X independently comprises H, F, CN, or CO$_2$R; and
wherein each R independently comprises H, alkyl, aryl, alkyl substituted aryl, alkoxy substituted aryl, or a combination thereof.

3. The dye of claim 1, wherein the acceptor moiety comprises:

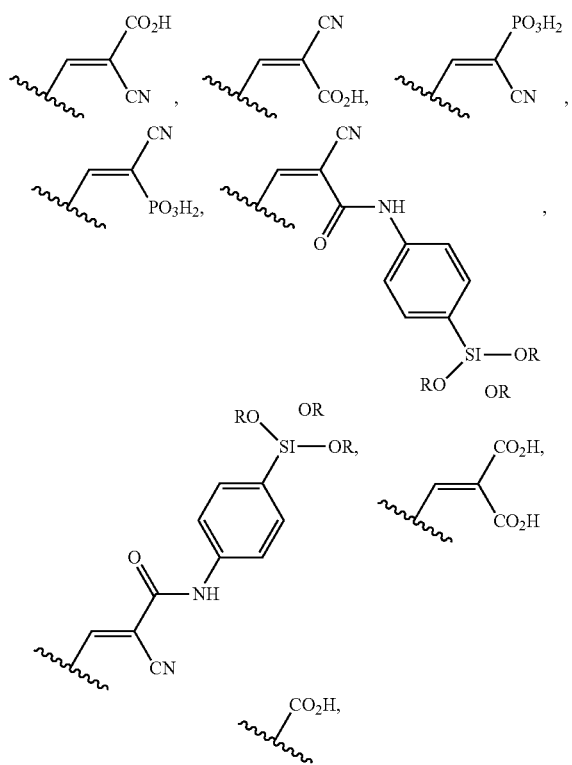

or derivatives thereof; and
wherein each R independently comprises H, alkyl, aryl, alkyl substituted aryl, alkoxy substituted aryl, or a combination thereof.

4. The dye of claim 1, wherein the π-bridge moiety has the structure

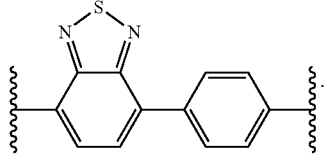 [SMILES: *c1ccc(-c2ccc(*)c3nsnc23)cc1]

5. The dye of claim 1, wherein the acceptor moiety has the structure

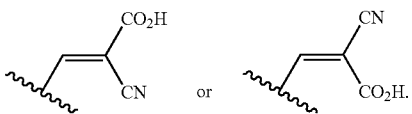 [SMILES: */C=C(\C#N)C(=O)O ; */C=C(/C#N)C(=O)O]

6. The dye of claim 1, wherein the π-bridge moiety has the structure

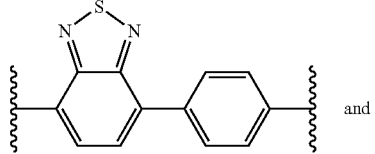 [SMILES: *c1ccc(-c2ccc(*)c3nsnc23)cc1] and the acceptor moiety has the structure

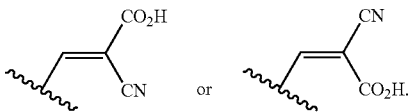 [SMILES: */C=C(\C#N)C(=O)O ; */C=C(/C#N)C(=O)O]

7. The dye of claim 1, wherein the π-bridge moiety and the acceptor moiety has the structure

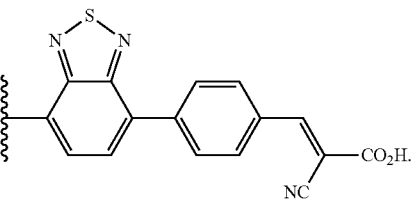 [SMILES: *c1ccc(-c2ccc(/C=C(\C#N)C(=O)O)cc2)c2nsnc12]

* * * * *